United States Patent
Tanuma et al.

(10) Patent No.: US 10,090,448 B2
(45) Date of Patent: Oct. 2, 2018

(54) LIGHT-EMITTING MODULE, LIGHT-EMITTING DEVICE AND METHOD OF MAKING LIGHT-EMITTING MODULE

(71) Applicant: ROHM CO., LTD., Kyoto-shi, Kyoto (JP)

(72) Inventors: Yuki Tanuma, Kyoto (JP); Satoshi Uchida, Kyoto (JP); Norio Yoshizawa, Tokyo (JP); Hiroaki Watanabe, Tokyo (JP); Takeyuki Adachi, Tokyo (JP)

(73) Assignee: ROHM CO., LTD., Kyoto (JP)

( * ) Notice: Subject to any disclaimer, the term of this patent is extended or adjusted under 35 U.S.C. 154(b) by 389 days.

(21) Appl. No.: 14/613,969

(22) Filed: Feb. 4, 2015

(65) Prior Publication Data

US 2015/0226409 A1     Aug. 13, 2015

(30) Foreign Application Priority Data

Feb. 7, 2014  (JP) .................................. 2014-022756
Feb. 7, 2014  (JP) .................................. 2014-022757

(51) Int. Cl.
*H01L 33/62*     (2010.01)
*H01L 33/48*     (2010.01)
(Continued)

(52) U.S. Cl.
CPC ............ *H01L 33/62* (2013.01); *H01L 33/486* (2013.01); *H01L 33/60* (2013.01); *H05K 3/3442* (2013.01);
(Continued)

(58) Field of Classification Search
CPC ....... H01L 33/62; H01L 33/486; H01L 33/60; H01L 2224/73265; H01L 2924/181;
(Continued)

(56) References Cited

U.S. PATENT DOCUMENTS 5,035,483 A *  7/1991  Waitl ................ H01L 31/02002
                                                      257/E31.111
8,426,886 B2 *  4/2013  Tanuma ................ H01L 33/486
                                                      257/98
(Continued)

FOREIGN PATENT DOCUMENTS

JP          2-243800 A       9/1990
JP          8-264842 A      10/1996
(Continued)

OTHER PUBLICATIONS

Office Action issued in the corresponding Japanese Patent application, dated Oct. 31, 2017, and corresponding machine translation.
(Continued)

*Primary Examiner* — Anh Mai
*Assistant Examiner* — Glenn Zimmerman
(74) *Attorney, Agent, or Firm* — Hamre, Schumann, Mueller & Larson, P.C.

(57) ABSTRACT

A light-emitting module is provided with a light-emitting element, a base, and a wiring pattern. The base includes an installation surface facing in a first direction and a mounting surface facing in a second direction which is at right angles to the first direction. The light-emitting element is installed on the installation surface. The wiring pattern is formed on the base and is in electrical contact with the light-emitting element. The base includes a pair of mounting recesses recessed from the mounting surface and spaced from each other in a third direction which is at right angles to both the first direction and the second direction. The wiring pattern includes a pair of mounting-surface electrodes respectively covering at least a part of the pair of mounting recesses.

25 Claims, 80 Drawing Sheets

(51) Int. Cl.
*H01L 33/60* (2010.01)
*H05K 3/34* (2006.01)
*F21Y 115/10* (2016.01)

(52) U.S. Cl.
CPC . *F21Y 2115/10* (2016.08); *H01L 2224/32225* (2013.01); *H01L 2224/48091* (2013.01); *H01L 2224/48227* (2013.01); *H01L 2224/73265* (2013.01); *H01L 2924/181* (2013.01); *H05K 2201/10106* (2013.01); *H05K 2201/10454* (2013.01); *Y02P 70/613* (2015.11)

(58) Field of Classification Search
CPC . H01L 2224/32225; H01L 2224/48091; H01L 2224/48; H01L 2224/48227; H05K 3/3442; H05K 2201/10106; H05K 2201/10454; F21Y 2115/10; Y02P 70/613
USPC .................................. 362/382, 369; 257/99
See application file for complete search history.

(56) References Cited

U.S. PATENT DOCUMENTS

| | | | | |
|---|---|---|---|---|
| 2005/0093146 | A1* | 5/2005 | Sakano | H01L 33/62 257/730 |
| 2007/0269927 | A1* | 11/2007 | Hofer | B29C 45/1671 438/106 |
| 2009/0242927 | A1* | 10/2009 | Kobayakawa | H01L 33/62 257/99 |
| 2010/0025722 | A1* | 2/2010 | Wada | H01L 33/486 257/99 |
| 2010/0237383 | A1* | 9/2010 | Lai | H01L 31/02005 257/99 |
| 2013/0105848 | A1* | 5/2013 | Cho | H01L 33/486 257/98 |
| 2013/0134471 | A1* | 5/2013 | Lee | H01L 33/62 257/99 |

FOREIGN PATENT DOCUMENTS

| | | |
|---|---|---|
| JP | 10-150138 A | 6/1998 |
| JP | 2914097 | 4/1999 |
| JP | 2000-196000 A | 7/2000 |
| JP | 2002-203627 A | 7/2002 |
| JP | 2004-281994 A | 10/2004 |
| JP | 2005-340494 A | 12/2005 |
| JP | 2006-054410 A | 2/2006 |
| JP | 2009-038184 A | 2/2009 |
| JP | 2010-219400 A | 9/2010 |
| JP | 2011-097011 A | 5/2011 |

OTHER PUBLICATIONS

Office Action issued in the corresponding Japanese Patent application, dated Nov. 14, 2017, and corresponding machine translation.

* cited by examiner

LIGHT-EMITTING MODULE, LIGHT-EMITTING DEVICE AND METHOD OF MAKING LIGHT-EMITTING MODULE

BACKGROUND OF THE INVENTION

1. Field of the Invention

The present invention relates to a light-emitting module a light-emitting device, and a method of making a light-emitting module.

2. Description of Related Art

An example of a conventional light-emitting module is disclosed in JP-2914097, for example. This light-emitting module is provided with a base, a wiring pattern, and a light-emitting element. A recess having a bottom surface (installation surface) is formed in the base. The wiring pattern is formed so as to cover a region of the base that includes the installation surface. The light-emitting element is installed on the installation surface via the wiring pattern. Light from the light-emitting element is emitted in the direction in which the installation surface faces as a main emission direction.

In the case where the light-emitting module is mounted on the mounting board of an electronic device or the like, a part of the wiring pattern is connected to the mounting board by solder, for example. The orientation of the main emission direction relative to the mounting board is set as appropriate according to the application of the light-emitting module in the electronic device. The light-emitting module thus needs to be configured so as to be suitably mountable according to the mounting direction.

SUMMARY OF THE INVENTION

The present invention was conceived under the above circumstances, and has an object to provide a light-emitting module or a light-emitting device that can be more suitably mounted.

A light-emitting module according to a first aspect of the present invention includes a light-emitting element, a base that includes an installation surface facing in a first direction on which the light-emitting element is installed and a mounting surface facing in a second direction which is at right angles to the first direction, and a wiring pattern that is formed on the base and is in electrical contact with the light-emitting element. The base includes a pair of mounting recesses recessed from the mounting surface and spaced from each other in a third direction which is at right angles to both the first direction and the second direction. The wiring pattern includes a pair of mounting-surface electrodes respectively covering at least a part of the pair, of mounting recesses.

A light-emitting device according to a second aspect of the present invention includes the light-emitting module according to the first aspect, and a mounting board whose thickness direction is in the second direction and that includes a pair of pad portions facing in the second direction, spaced from each other in the third direction and having the pair of mounting-surface electrodes joined thereto.

A method of making the light-emitting module according to a third aspect of the present invention includes a step of preparing a base material that includes a plurality of installation regions facing in a first direction, a pair of side surfaces facing the opposite side to each other in a second direction which is at right angles to the first direction and a back surface facing the opposite side to the plurality of installation regions in the first direction, and is elongated in a third direction which is at right angles to both the first direction and the second direction, the plurality of installation regions being arrayed in the third direction, and the base material having plural pairs of preliminary recesses that are recessed from the pair of side surfaces and are respectively located between the plurality of installation regions in the third direction, a step of forming a conductor layer that covers at least a part of each of the plural pairs of preliminary recesses, a step of installing a plurality of light-emitting elements respectively on a different one of the plurality of installation regions, and a step of cutting the base material along a plurality of cutting lines respectively passing through the plural pairs of preliminary recesses.

A method of making the light-emitting module according to a fourth aspect of the present invention includes a step of preparing a base material that includes a plurality of installation regions facing in a first direction, a pair of side surfaces facing the opposite side to each other in a second direction which is at right angles to the first direction and a back surface facing the opposite side to the plurality of installation regions in the first direction, and is elongated in a third direction which is at right angles to both the first direction and the second direction, the plurality of installation regions being arrayed in the third direction, and the base material having plural pairs of through holes that pass through in the first direction and are respectively located between the plurality of installation regions in the third direction, a step of forming a conductor layer that covers at least a part of an inner surface of each of the plural pairs of through holes, a step of installing a plurality of light-emitting elements respectively on a different one of the plurality of installation regions, and a step of cutting the base material along a plurality of cutting lines respectively passing through the plural pairs of through holes.

A light-emitting module according to a fifth aspect of the present invention includes a light-emitting element, a base that includes an installation surface facing in a first direction on which the light-emitting element is installed and a mounting surface facing in a second direction which is at right angles to the first direction, and a wiring pattern that is formed on the base and is in electrical contact with the light-emitting element. The wiring pattern includes a pair of mounting-surface electrodes formed on the mounting surface and spaced from each other in a third direction which is at right angles to both the first direction and the second direction.

A light-emitting device according to a sixth aspect of the present invention includes the light-emitting module according to the fifth aspect, and a mounting board whose thickness direction is in the second direction and that includes a pair of pad portions facing in the second direction, spaced from each other in the third direction and having the pair of mounting-surface electrodes joined thereto.

A method of making the light-emitting module according to a seventh aspect of the present invention includes a step of preparing a base material that includes a plurality of through holes passing through in a first direction, having inner-facing surfaces facing each other in a second direction which is at right angles to the first direction and arranged in a matrix in the second direction and a third direction which is at right angles to both the first direction and the second direction, and a plurality of installation regions facing in the first direction and arranged in a matrix in the second direction and the third direction so as to be respectively located between the through holes adjacent in the second direction, a step of forming a conductor layer that covers portions of the inner-facing surfaces of each through hole that are spaced from each other in the third direction, a step of installing a plurality of light-emitting elements respectively on a different one of the plurality of installation regions, and a step of cutting the base material along a plurality of cutting lines respectively passing through the portions of the conductor layer that cover the inner-facing surfaces.

According to the present invention, the light-emitting module includes the pair of mounting-surface electrodes. The pair of mounting-surface electrodes are arranged so as to be spaced from each other in the third direction with the mounting surface sandwiched therebetween. Joining these mounting-surface electrodes to the mounting board by solder, for example, enables the light-emitting module to be stably and reliably mounted on the mounting board. Accordingly, the light-emitting module can be more suitably mounted.

Other features and advantages of the present invention will become apparent from the detailed description given below with reference to the accompanying drawings.

DESCRIPTION OF THE PREFERRED EMBODIMENTS

Figure 1:
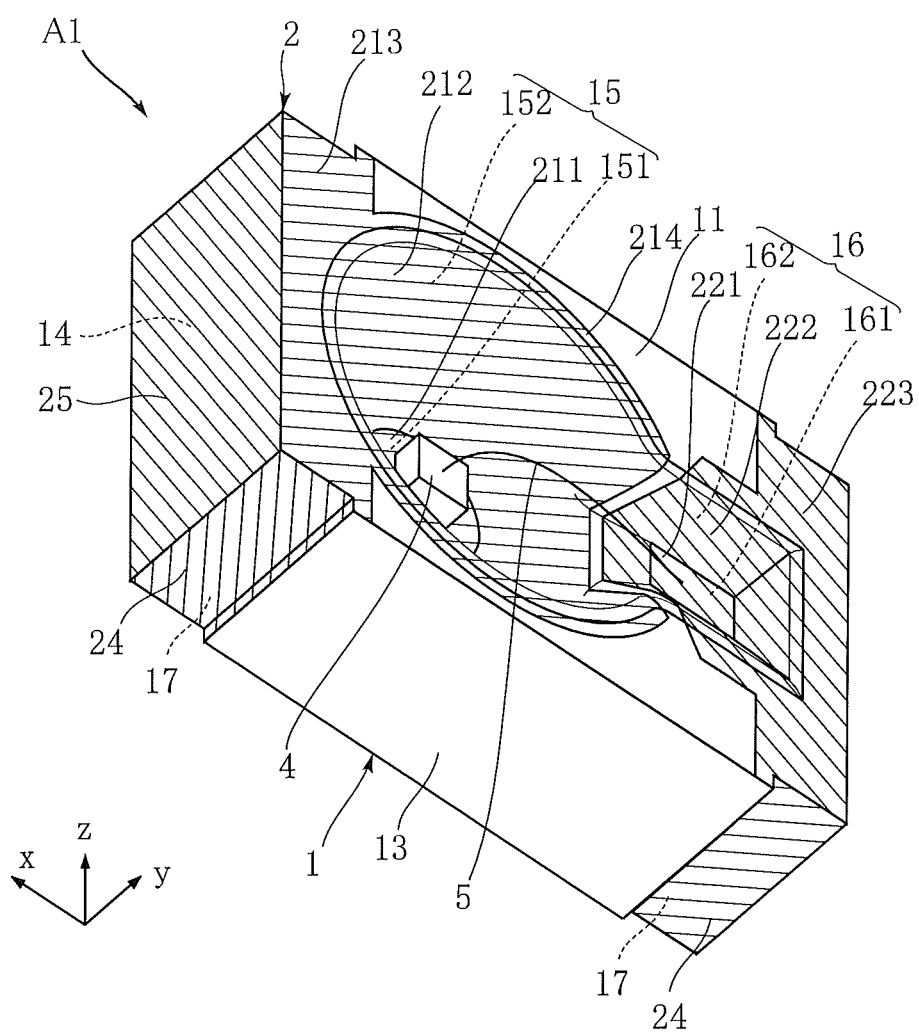
FIG. 1 is a perspective view showing a main section of a light-emitting module based on a first embodiment of the present invention.

Hereinafter, embodiments of the present invention will be specifically described with reference to the drawings.

FIGS. 1 to 7 show a light-emitting module based on a first embodiment of the present invention. The light-emitting module A1 of the present embodiment is provided with a base 1, a wiring pattern 2, a light-emitting element 4, a wire 5, and a translucent resin 6. FIGS. 8 to 11 show a light-emitting device that uses the light-emitting module A1. The light-emitting device E1 of the present embodiment is provided with the light-emitting module A1 and a mounting board 7.

Figure 2:
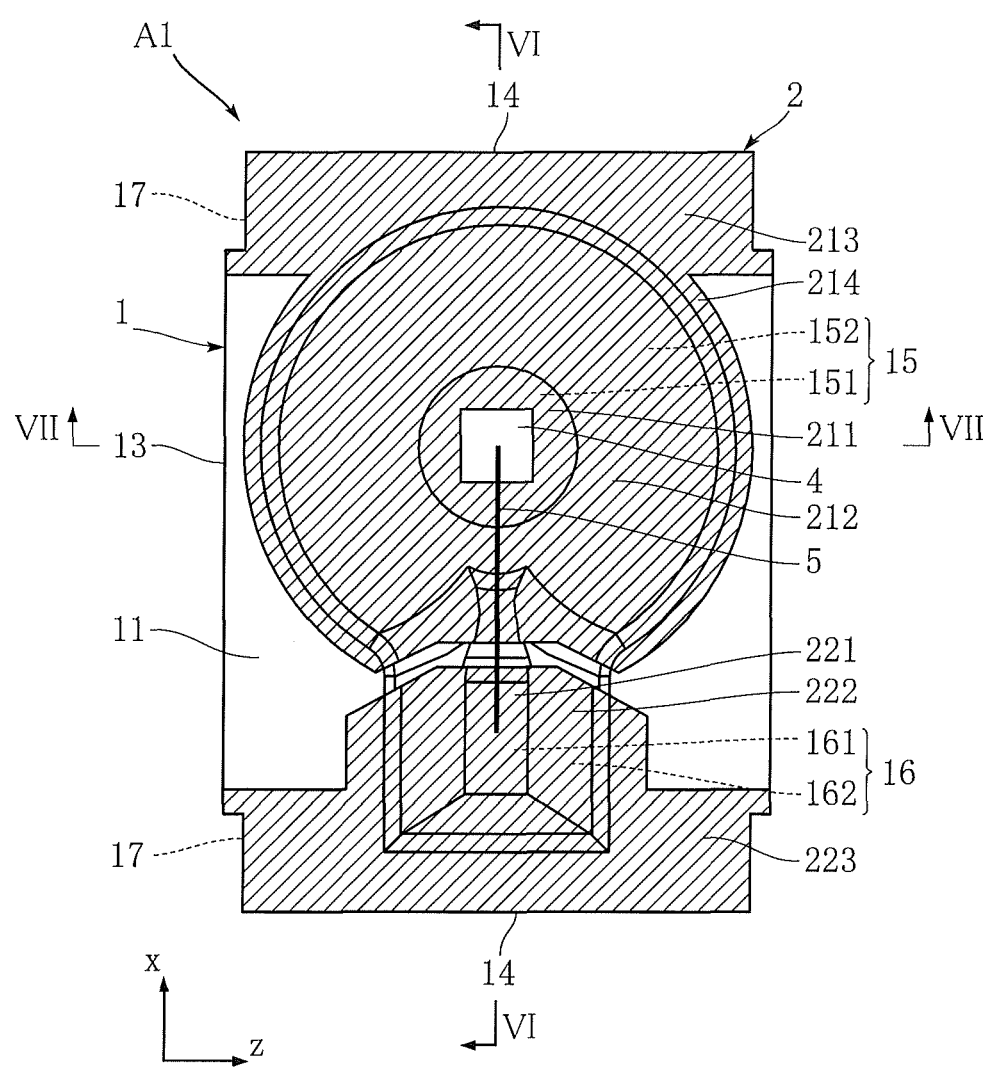
FIG. 2 is a front view showing a main section of the light-emitting module of FIG. 1.
Figure 3:
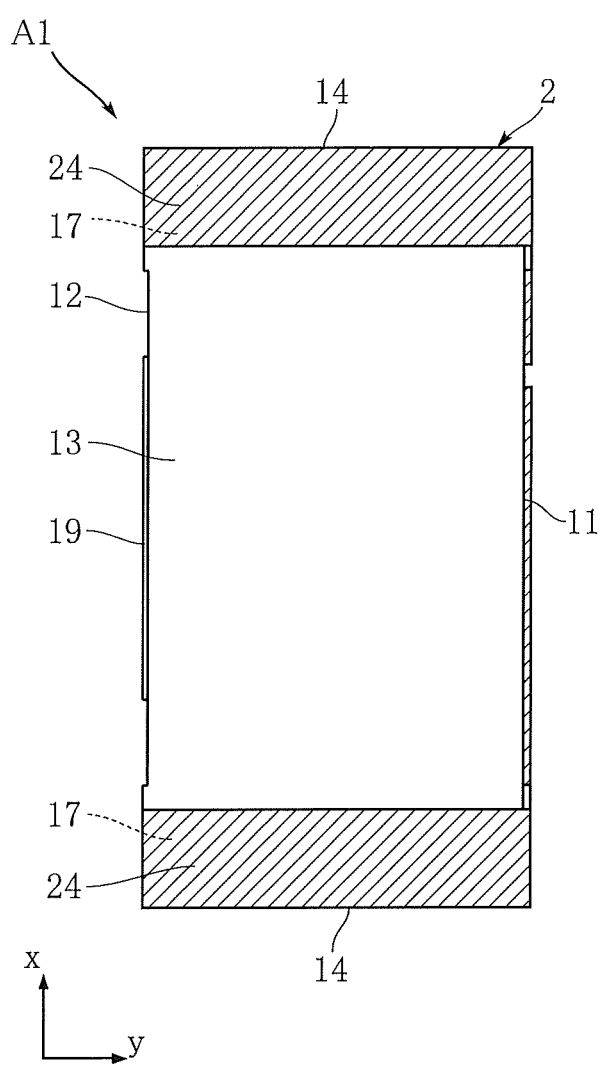
FIG. 3 is a bottom view showing the light-emitting module of FIG. 1.
Figure 4:
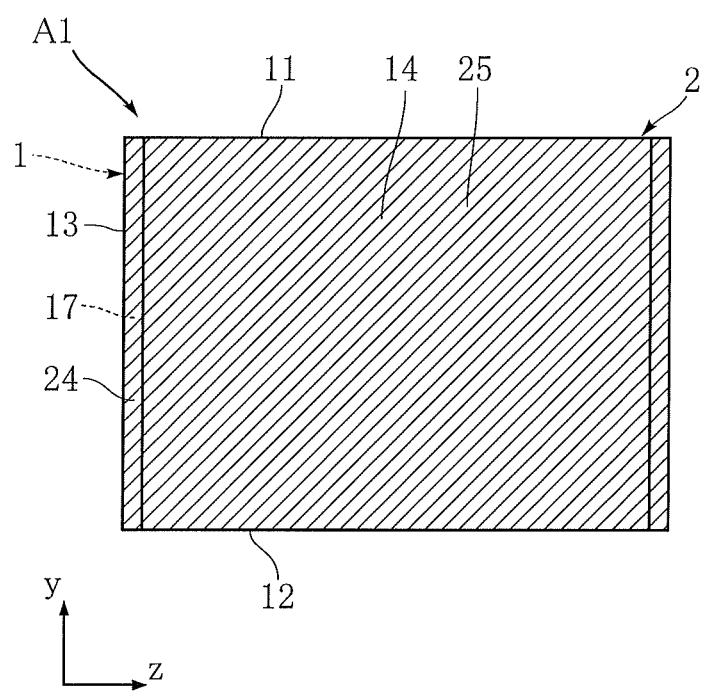
FIG. 4 is a side view showing the light-emitting module of FIG. 1.
Figure 5:
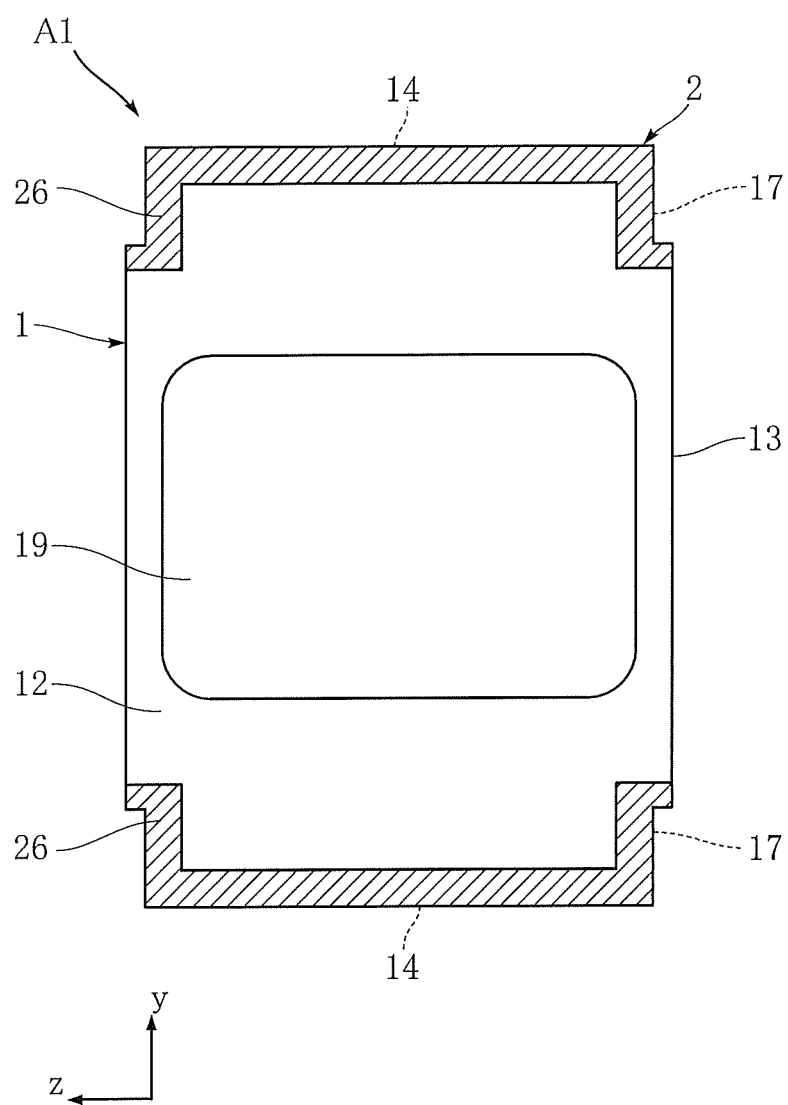
FIG. 5 is a rear view showing the light-emitting module of FIG. 1.
Figure 6:
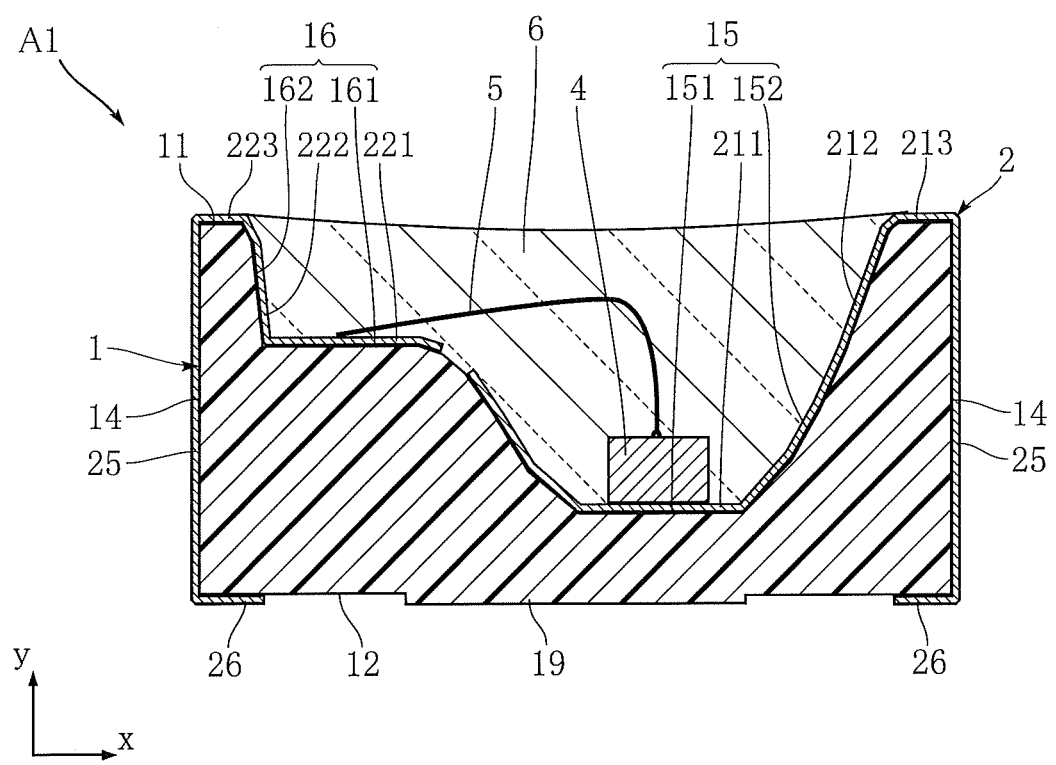
FIG. 6 is a cross-sectional view along a line VI-VI in FIG. 2.
Figure 7:
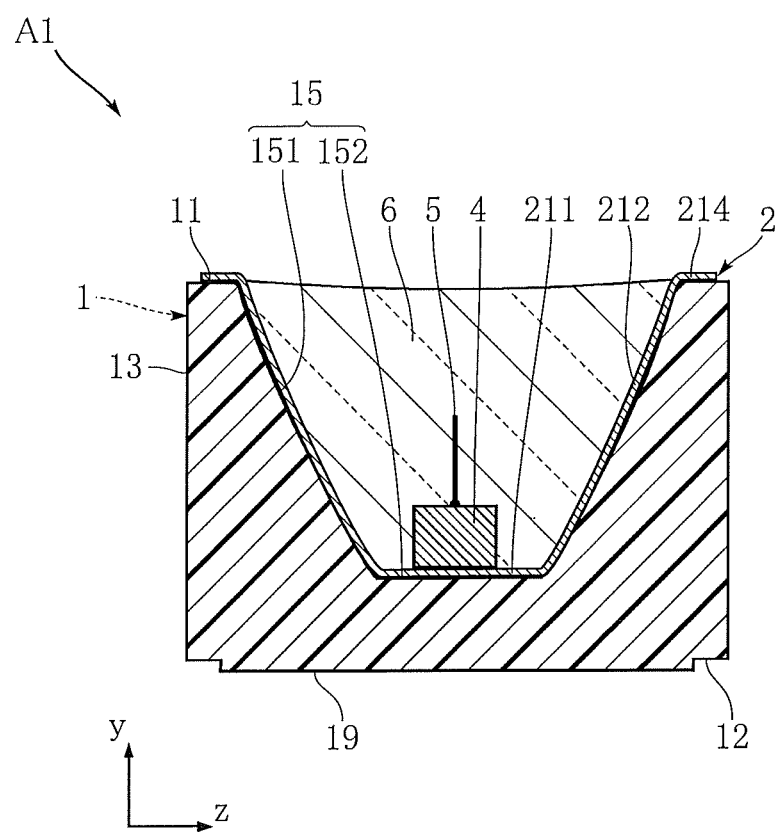
FIG. 7 is a cross-sectional view along a line VII-VII in FIG. 2.
Figure 8:
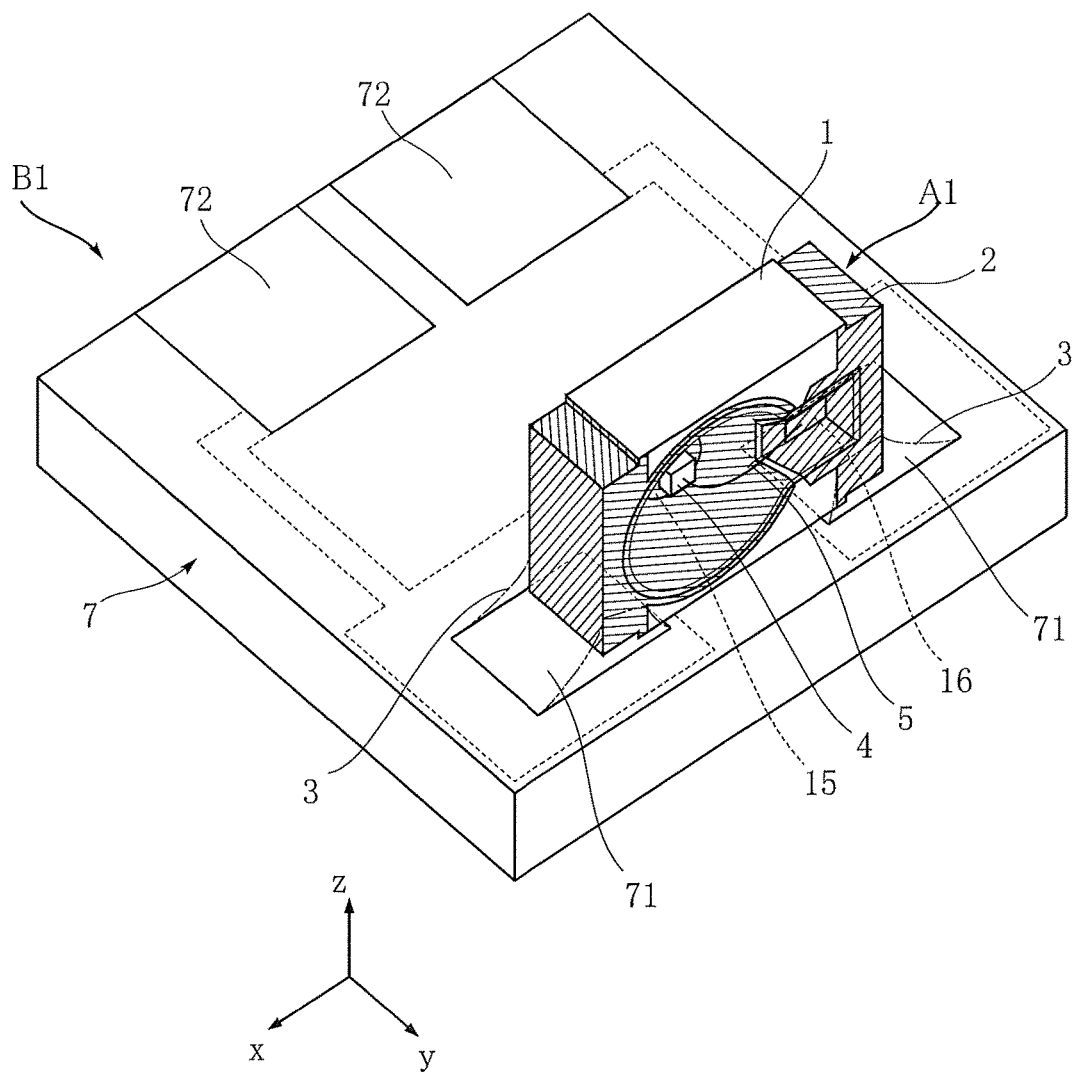
FIG. 8 is a perspective view showing a main section of a light-emitting device based on the first embodiment of the present invention.
Figure 9:
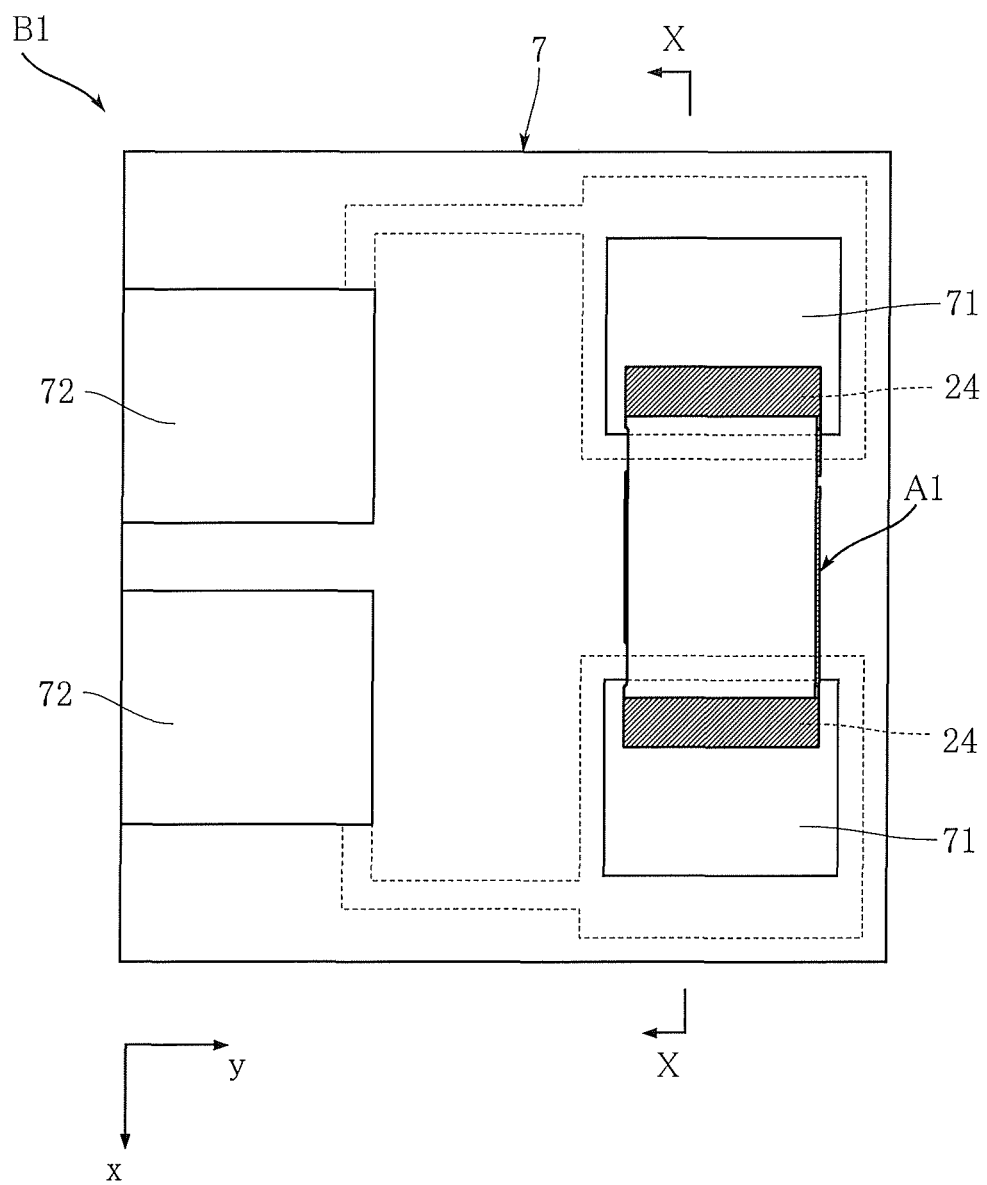
FIG. 9 is a plan view showing the light-emitting device of FIG. 8.
Figure 10:
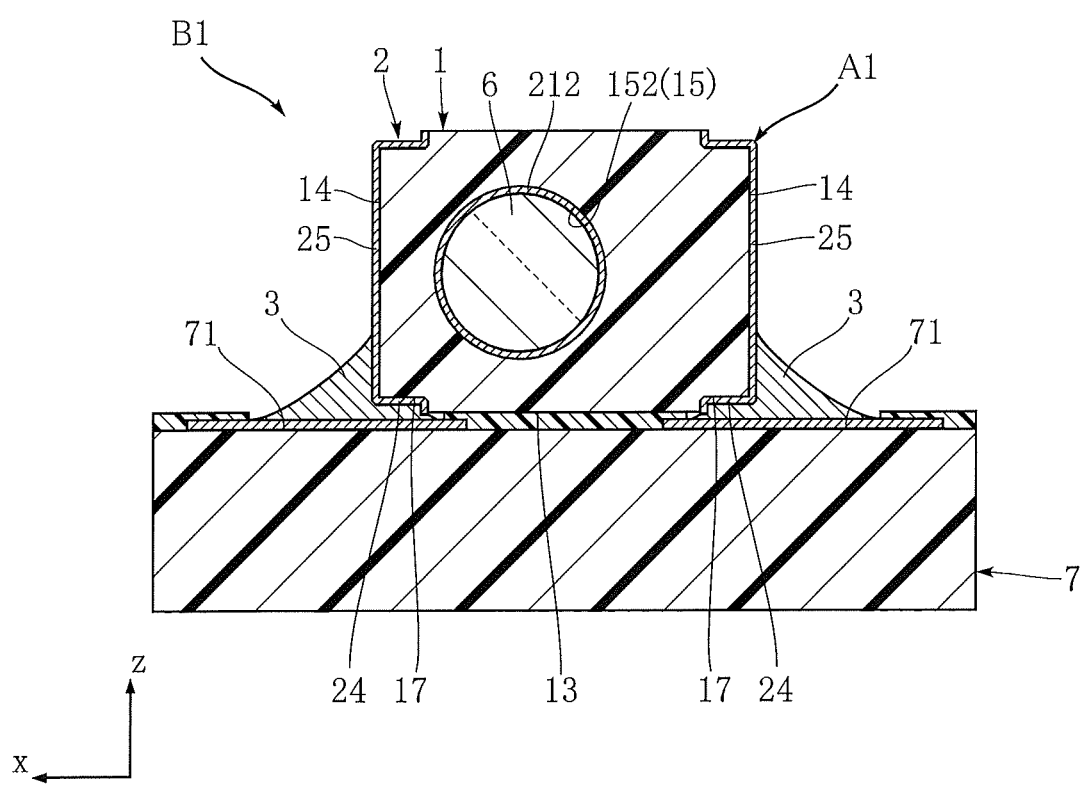
FIG. 10 is a cross-sectional view along a line X-X in FIG. 9.
Figure 11:
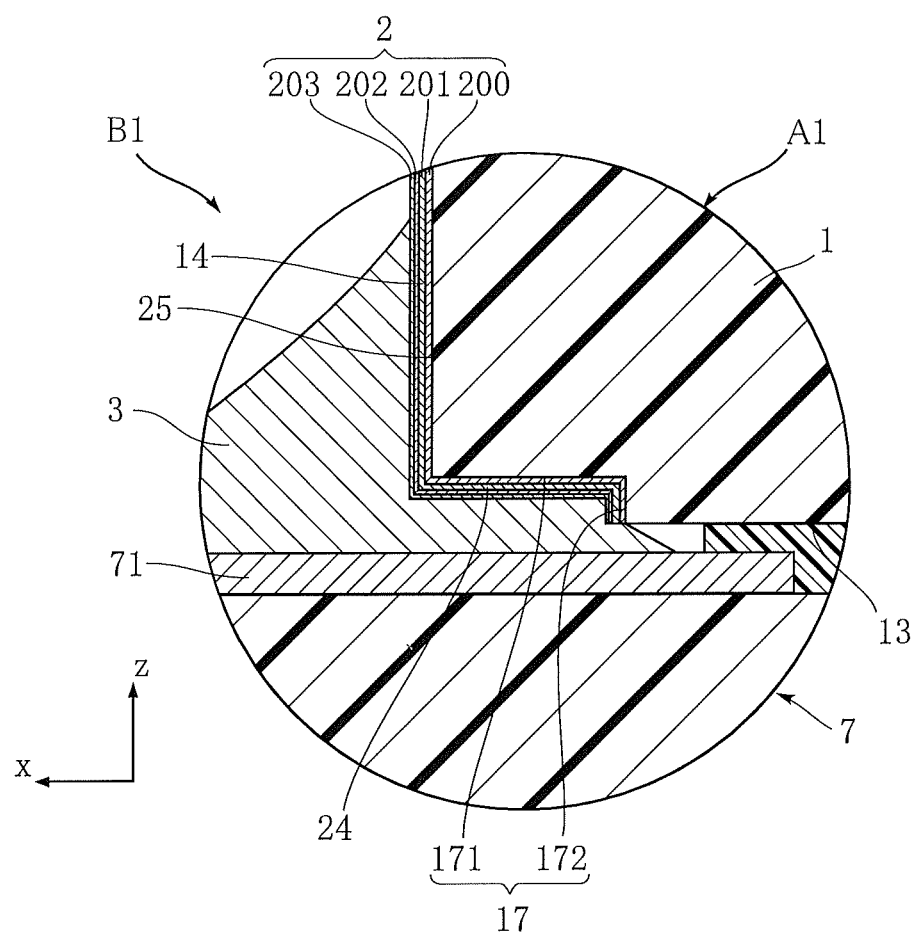
FIG. 11 is an enlarged cross-sectional view of a main section along a line X-X in FIG. 9.

FIG. 1 is a perspective view showing a main section of the light-emitting module A1. FIG. 2 is a front view showing a main section of the light-emitting module A1. FIG. 3 is a bottom view showing the light-emitting module A1. FIG. 4 is a side view showing the light-emitting module A1. FIG. 5 is a rear view showing the light-emitting module A1. FIG. 6 is a cross-sectional view along a line VI-VI in FIG. 2. FIG. 7 is a cross-sectional view along a line VII-VII in FIG. 2. FIG. 8 is a perspective view showing a main section of the light-emitting device B1. FIG. 9 is a plan view showing the light-emitting device B1. FIG. 10 is a cross-sectional view along a line X-X in FIG. 9. FIG. 11 is an enlarged cross-sectional view of a main section along a line X-X in FIG. 9. Note that, for convenience of understanding, the translucent resin 6 is omitted in FIGS. 1, 2 and 8.

The light-emitting module A1 is a module that functions as a light source of the light-emitting device B1, and has dimensions of about 3.1 mm in the x direction, about 1.6 mm in the y direction, and about 2.3 mm in the z direction. The light-emitting device B1 is installed in a portable telephone, for example, and is used as a transmitter that transmits signals using infrared-rays.

The base 1 is a rectangular parallelepiped as a whole, and is made of a coating adhesive insulation resin such as LCP (liquid crystal polymer) resin, for example. The base 1 has a top surface 11, a back surface 12, a mounting surface 13, a pair of side surfaces 14, a pair of mounting recesses 17, a first accommodating recess 15, and a second accommodating recess 16.

The top surface 11 faces in the y direction. The back surface 12 faces the opposite side to the top surface 11 in the y direction. The mounting surface 13 faces in the z direction, and is connected to the top surface 11 and the back surface 12. The pair of side surfaces 14 face in the x direction, and face the opposite side to each other. As shown in FIG. 10, the light-emitting module A1 is configured so as to be mounted with the mounting surface 13 oriented squarely facing the mounting board 7.

The pair of mounting recesses 17 are respectively recessed from the mounting surface 13 in the z direction, and are spaced from each other in the x direction. The mounting surface 13 is located between the pair of mounting recesses 17. In the present embodiment, each mounting recess 17 is open outward in the x direction. Also, the mounting recesses 17 are open outward on both sides in the y direction. Each mounting recess 17 is rectangular when viewed in the x direction.

As shown in FIG. 11, the mounting recesses 17 have a mounting recess upper surface 171 and a mounting recess side surface 172. The mounting recess upper surface 171 faces downward in the z direction in FIG. 11. The mounting recess side surface 172 faces outward in the x direction, is interposed between the mounting surface 13 and the mounting recess upper surface 171, and is connected to these surfaces. In the present embodiment, the depth of the mounting recesses 17 in the z direction is equal to the thickness of the wiring pattern 2 added to a depth of about 0.08 mm, for example.

The first accommodating recess 15 is recessed from the top surface 11 in the y direction. The first accommodating recess 15 is shaped like a parabola, and has a first bottom surface 151 and a first side surface 152. The first bottom surface 151 is circular, and is the surface on which the light-emitting element 4 is installed.

The second accommodating recess 16 is recessed from the top surface 11 in the y direction. The second accommodating recess 16 is rectangular when viewed in the y direction, and has a second bottom surface 161 and a second side surface 162. The second bottom surface 161 is rectangular when viewed in the y direction, and faces in the y direction. The second side surface 162 is connected to the second bottom surface 161 and the top surface 11.

As shown in FIG. 6, the second bottom surface 161 is located closer to the top surface 11 in the y direction than to the first bottom surface 151. Also, as shown in FIG. 2, the first side surface 152 is mainly connected to the top surface 11 and partly connected to the second bottom surface 161, with the remaining part thereof connected to the second side surface 162.

A back surface protrusion 19 is formed on the back surface 12 side of the base 1. The back surface protrusion 19 projects slightly from the back surface 12, and is substantially rectangular when viewed in the y direction, for example.

The wiring pattern 2 is formed on the base 1, constitutes a conduction path to the light-emitting element 4, and is for realizing mounting of the light-emitting module A1 to the mounting board 7. In the present embodiment, as shown in FIG. 11, the wiring pattern 2 has a structure in which a base layer 200, a first layer 201, a second layer 202 and a third layer 203 are laminated in order from the base 1.

The base layer 200 is made of Cu and formed by electroless plating, for example, and has a thickness of about 0.1 to 1.0 μm, for example. The first layer 201 is made of Cu and formed by electroplating, for example, and has a thickness of about 5 to 30 μm, for example. The second layer 202 is made of Ni and formed by electroplating, for example, and has a thickness of 1 to 5 μm, for example. The third layer 203 is made of Au and formed by electroplating, for example, and has a thickness of about 0.01 to 0.3 μm, for example. The second layer 202 made of Ni has a lower wettability to solder than the third layer 203 made of Au.

The wiring pattern 2 has a pair of mounting-surface electrodes 24, a pair of side-surface electrodes 25, a pair of back-surface electrodes 26, a first bottom-surface portion 211, a first side-surface portion 212, a first connecting portion 213, a first annular portion 214, a second bottom-surface portion 221, a second side-surface portion 222, and a second connecting portion 223.

The pair of mounting-surface electrodes 24 respectively cover at least a part of the pair of mounting recesses 17 of the base 1, and, in the present embodiment, the mounting-surface electrodes 24 respectively cover the whole of the mounting recesses 17. In the present embodiment, the distance in the z direction between the surface of the portion of each mounting-surface electrode 24 that covers the mounting recess upper surface 171 and an extended surface of the mounting surface 13 is about 0.08 mm, for example.

The pair of side-surface electrodes 25 respectively cover at least a part of the pair of side surfaces 14 of the base 1, and, in the present embodiment, the side-surface electrodes 25 respectively cover the whole of the side surfaces 14. The side-surface electrodes 25 and the mounting-surface electrodes 24 are respectively connected to each other.

The pair of back-surface electrodes 26 respectively cover a part of the back surface 12 of the base 1. In the present embodiment, the back-surface electrodes 26 are respectively formed in a band along the end edges of the side surfaces 14 and the pair of mounting recesses 17.

The first bottom-surface portion 211 covers at least a part of the first bottom surface 151 of the first accommodating recess 15, and, in the present embodiment, the first bottom-surface portion 211 covers the whole of the first bottom surface 151. The first side-surface portion 212 is connected to the first bottom-surface portion 211, and covers a part of the first side surface 152 of the first accommodating recess 15.

The first connecting portion 213 is formed on the top surface 11, and connects the first side-surface portion 212 to one of the pair of mounting-surface electrodes 24 (left mounting-surface electrode 24 in the x direction in FIG. 1). The first annular portion 214 is formed on the top surface 11, and has an annular shape surrounding the first accommodating recess 15. The first annular portion 214 is connected to the first side-surface portion 212 and the first connecting portion 213.

The second bottom-surface portion 221 covers at least a part of the second bottom surface 161 of the second accommodating recess 16, and, in the present embodiment, covers almost the whole of the second bottom surface 161. As shown in FIG. 2, the second bottom-surface portion 221 is spaced from the first side-surface portion 212.

The second side-surface portion 222 covers at least a part of the second side surface 162 of the second accommodating recess 16, and, in the present embodiment, covers almost the whole of the second side surface 162. The second side-surface portion 222 is spaced from the first side-surface portion 212.

The second connecting portion 223 is formed on the top surface 11, and connects the second side-surface portion 222 to the other of the pair of mounting-surface electrodes 24 (right mounting-surface electrode 24 in the x direction in FIG. 1).

Note that, in the present embodiment, constituent parts similar to the parts given the reference numerals of the mounting surface 13, the pair of mounting recesses 17, the pair of mounting-surface electrodes 24 and the pair of back-surface electrodes 26 are respectively provided on the opposite sides of the base 1 and the wiring pattern 2 in the z direction. These parts are formed for convenience of the manufacturing process of the light-emitting module A1, and may be used as the mounting surface 13, the pair of mounting recesses 17, the pair of mounting-surface electrodes 24, and the pair of back-surface electrodes 26.

The light-emitting element 4 is an LED element capable of emitting infrared light, for example. Depending on the application, a device capable of emitting visible light or the like, for example, may be used as the light-emitting element 4. Electrodes (not shown) are provided on both sides of the light-emitting element 4 in the y direction, and the light-emitting element 4 is installed on the first bottom surface 151 of the first accommodating recess 15. More specifically, the electrode on one side of the light-emitting element 4 is joined via a conductive joining material (not shown) to the first bottom-surface portion 211 formed on the first bottom surface 151. The electrode on the other side of the light-emitting element 4 is joined to the second side-surface portion 222 by the wire 5.

The translucent resin 6 covers the light-emitting element 4, and fills the first accommodating recess 15 and the second accommodating recess 16. The translucent resin 6 is made of a resin or the like that transmits the infrared rays, for example, from the light-emitting element 4. In the present embodiment, the translucent resin 6 almost completely fills the first accommodating recess 15 and the second accommodating recess 16, but does not project from the first accommodating recess 15 or the second accommodating recess 16. That is, the surface of the translucent resin 6 is slightly sunken.

As shown in FIGS. 8 to 11, the light-emitting device B1 is constituted by mounting the light-emitting module A1 on the mounting board 7. The mounting board 7 has a pair of pad portions 71 and a pair of terminal portions 72. The mounting board 7 is a wiring board on which a wiring pattern is formed on a base made of an epoxy resin, for example.

The pair of pad portions 71 are parts on which the light-emitting module A1 is mounted. The pad portions 71 are respectively connected to the mounting-surface electrodes 24 of the light-emitting module A1 via solder 3. FIG. 9 is a view of the light-emitting device B1 from above in the z direction, and, for convenience of understanding, shows through to the pair of mounting-surface electrodes 24. As shown in FIG. 9, in the present embodiment, the pad portions 71 respectively contain the mounting-surface electrodes 24 when viewed in the z direction. Also, the difference between the dimensions of each pad portion 71 in the x direction and the dimensions of each mounting-surface electrode 24 in the x direction is greater than the difference between the dimensions of each pad portion 71 in the y direction and the dimensions of each mounting-surface electrode 24 in the y direction. In particular, the pad portions 71 are respectively constituted to stick out greatly in the x direction relative to the mounting-surface electrodes 24.

The pair of terminal portions 72 are respectively in electrical contact with a different one of the pair of pad portions 71. The pair of terminal portions 72 are parts to which terminals (not shown) on the portable telephone side, for example, for attaching the light-emitting device B1 are joined.

Next, an example of a method of making the light-emitting module A1 will be described below, with reference to FIGS. 12 to 23.

Figure 12:
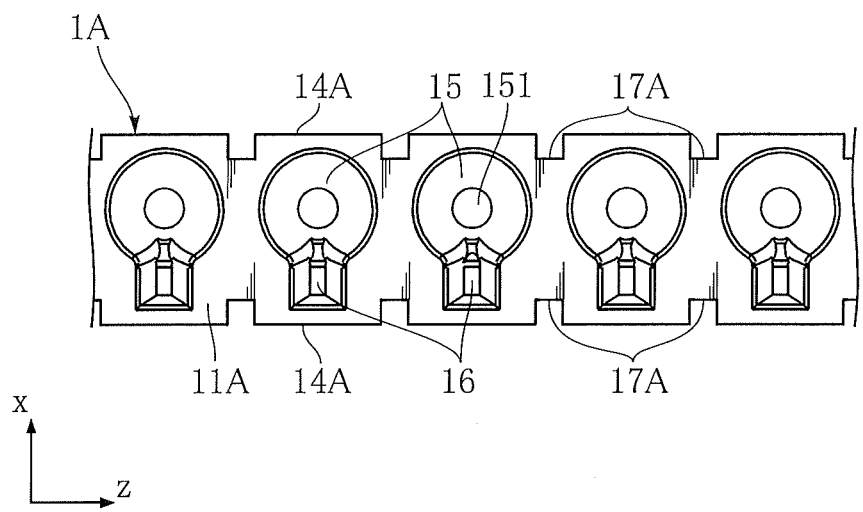
FIG. 12 is a front view showing a main section of a method of making the light-emitting module of FIG. 1.

First, a base material 1A is prepared, as shown in FIG. 12. The base material 1A is elongated in the z direction, and has a top surface 11A, a pair of side surfaces 14A, and a back surface 12A (see FIG. 15). Also, a plurality of first accommodating recesses 15, a plurality of second accommodating recesses 16 and plural pairs of preliminary recesses 17A are formed in the base material 1A. The first accommodating recesses 15 and the second accommodating recesses 16 are respectively joined to each other. The plurality of first accommodating recesses 15 and the plurality of second accommodating recesses 16 are arranged at a uniform pitch in the z direction. A plurality of first bottom surfaces 151 are thereby arranged at a uniform pitch in the z direction. As mentioned above, each first bottom surface 151 is a part (region) on which the light-emitting element 4 is installed.

The positions of the pairs of preliminary recesses 17A coincide with each other in the z direction, and each pair consists of two preliminary recesses 17A spaced from each other in the x direction. Each pair of preliminary recesses 17A is recessed from the side surfaces 14A in the x direction. Also, each preliminary recess 17A reaches from the top surface 11A to the back surface 12A in the y direction. Each pair of preliminary recesses 17A is arranged between structures consisting of the first accommodating recess 15 and the second accommodating recesses 16 adjacent in the z direction, that is, between the first bottom surfaces 151 adjacent in the z direction. The base material 1A is formed by shaping a liquid crystal polymer material using a mold, for example.

Figure 13:
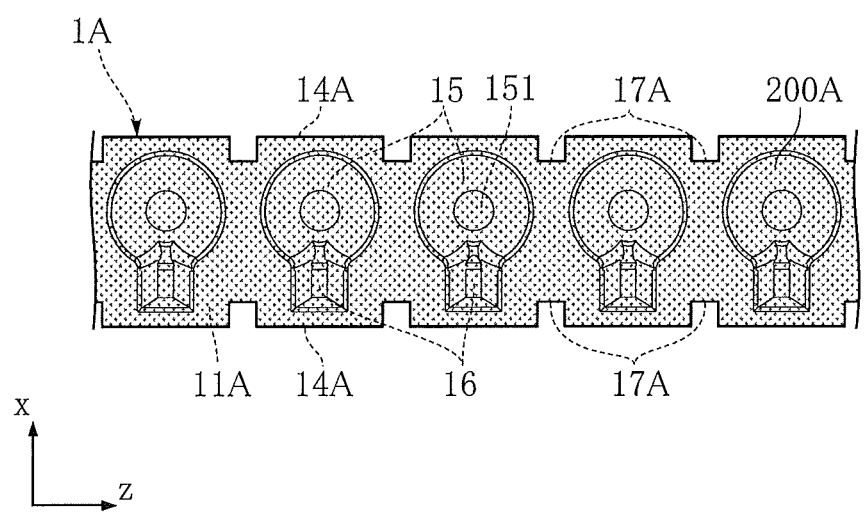
FIG. 13 is a front view showing a main section of the method of making the light-emitting module of FIG. 1.
Figure 14:
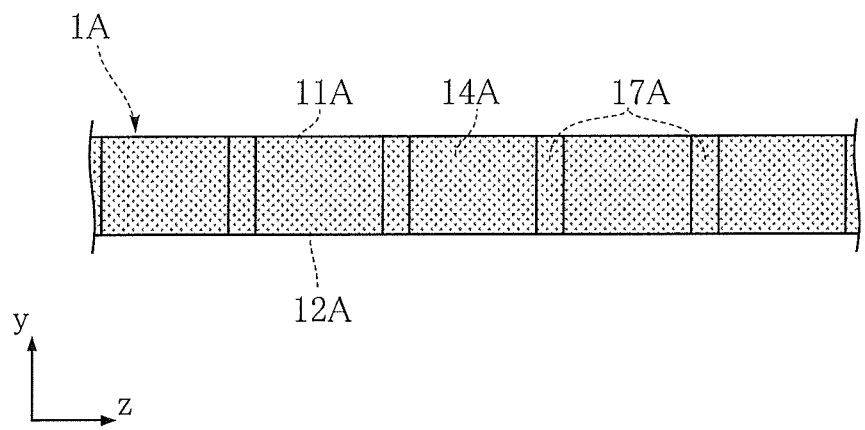
FIG. 14 is a side view showing a main section of the method of making the light-emitting module of FIG. 1.
Figure 15:
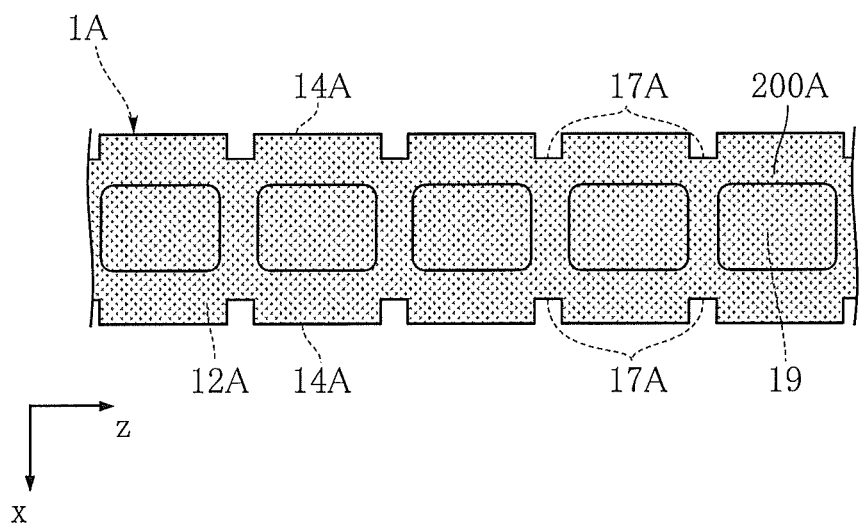
FIG. 15 is a rear view showing a main section of the method of making the light-emitting module of FIG. 1.

Next, a base layer 200A is formed, as shown in FIGS. 13 to 15. Formation of the base layer 200A is performed by electroless plating, for example. The base layer 200A made of Cu, for example, is thereby formed over the entire exposed surface of the base material 1A. The base layer 200A has a thickness of about 0.1 to 1.0 μm, for example.

Figure 16:
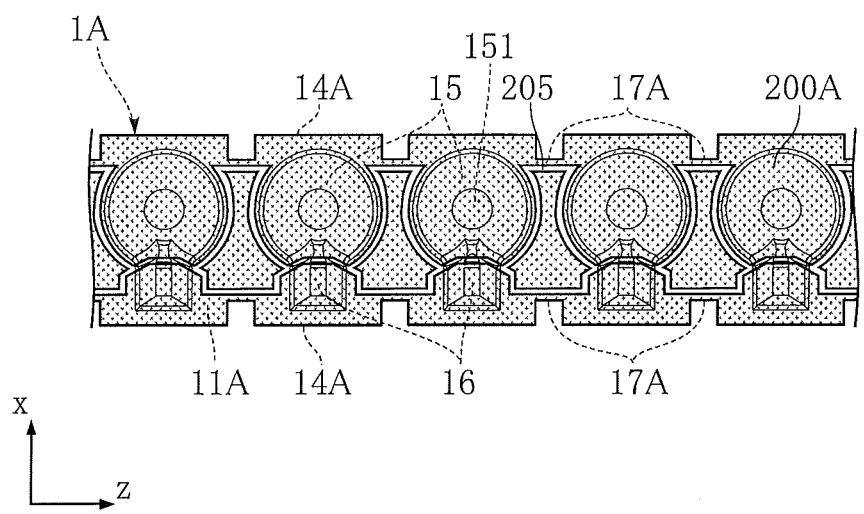
FIG. 16 is a front view showing a main section of the method of making the light-emitting module of FIG. 1.
Figure 17:
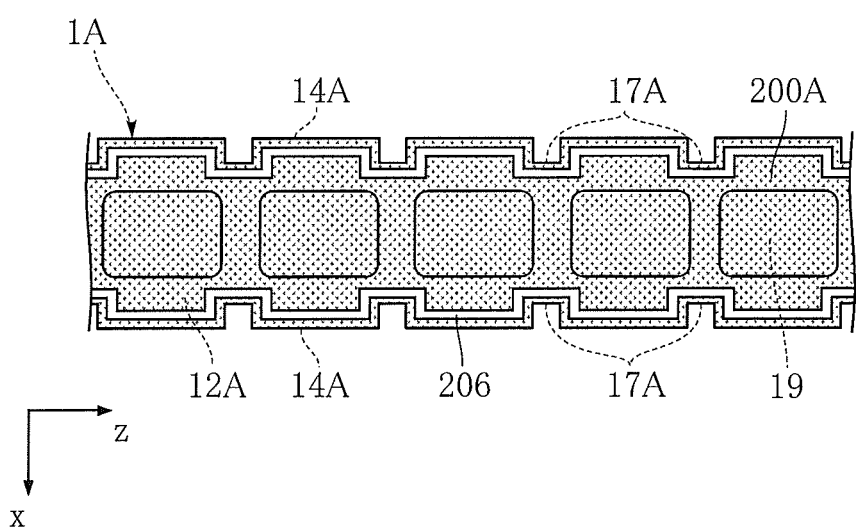
FIG. 17 is a rear view showing a main section of the method of making the light-emitting module of FIG. 1.

Next, slits 205 and slits 206 are formed in the base layer 200A, as shown in FIGS. 16 and 17. The slits 205 and the slits 206 are formed by linearly removing a part of the base layer 200A using a laser, for example. As a result of the slits 205 and the slits 206 being formed as illustrated, the base layer 200A is divided into a continuous portion that is elongated in the z direction on the upper side of the base material 1A in the x direction in the diagram, a continuous portion that is elongated in the z direction on the lower side of the base material 1A in the x direction in the diagram, and a plurality of portions isolated from these portions.

Figure 18:
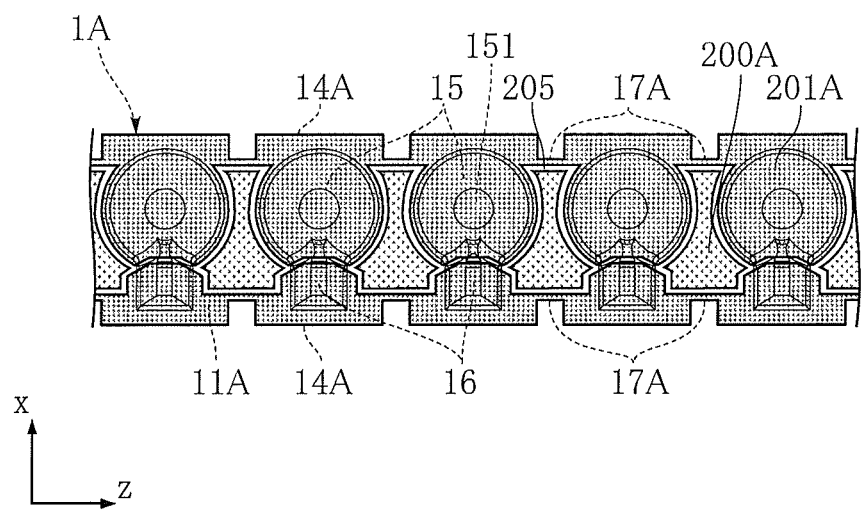
FIG. 18 is a front view showing a main section of the method of making the light-emitting module of FIG. 1.
Figure 19:
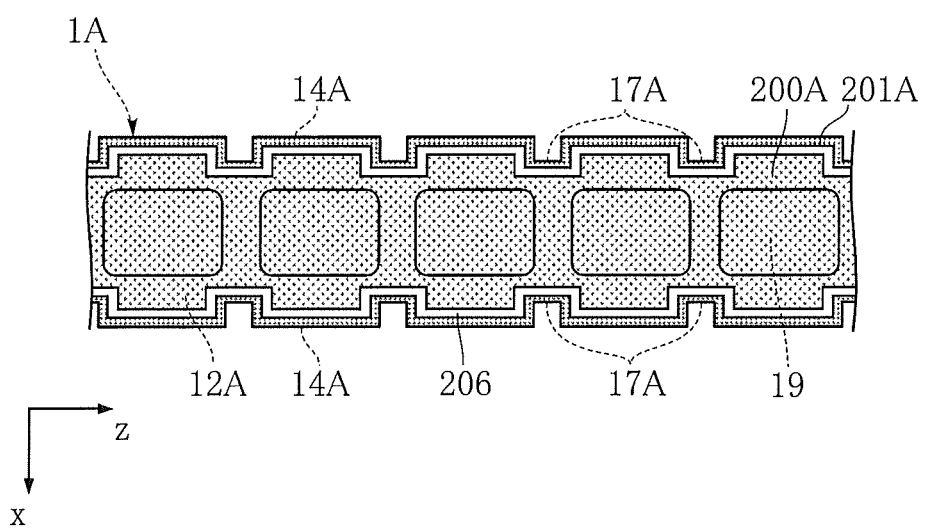
FIG. 19 is a rear view showing a main section of the method of making the light-emitting module of FIG. 1.
Figure 20:
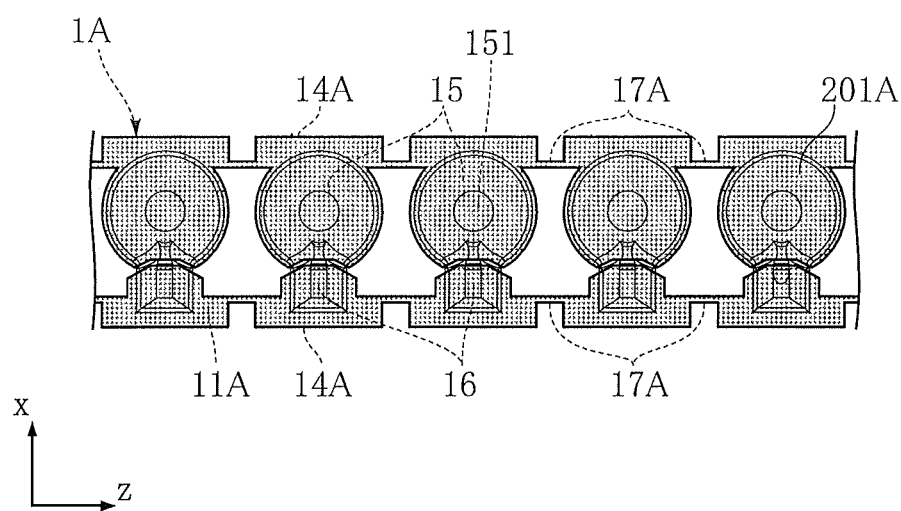
FIG. 20 is a front view showing a main section of the method of making the light-emitting module of FIG. 1.
Figure 21:
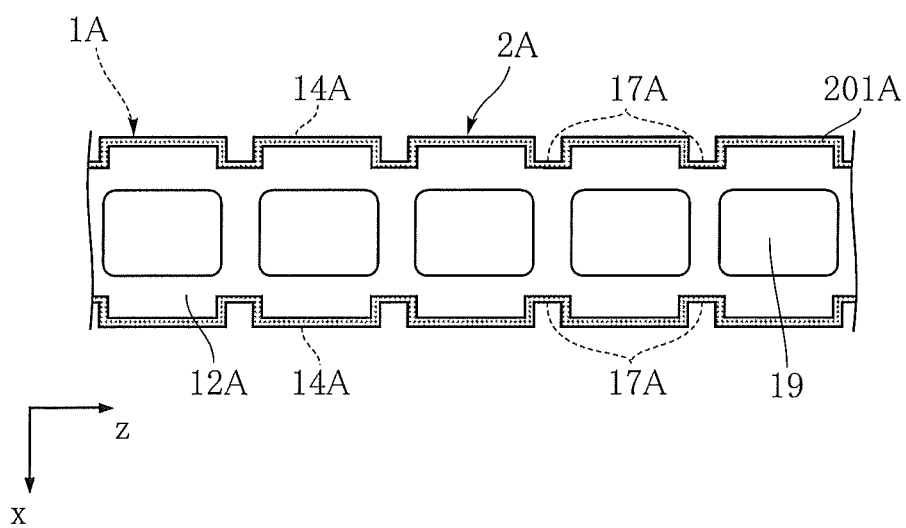
FIG. 21 is a rear view showing a main section of the method of making the light-emitting module of FIG. 1.

Next, a first layer 201A is formed, as shown in FIGS. 18 and 19. Formation of the first layer 201A is performed by electroplating, for example. That is, the first layer 201A is formed by connecting electrodes for use in plating (not shown) near both edges of each portion of the base layer 200A that is elongated in the z direction on the upper and lower sides of the base material 1A in the x direction in the diagram. In forming the first layer 201A, a layer made of Cu, for example, is formed at a thickness of about 5 to 30 μm. In FIGS. 18 and 19, the relatively dark colored region is the region where the first layer 201A is formed, and the relatively light colored region is the region where the base layer 200A is exposed.

Next, the exposed base layer 200A is removed by performing soft etching, for example. The state shown in FIGS.

20 and 21 is thereby obtained. In this state, the exposed base layer 200A has been removed, and only the first layer 201A remains.

Figure 22:
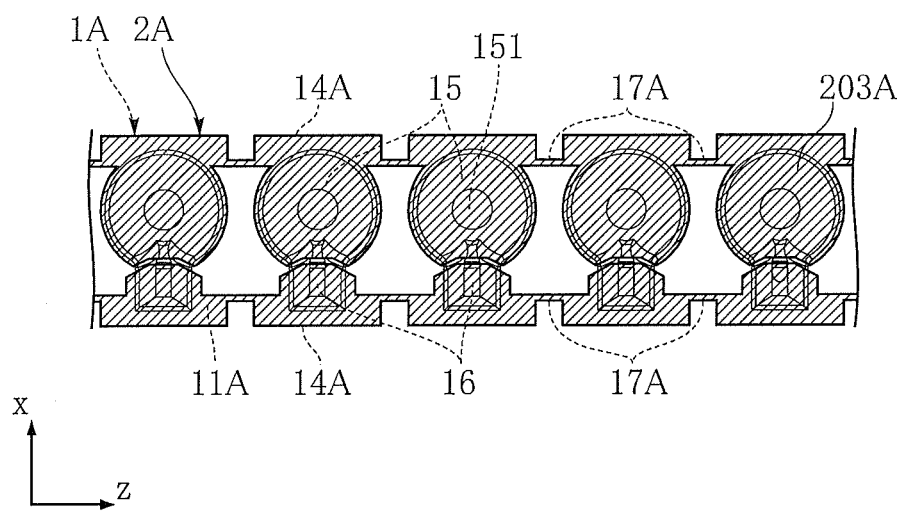
FIG. 22 is a front view showing a main section of the method of making the light-emitting module of FIG. 1.

Next, a second layer 202A and a third layer 203A are formed, as shown in FIG. 22. FIG. 22 shows a state where formation of the third layer 203A is completed. Formation of the second layer 202A and the third layer 203A is performed by electroplating similar to when forming the first layer 201A, for example. In forming the second layer 202A, a layer made of Ni, for example, is formed at a thickness of about 1 to 5 μm. In forming the third layer 203A, a layer made of Au, for example, is formed at a thickness of about 0.01 to 0.3 μm. A conductor layer 2A is thereby obtained.

Figure 23:
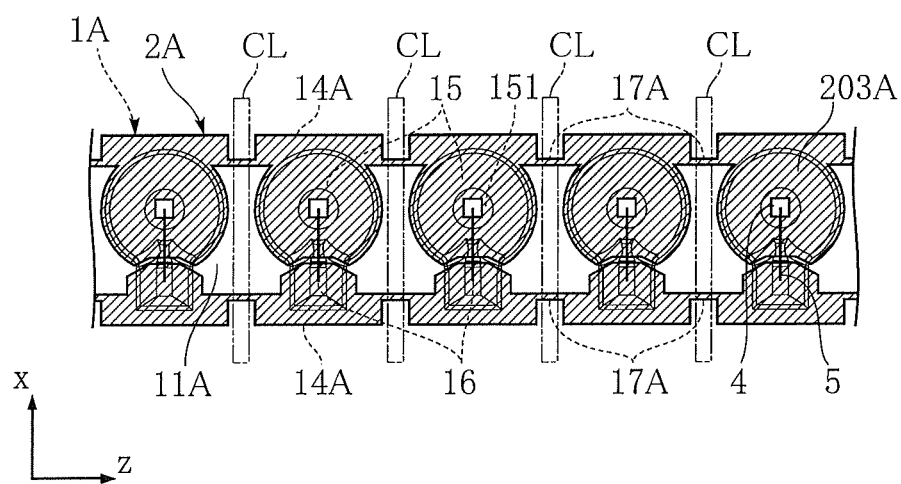
FIG. 23 is a front view showing a main section of the method of making the light-emitting module of FIG. 1.

Next, as shown in FIG. 23, a plurality of light-emitting elements 4 are respectively installed on the plurality of first bottom surfaces 151. A wire 5 is then bonded to each light-emitting element 4 and the conductor layer 2A. Also, although not shown for convenience of understanding, the plurality of first accommodating recesses 15 and the plurality of second accommodating recesses 16 are filled with a liquid resin material, for example, so as to cover the plurality of light-emitting elements 4, and the liquid resin material is cured. A plurality of pieces of translucent resin 6 (not shown) are thereby obtained. Thereafter, the base material 1A is cut by a dicing blade, for example, along a plurality of cutting lines CL shown in FIG. 23. The cutting lines CL are respectively included in an xy plane and pass through pairs of preliminary recesses 17A in the x direction. As a result of this cutting, portions of the preliminary recesses 17A that are on both sides of the cutting lines CL in the z direction are separated and form the mounting recesses 17 shown in FIGS. 1 to 11. Also, the conductor layer 2A consisting of the base layer 200A, the first layer 201A, the second layer 202A and the third layer 203A forms a plurality of wiring patterns 2 consisting of a base layer 200, a first layer 201, a second layer 202, and a third layer 203. As a result of completing the above processes, a plurality of light-emitting modules A1 are obtained.

Next, the working of the light-emitting module A1 and the light-emitting device B1 will be described.

According to the present embodiment, the light-emitting module A1 has a pair of mounting-surface electrodes 24. The pair of mounting-surface electrodes 24 are arranged so as to be spaced from each other in the x direction with the mounting surface 13 sandwiched therebetween. Joining these mounting-surface electrodes 24 to the mounting board 7 with the solder 3, for example, enables the light-emitting module A1 to be stably and reliably mounted on the mounting board 7. Accordingly, the light-emitting module A1 can be more suitably mounted.

As a result of the mounting-surface electrodes 24 covering the whole of the mounting recesses 17, the joined area of the mounting-surface electrodes 24 and the mounting board 7 can be enlarged, enabling the light-emitting module A1 to be more firmly mounted.

As a result of the light-emitting module A1 having the side-surface electrodes 25, the solder 3 can be expected to also adhere to the side-surface electrodes 25. The mounting strength of the light-emitting module A1 can thereby be further enhanced.

As a result of the mounting-surface electrodes 24 being connected to the side-surface electrodes 25, the solder 3 can be expected to form so as to surround the corner portions of the light-emitting module A1.

As a result of the back-surface electrodes 26 being provided, the back surface 12 side of the light-emitting module A1 also be made to contribute to joining the light-emitting module A1 to the mounting board 7.

As a result of the first accommodating recess 15 being provided and the first side-surface portion 212 covering the first side surface 152, the light from the light-emitting element 4 installed on the first bottom surface 151 can be reflected by the first side-surface portion 212. The emission efficiency of the light-emitting module A1 can thereby be enhanced.

As a result of the second accommodating recess 16 being provided, the wire 5 can be prevented from sticking out from the base 1.

As a result of the mounting-surface electrodes 24 of the light-emitting module A1 being contained by the pad portions 71 of the mounting board 7 provided in the light-emitting device B1, the solder 3 can be made to adhere to the front surface of the mounting-surface electrodes 24. The difference between the dimensions of the pad portions 71 in the x direction and the dimensions of the mounting-surface electrodes 24 in the x direction is greater than the difference between the dimensions of the pad portions 71 in the y direction and the dimensions of the mounting-surface electrodes 24 in the y direction. The light-emitting module A1 can thereby be prevented from rotating about an axis extending in the z direction, when mounting the light-emitting module A1 on the mounting board 7.

Figure 24:
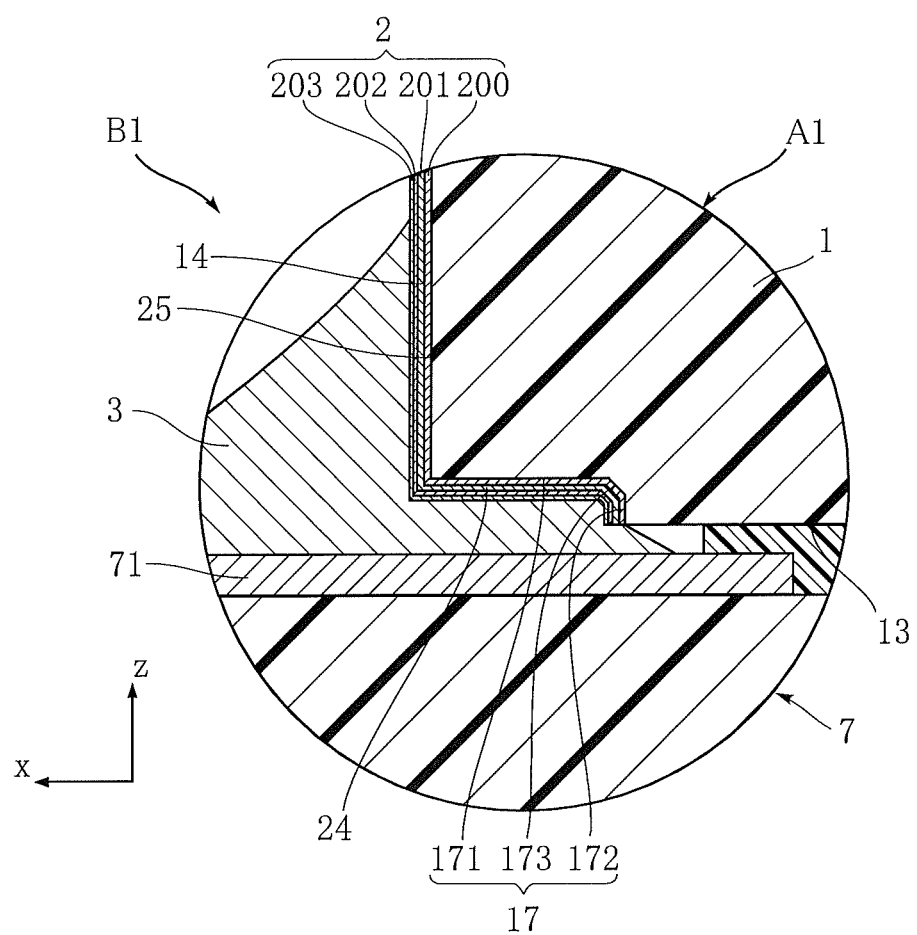
FIG. 24 is an enlarged cross-sectional view showing a main section of a modification of the light-emitting module based on the first embodiment of the present invention.
Figure 87:
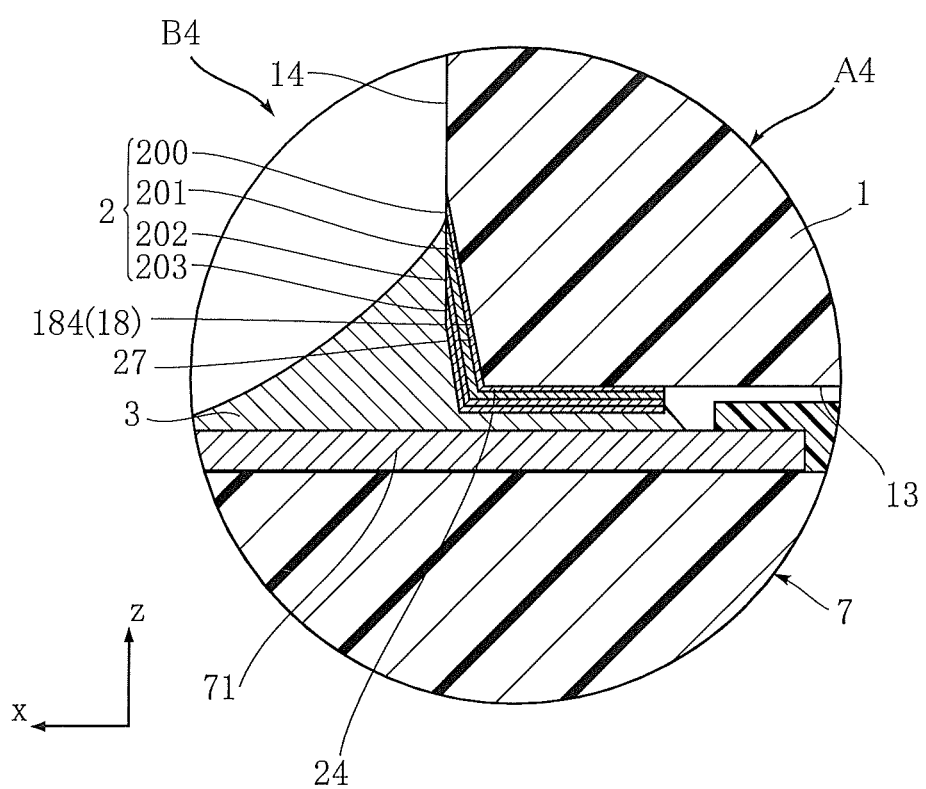
FIG. 87 is an enlarged cross-sectional view showing a main section of a modification of the light-emitting module based on the fourth embodiment of the present invention.

FIGS. 24 to 87 show modifications and other embodiments of the present invention. Note that, in these diagrams, the same reference numerals as the above embodiment are given to elements that are the same as or similar to those of the above embodiment.

FIGS. 24 to 30 show modifications of the light-emitting module A1 and the light-emitting device B1.

FIGS. 24 to 27 show modifications regarding the mounting recesses 17 and the mounting-surface electrodes 24. In the modification shown in FIG. 24, the mounting recesses 17 have a mounting recess upper surface 171, a mounting recess side surface 172, and a mounting recess sloping surface 173. The mounting recess upper surface 171 faces downward in the z direction in the diagram. The mounting recess side surface 172 faces outward in the x direction. The mounting recess sloping surface 173 is interposed between the mounting recess upper surface 171 and the mounting recess side surface 172, and is connected to these surfaces. Also, the mounting recess sloping surface 173 slopes relative the x direction, or in other words, relative to the mounting recess upper surface 171 and the mounting recess side surface 172. The mounting-surface electrodes 24 cover these three surfaces, namely, the mounting recess upper surface 171, the mounting recess side surface 172 and the mounting recess sloping surface 173.

Figure 25:
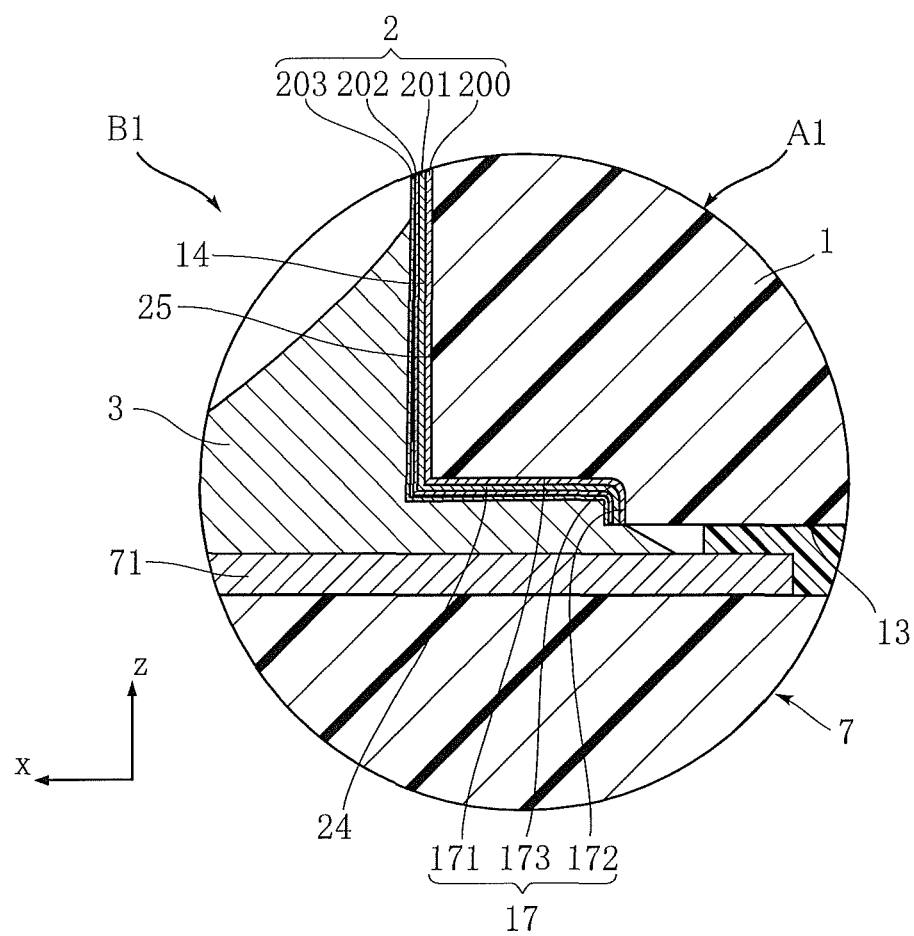
FIG. 25 is an enlarged cross-sectional view showing a main section of a modification of the light-emitting module based on the first embodiment of the present invention.

In the modification shown in FIG. 25, the mounting recesses 17 have a mounting recess upper surface 171, a mounting recess side surface 172, and a mounting recess sloping surface 173. The mounting recess sloping surface 173 is configured as a curved surface.

Figure 26:
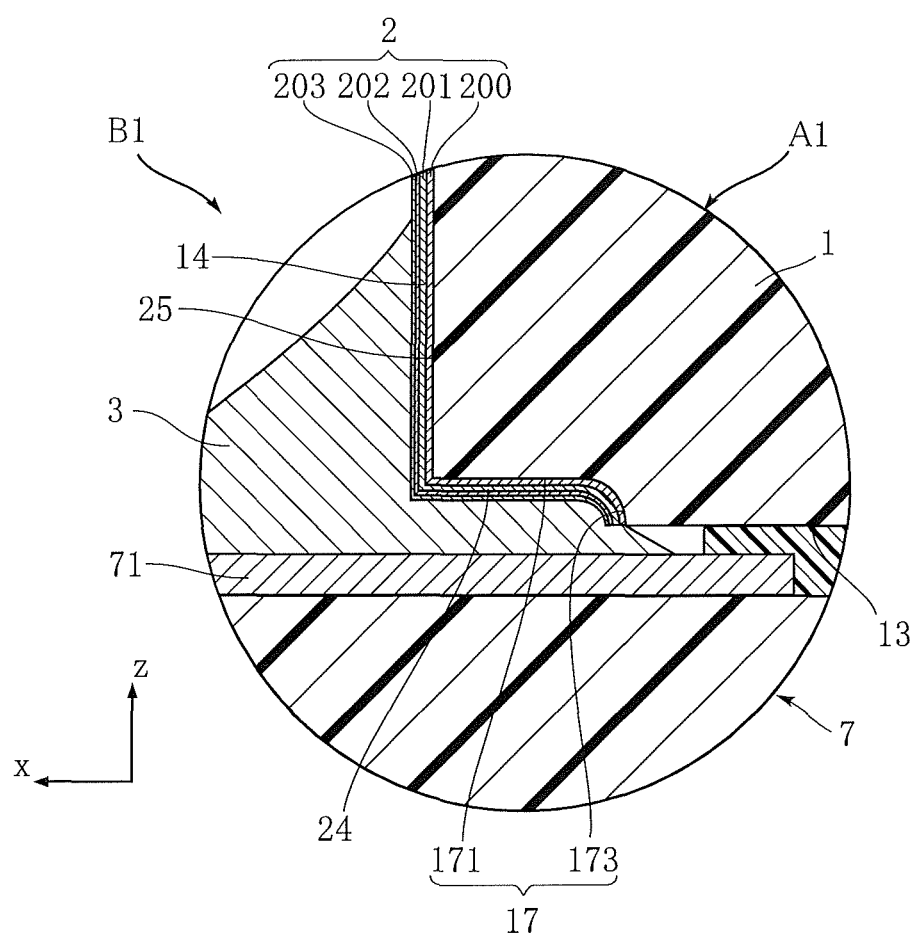
FIG. 26 is an enlarged cross-sectional view showing a main section of a modification of the light-emitting module based on the first embodiment of the present invention.

In the modification shown in FIG. 26, the mounting recesses 17 have a mounting recess upper surface 171 and a mounting recess sloping surface 173. The mounting recess sloping surface 173 is interposed between the mounting recess upper surface 171 and the mounting surface 13, and is connected to these surfaces. The mounting recess sloping surface 173 slopes relative to the x direction, or in other words, relative to the mounting recess upper surface 171 and the mounting surface 13. Furthermore, in this modification, the mounting recess sloping surface 173 is configured as a curved surface.

Figure 27:
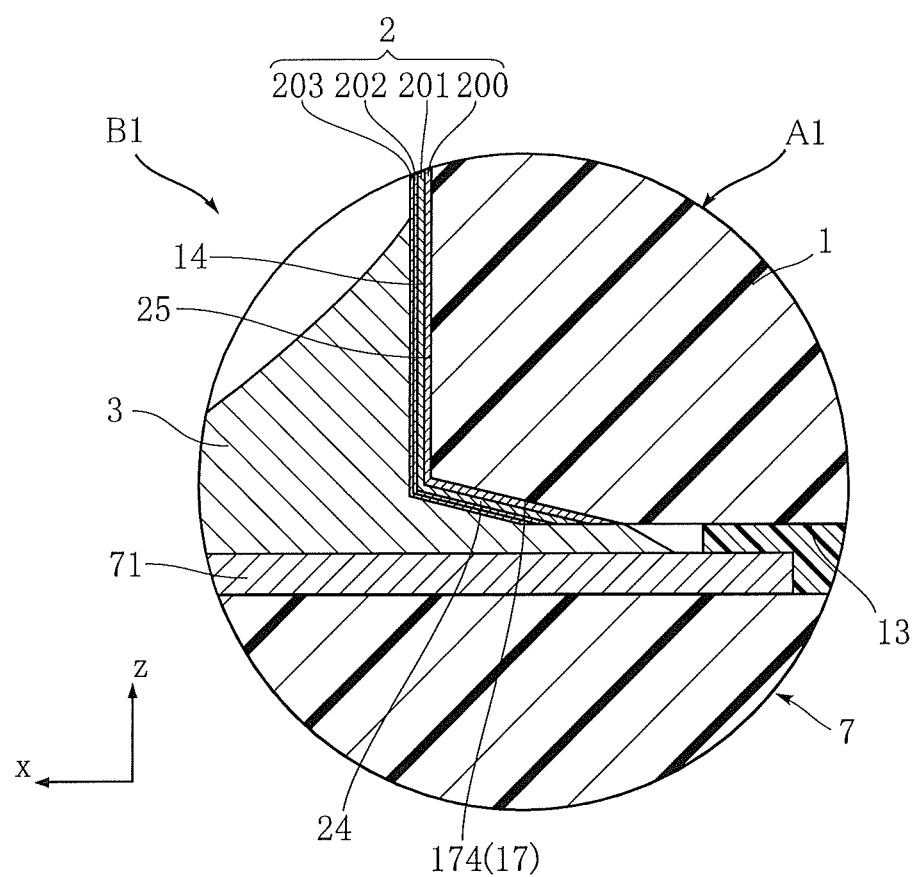
FIG. 27 is an enlarged cross-sectional view showing a main section of a modification of the light-emitting module based on the first embodiment of the present invention.

In the modification shown in FIG. 27, the mounting recesses 17 only have a mounting recess sloping upper surface 174. The mounting recess sloping upper surface 174 is connected to the side surface 14 and the mounting surface 13. The mounting recess sloping upper surface 174 slopes so as to be spaced further inward from the mounting surface 13 in the z direction as the distance from the mounting surface 13 increases in the x direction.

Figure 28:
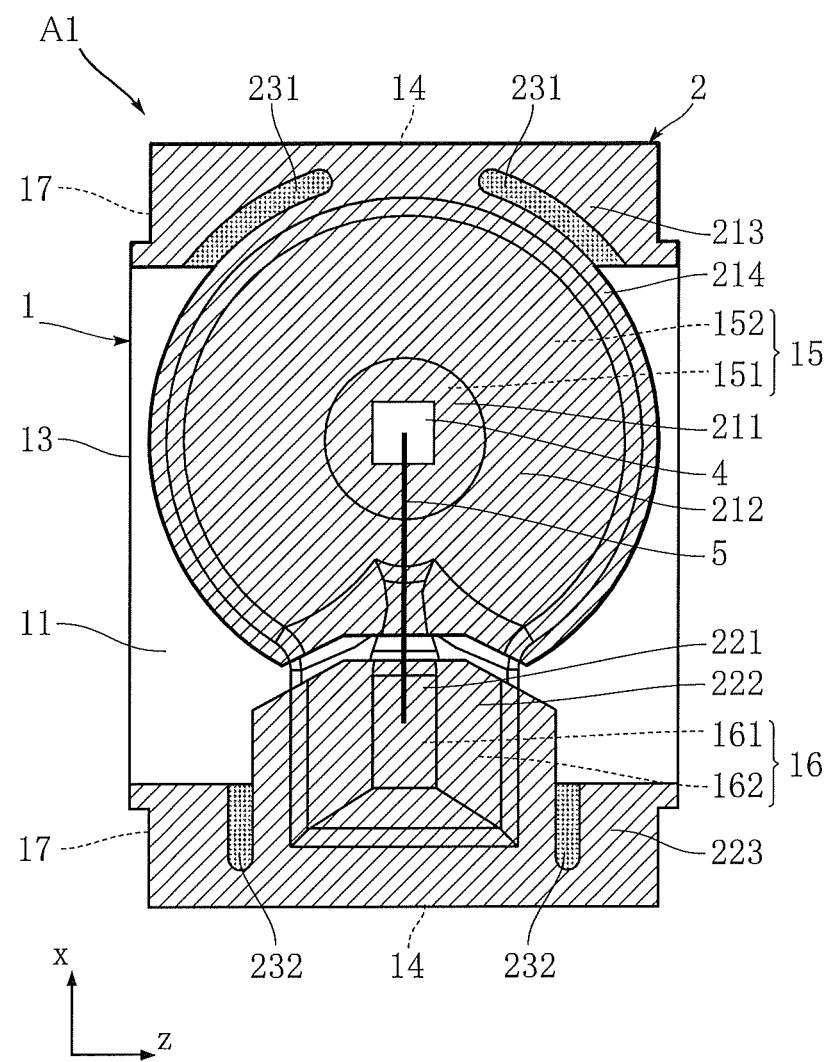
FIG. 28 is a front view showing a main section of a modification of the light-emitting module based on the first embodiment of the present invention.
Figure 29:
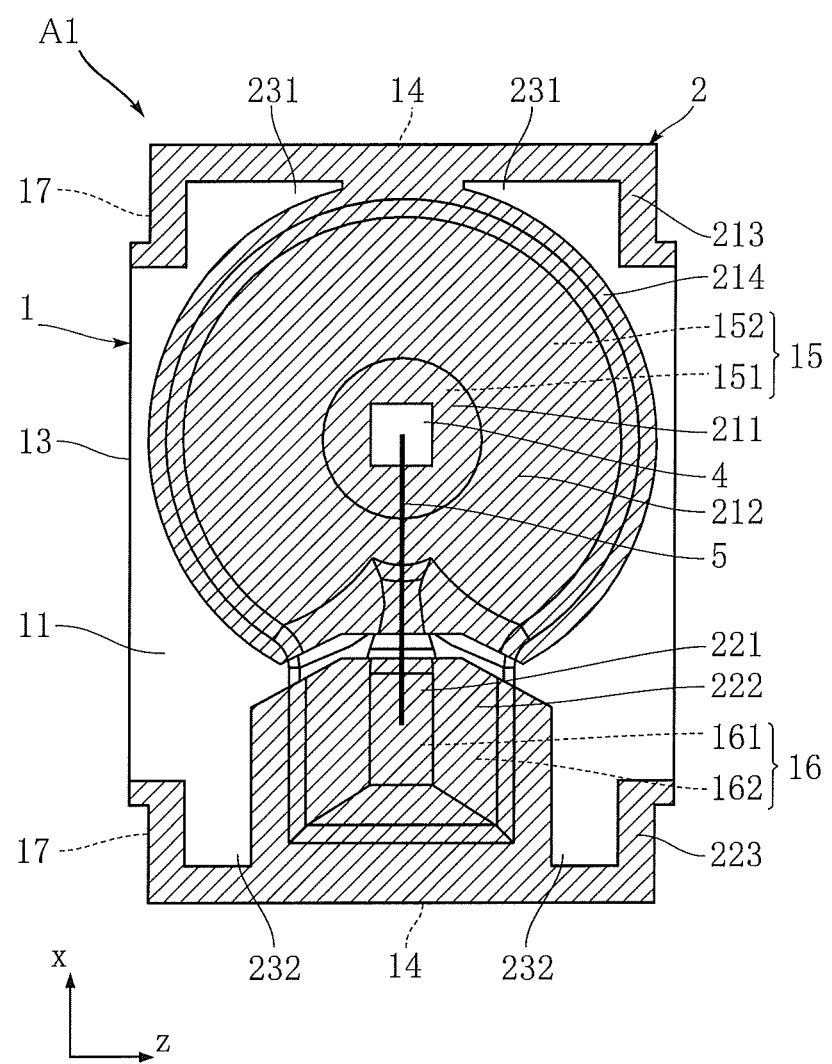
FIG. 29 is a front view showing a main section of a modification of the light-emitting module based on the first embodiment of the present invention.

In the modifications shown in FIGS. 28 and 29, a first solder prevention portion 231 and a second solder prevention portion 232 are formed in the wiring pattern 2.

In the modification shown in FIG. 28, two first solder prevention portions 231 and two second solder prevention portions 232 are provided. The first solder prevention portions 231 are provided in the first connecting portion 213, and are located between the first accommodating recess 15 and the mounting recesses 17. More specifically, the first solder prevention portions 231 are configured in an arched band along the outer circle of the first accommodating recess 15. Also, the first solder prevention portions 231 are formed by exposing a part of the second layer 202 from the third layer 203 in the first connecting portion 213. An exemplary technique for exposing the second layer 202 involves forming the third layer 203 (third layer 203A), and then using a laser to selectively remove only the third layer 203 (third layer 203A). The first solder prevention portions 231 thus formed have a lower wettability to solder than portions of the first connecting portion 213 other than the first solder prevention portions 231.

The second solder prevention portions 232 are provided in the second connecting portion 223, and are located between the second accommodating recess 16 and the mounting recesses 17. More specifically, the second solder prevention portions 232 are configured as straight bands along the outer sides of the second accommodating recess 16. Also, the second solder prevention portions 232 are formed by exposing a part of the second layer 202 from the third layer 203 in the second connecting portion 223. An exemplary technique for exposing the second layer 202 involves forming the third layer 203 (third layer 203A), and then using a laser to selectively removing only the third layer 203 (third layer 203A). The second solder prevention portions 232 thus formed have a lower wettability to solder than portions of the second connecting portion 223 other than the second solder prevention portions 232.

In the modification shown in FIG. 29, the first solder prevention portions 231 are formed by exposing the top surface 11 of the base 1 from the first connecting portion 213. Although the first solder prevention portions 231 are surrounded by the first connecting portion 213 in such a configuration, the first solder prevention portions 231 are taken in the present invention as being formed in the first connecting portion 213, given that the first solder prevention portions 231 are defined by the existence of the first connecting portion 213. In such a configuration, the first solder prevention portions 231 similarly have a lower wettability to solder than portions of the first connecting portion 213 other than the first solder prevention portions 231.

The second solder prevention portions 232 are formed by exposing the top surface 11 of the base 1 from the second connecting portion 223. Although the second solder prevention portions 232 are surrounded by the second connecting portion 223 in such a configuration, the second solder prevention portions 232 are taken in the present invention as being formed in the second connecting portion 223, given that the second solder prevention portions 232 are defined by the existence of the second connecting portion 223. In such a configuration, the second solder prevention portions 232 similarly have a lower wettability to solder than portions of the second connecting portion 223 other than the second solder prevention portions 232.

According to these modifications, as a result of the first solder prevention portions 231 and the second solder prevention portions 232 being provided, the melted solder 3 can be prevented from running into the first accommodating recess 15 or the second accommodating recess 16 by the first solder prevention portions 231 and the second solder prevention portions 232, when mounting the light-emitting module A1 on the mounting board 7.

Figure 30:
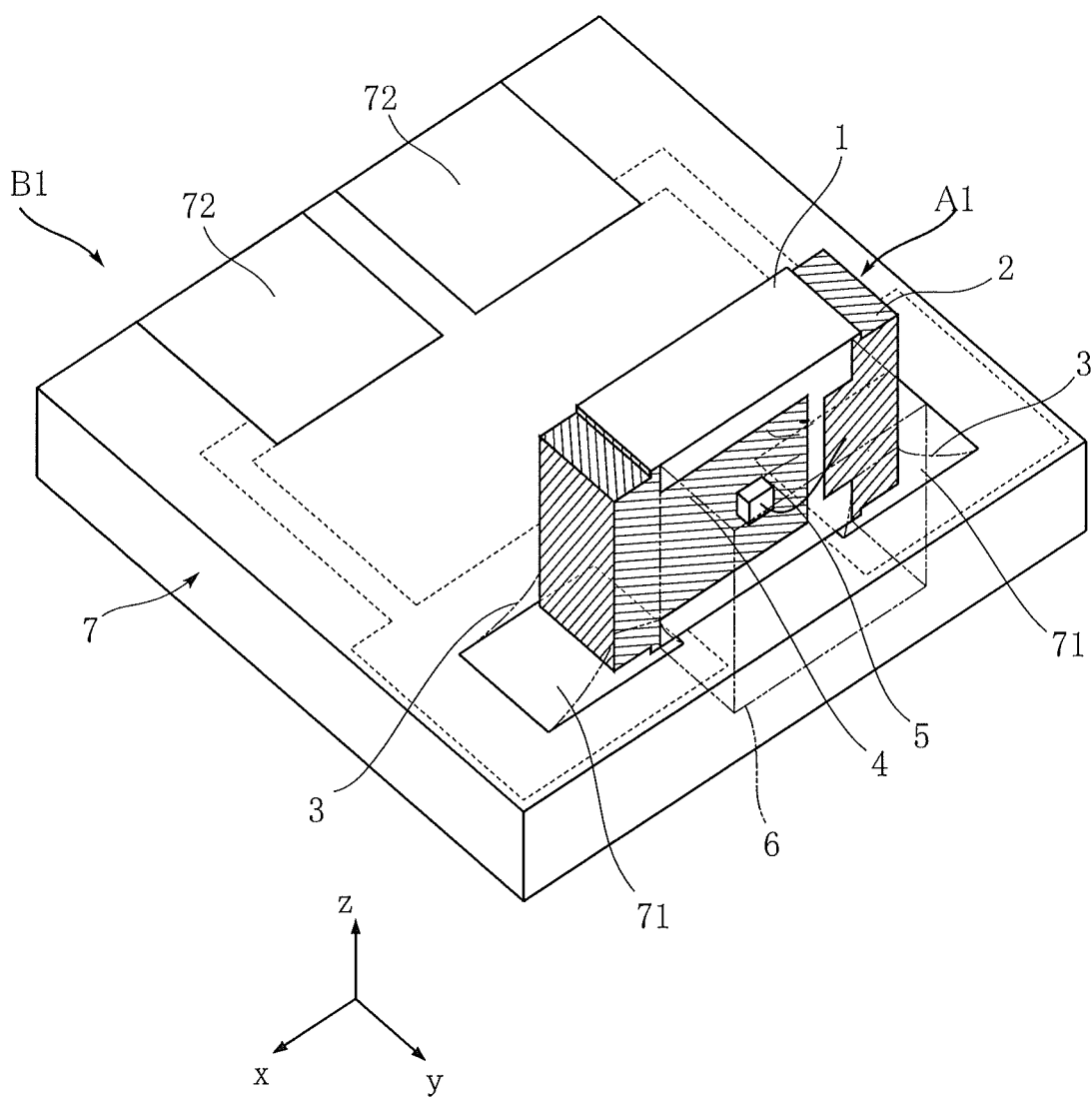
FIG. 30 is a perspective view showing a modification of the light-emitting module and the light-emitting device based on the first embodiment of the present invention.
Figure 31:
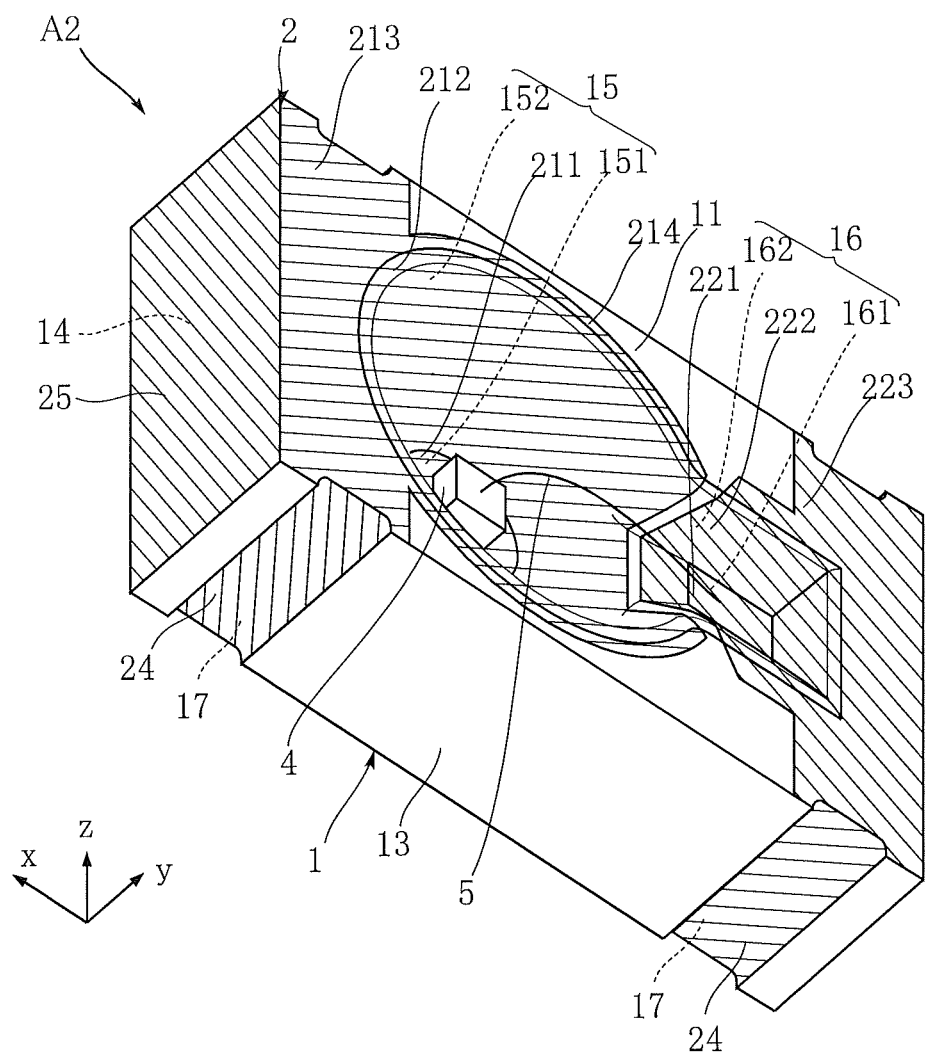
FIG. 31 is a perspective view showing a main section of a light-emitting module based on a second embodiment of the present invention.
Figure 32:
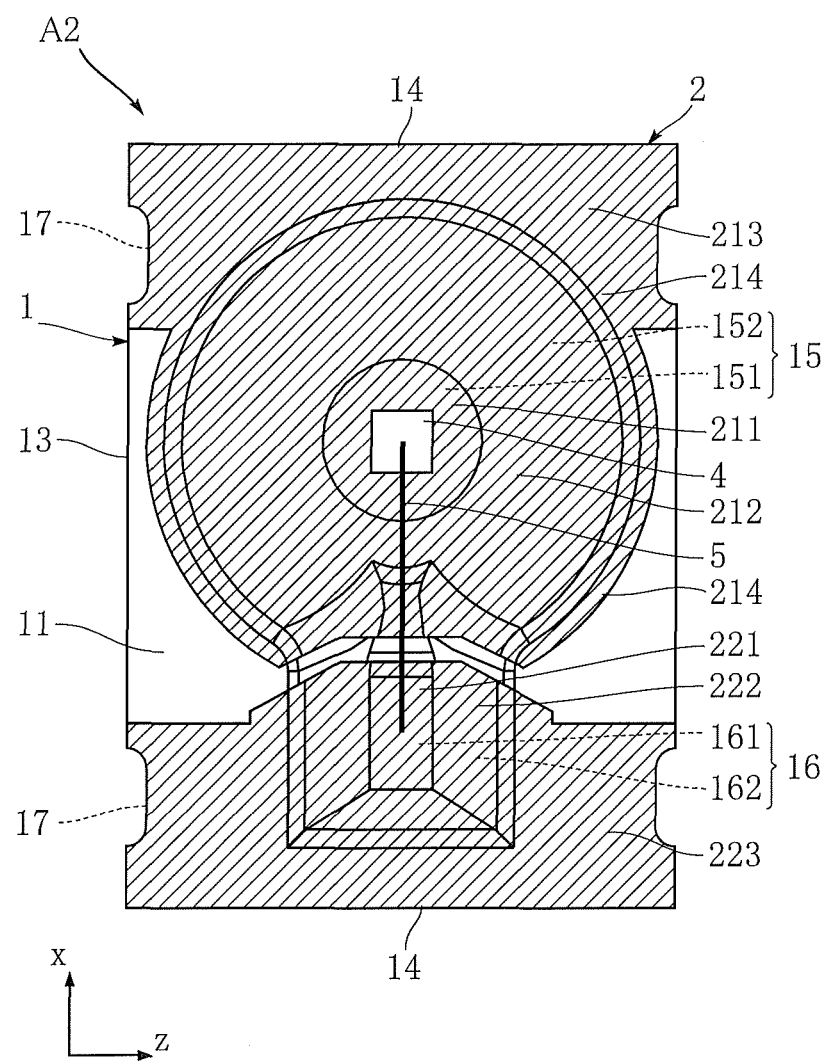
FIG. 32 is a front view showing a main section of the light-emitting module of FIG. 31.
Figure 33:
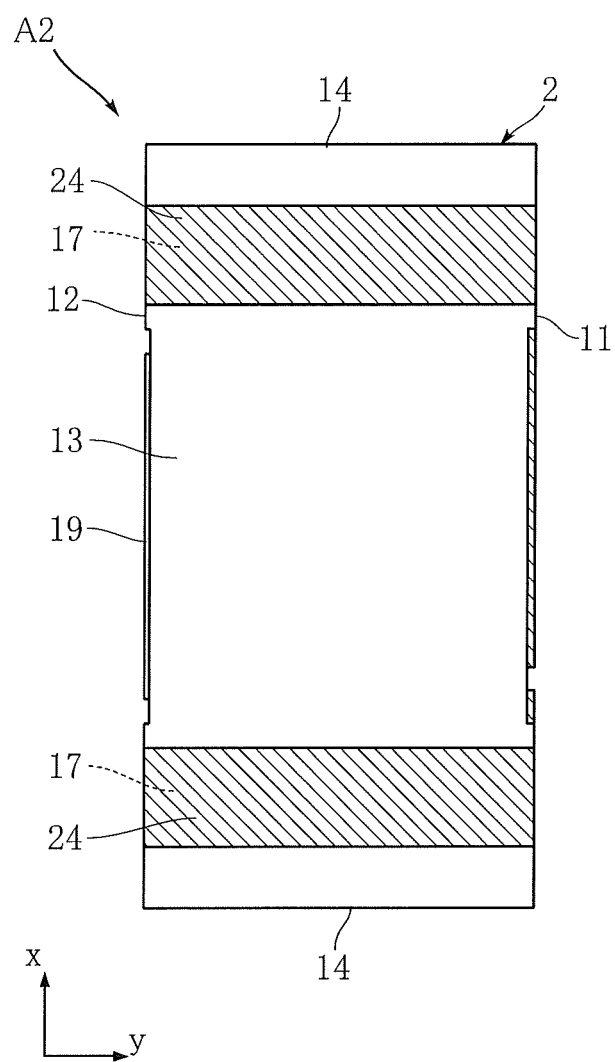
FIG. 33 is a bottom view showing the light-emitting module of FIG. 31.
Figure 34:
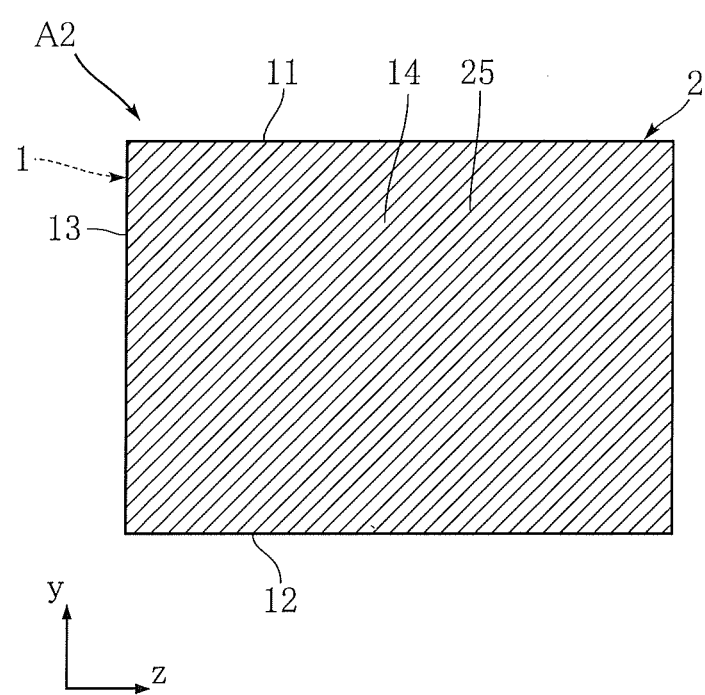
FIG. 34 is a side view showing the light-emitting module of FIG. 31.
Figure 35:
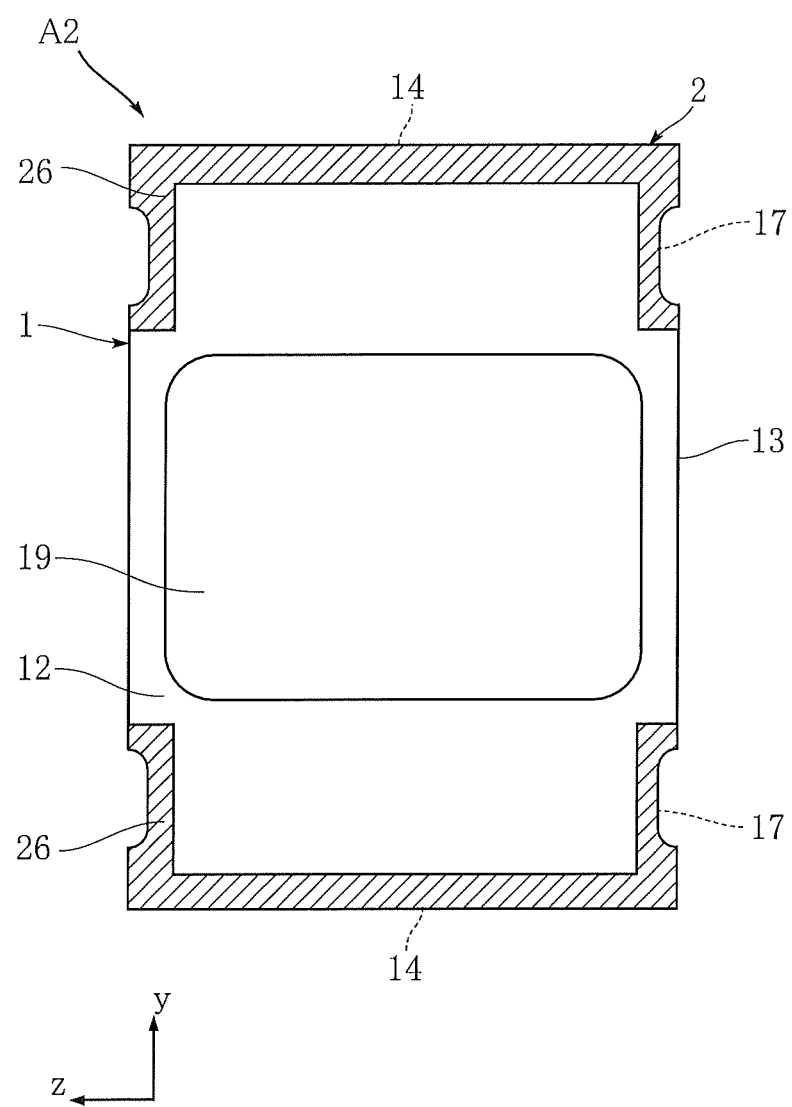
FIG. 35 is a rear view showing the light-emitting module of FIG. 31.

FIG. 30 shows a light-emitting module A1 as a modification regarding the base 1, the wiring pattern 2 and the translucent resin 6 and a light-emitting device B1 in which this light-emitting module A1 is installed. In this modification, a first accommodating recess 15 and a second accommodating recess 16 are not formed on the base 1. The light-emitting element 4 is installed on the top surface 11. The wiring pattern 2 is formed so as to cover appropriate parts of the top surface 11. The translucent resin 6 covers the light-emitting element 4 on the top surface 11, and projects from the top surface 11.

Figure 36:
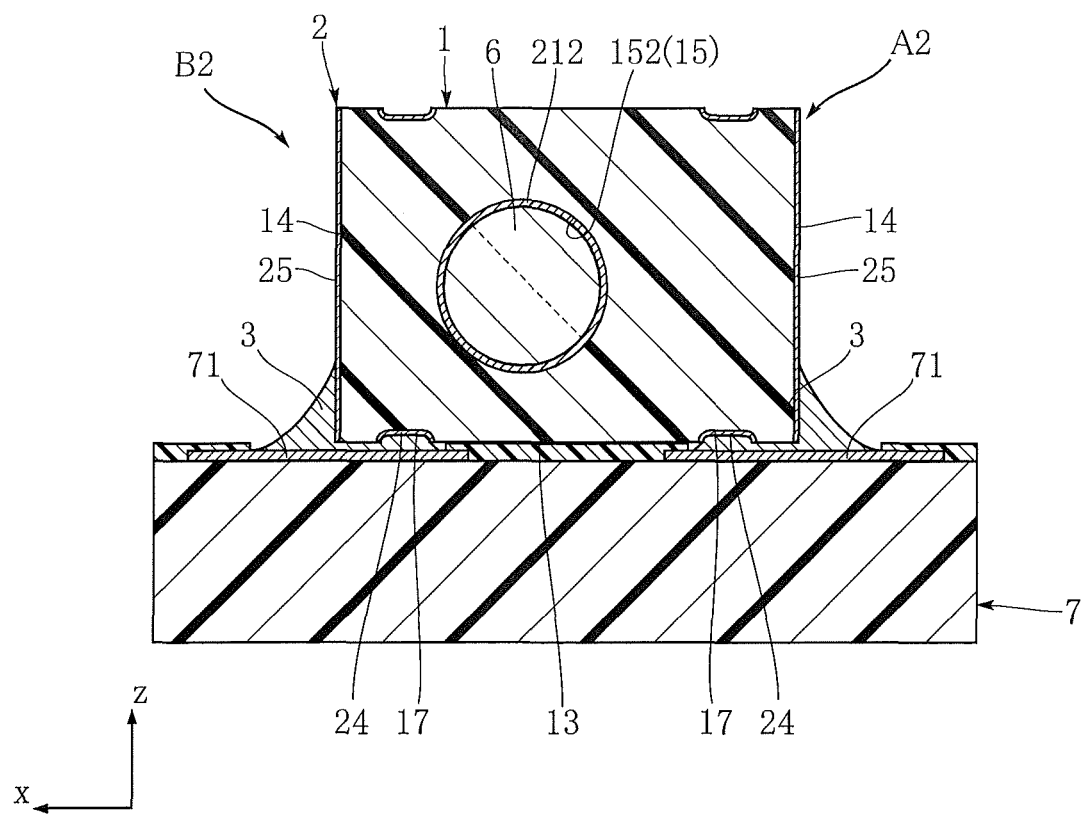
FIG. 36 is a cross-sectional view showing the light-emitting device based on the second embodiment of the present invention.
Figure 37:
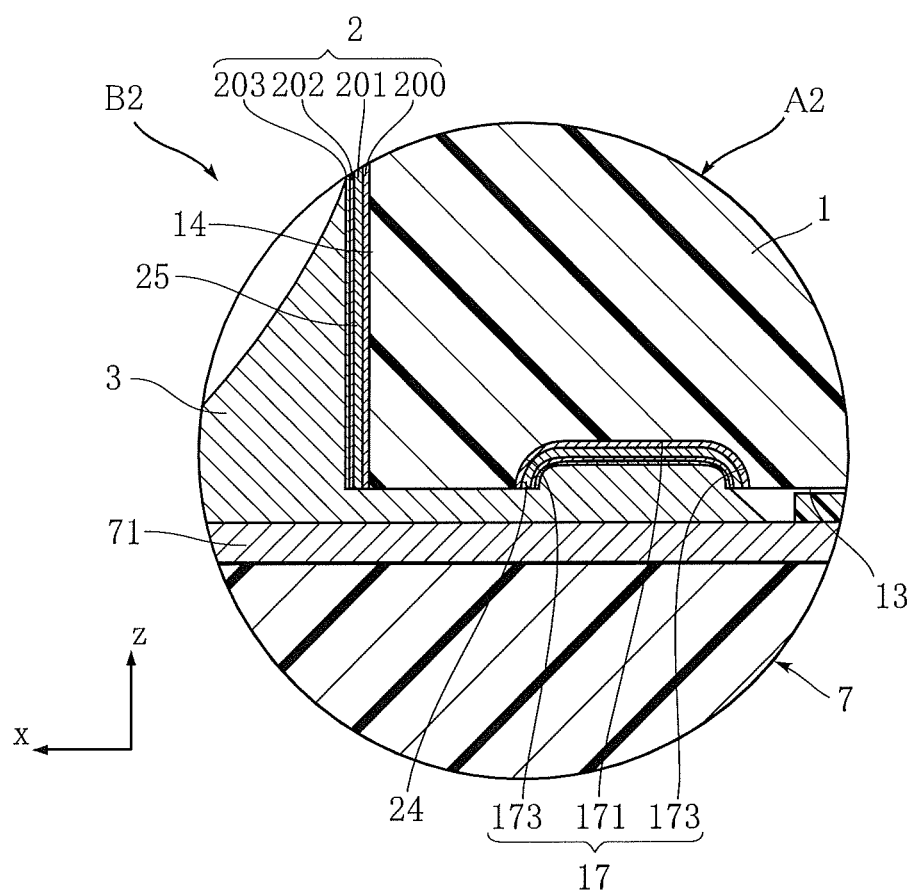
FIG. 37 is an enlarged cross-sectional view showing a main section of the light-emitting device and the light-emitting module based on the second embodiment of the present invention.

FIGS. 31 to 35 show a light-emitting module based on a second embodiment of the present invention. FIGS. 36 and 37 show a light-emitting device based on the second embodiment of the present invention. The light-emitting module A2 of the present embodiment mainly differs from the abovementioned light-emitting module A1 in the configuration of the mounting recesses 17.

In the present embodiment, the mounting recesses 17 have a closed shape on both sides in the x direction. According to such a configuration, in the present embodiment, the mounting surface 13 is partitioned into three regions aligned in the x direction with the pair of mounting recesses 17 sandwiched therebetween.

Specifically, as shown in FIG. 37, the mounting recesses 17 have a mounting recess upper surface 171 and a pair of mounting recess sloping surfaces 173. The mounting recess upper surface 171 faces downward in the z direction. The pair of mounting recess sloping surfaces 173 are respectively connected to a different end of the mounting recess upper surface 171 in the x direction. Each mounting recess sloping surface 173 is interposed between the mounting recess upper surface 171 and the mounting surface 13, and slopes relative to the x direction. Furthermore, each mounting recess sloping surface 173 is configured as a curved surface.

The mounting-surface electrodes 24 cover at least a part of the mounting recesses 17, and, in the present embodiment, cover the whole of the mounting recesses 17. The mounting-surface electrodes 24 are not connected in the side-surface electrodes 25.

Next, a method of making the light-emitting module A2 will be described below, with reference to FIGS. 38 and 39.

Figure 38:
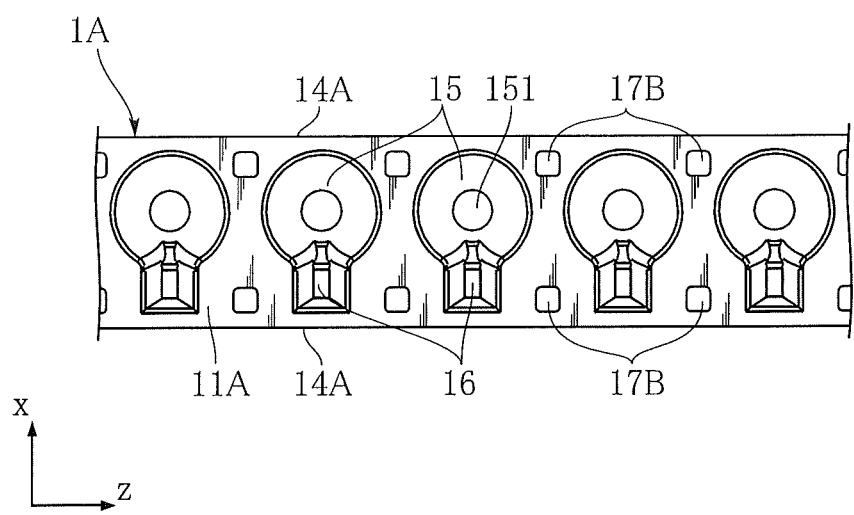
FIG. 38 is a front view showing a main section of a method of making the light-emitting module of FIG. 31.
Figure 39:
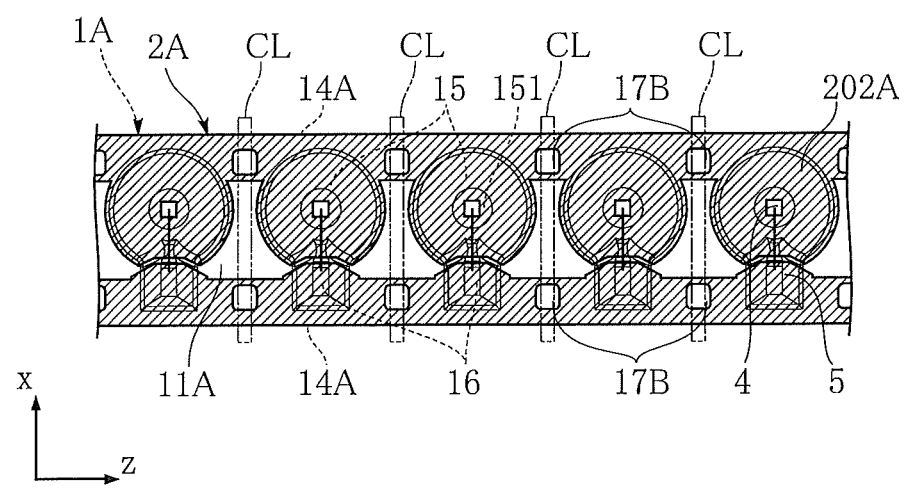
FIG. 39 is a front view showing a main section of the method of making the light-emitting module of FIG. 31.

First a base material 1A such shown in FIG. 38 is prepared. Instead of the plural pairs of preliminary recesses 17A in the method of making the light-emitting module A1, the base material 1A has plural pairs of through holes 17B formed therein. The positions of the pairs of through holes 17B coincide with each other in the z direction, and each pair consists of two through holes 17B spaced from each other in the x direction. Each through hole 17B is provided in a position slightly spaced inwardly from the side surface 14A in the x direction, and passes through the base material 1A in the y direction. Each pair of through holes 17B is arranged between structures consisting of the first accommodating recess 15 and the second accommodating recess 16 adjacent in the z direction, that is, between the first bottom surfaces 151 adjacent in the z direction.

The processes described with reference to FIGS. 13 to 22 are sequentially performed on this base material 1A. The state shown in FIG. 39 is then obtained by completing the installation of a plurality of light-emitting elements 4, the bonding of a plurality of wires 5, and the formation of translucent resin 6 (not shown). Thereafter, the base material 1A is cut by a dicing blade, for example, along a plurality of cutting lines CL shown in FIG. 39. The cutting lines CL are respectively included in an xy plane and pass through pairs of through holes 17B in the x direction. As a result of this cutting, portions of the through hole 17B on both sides of the cutting lines CL in the z direction are separated and form the mounting recesses 17 shown in FIGS. 31 to 37. Also, the conductor layer 2A consisting of the base layer 200A, the first layer 201A, the second layer 202A and the third layer 203A forms a plurality of wiring patterns 2 consisting of a base layer 200, a first layer 201, a second layer 202, and a third layer 203. As a result of completing the above processes, a plurality of light-emitting modules A2 are obtained.

Next, the working of the light-emitting module A2 and the light-emitting device B2 will be described.

According to the present embodiment, the light-emitting module A2 can similarly be suitably mounted. The mounting recesses 17 are connected to the mounting surface 13 at the two ends in the x direction. The mounting-surface electrodes 24 cover the whole of these mounting recesses 17. When mounting the light-emitting module A2 on the mounting board 7, the melted solder 3 can thus be expected to spread from at least one of the two ends of the mounting-surface electrodes 24 in the x direction to the whole area of the mounting-surface electrodes 24.

FIGS. 40 to 43 show modifications of the light-emitting module A2 and the light-emitting device B2.

Figure 40:
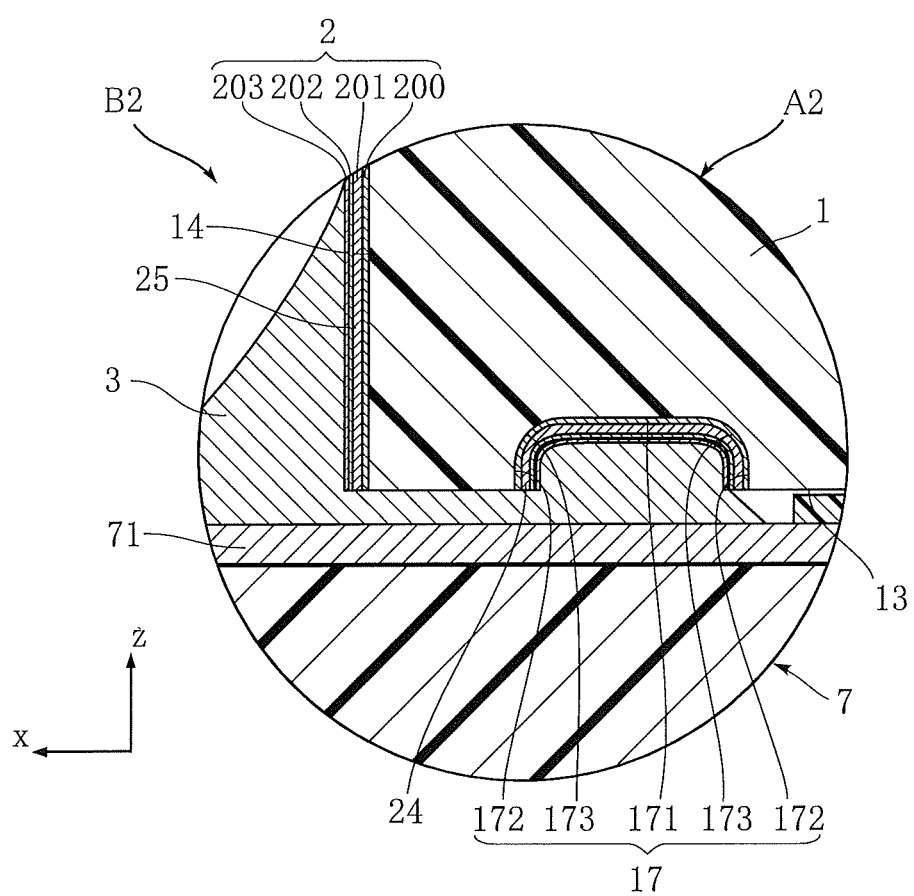
FIG. 40 is an enlarged cross-sectional view showing a main section of a modification of the light-emitting module based on the second embodiment of the present invention.

In the modification shown in FIG. 40, the mounting recesses 17 have a mounting recess upper surface 171, a pair of mounting recess side surfaces 172, and a pair of mounting recess sloping surfaces 173. The mounting recess upper surface 171 faces downward in the z direction in the diagram. The pair of mounting recess side surfaces 172 face each other in the x direction. The pair of mounting recess sloping surfaces 173 are respectively interposed between the mounting recess upper surface 171 and the pair of mounting recess side surfaces 172, and are connected to these surfaces. Also, each mounting recess sloping surface 173 slopes relative to the x direction, or in other words, relative to the mounting recess upper surface 171 and the mounting recess side surfaces 172. Each mounting recess sloping surface 173 is configured as a curved surface. The mounting-surface electrodes 24 cover these five surfaces, namely, the mounting recess upper surface 171, the pair of mounting recess side surfaces 172, and the pair of mounting recess sloping surfaces 173.

Figure 41:
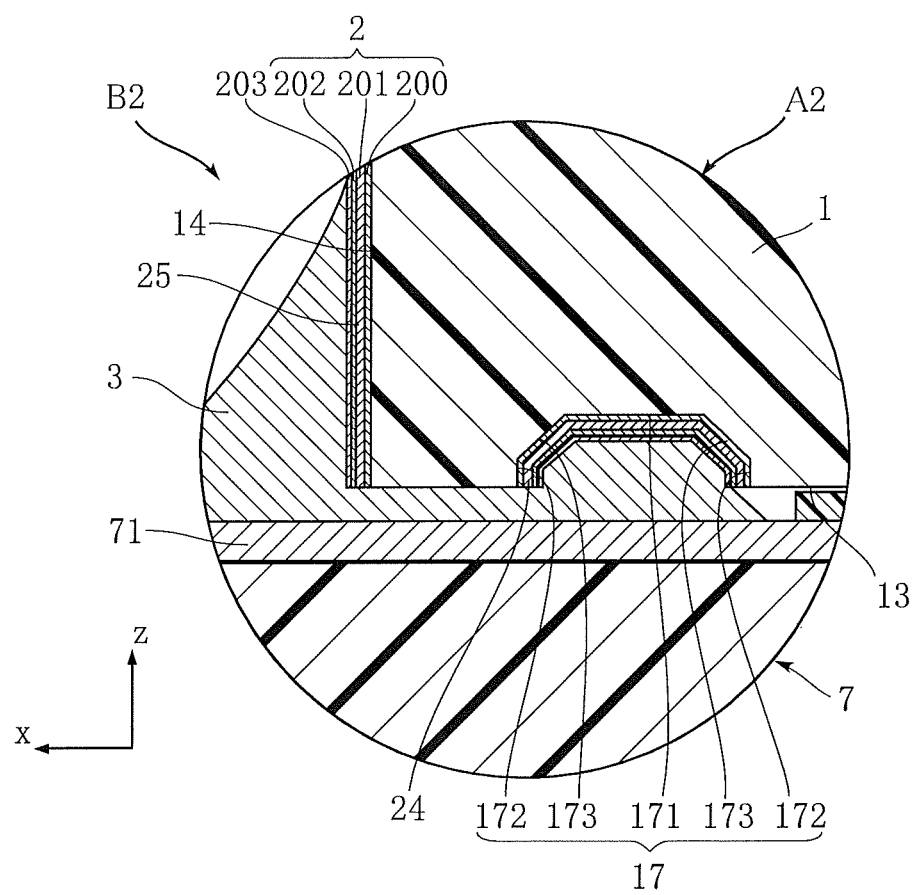
FIG. 41 is an enlarged cross-sectional view showing a main section of a modification of the light-emitting module based on the second embodiment of the present invention.

In the modification shown in FIG. 41, the mounting recesses 17 have a mounting recess upper surface 171, a pair of mounting recess side surfaces 172, and a pair of mounting recess sloping surfaces 173. The mounting recess sloping surfaces 173 are configured as planes.

Figure 42:
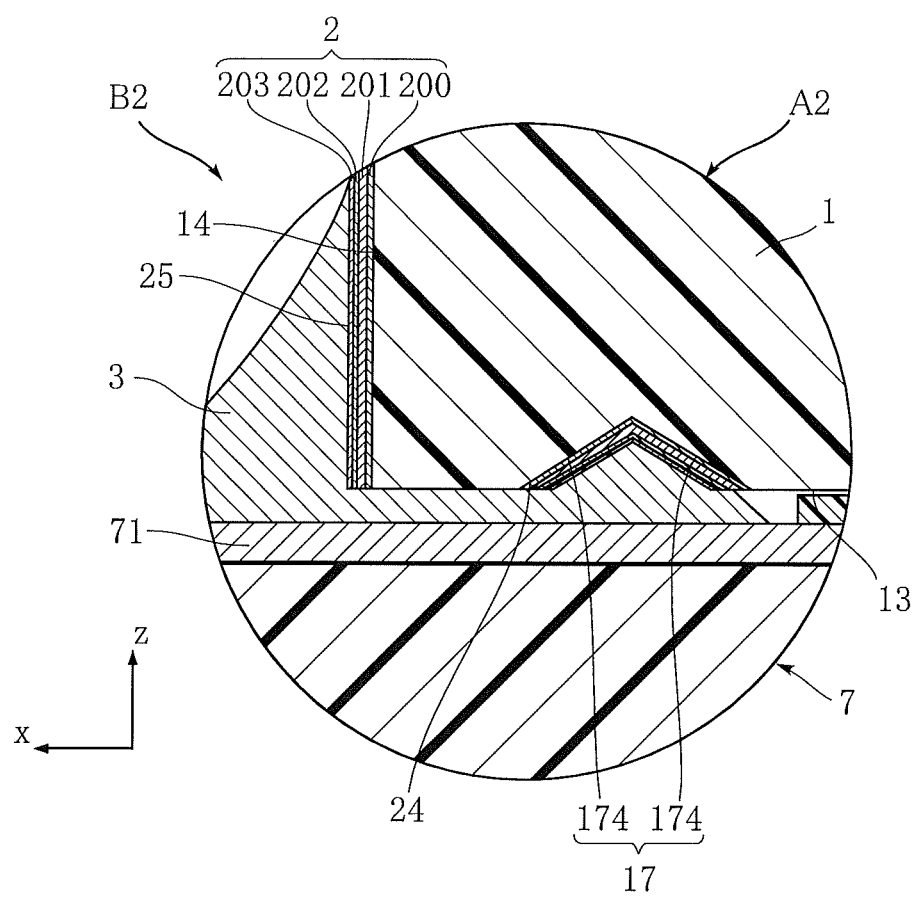
FIG. 42 is an enlarged cross-sectional view showing a main section of a modification of the light-emitting module based on the second embodiment of the present invention.

In the modification shown in FIG. 42, the mounting recesses 17 have a pair of mounting recess sloping upper surfaces 174. The pair of mounting recess sloping upper surfaces 174 are connected to each other at one end, and the other ends thereof are connected to the mounting surface 13. Each mounting recess sloping upper surface 174 slopes so as to be spaced further inward from the mounting surface 13 in the z direction as the distance from the mounting surface 13 increases in the x direction.

Figure 43:
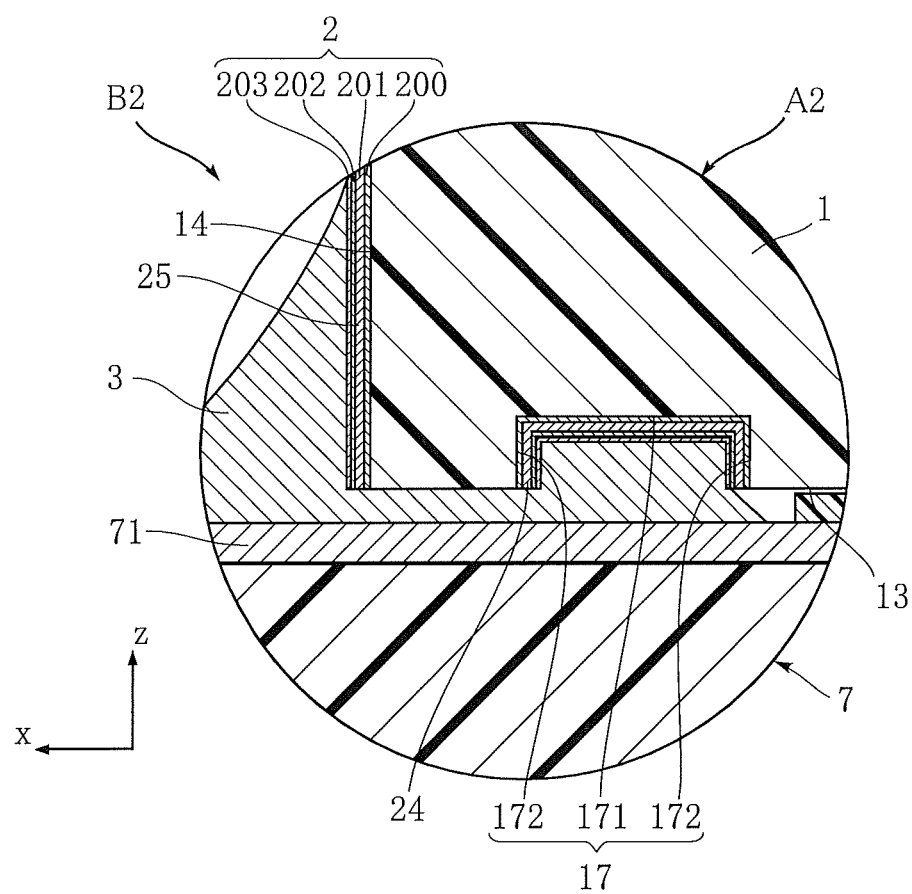
FIG. 43 is an enlarged cross-sectional view showing a main section of a modification of the light-emitting module based on the second embodiment of the present invention.

In the modification shown in FIG. 43, the mounting recesses 17 have a mounting recess upper surface 171 and a pair of mounting recess side surfaces 172. The mounting recess upper surface 171 faces downward in the z direction in the diagram. The pair of mounting recess side surfaces 172 are respectively connected to a different end of the mounting recess upper surface 171 in the x direction, and face each other in the x direction. Also, each mounting recess side surface 172 is connected to the mounting surface 13.

Note that the first solder prevention portions 231 and the second solder prevention portions 232 described with respect to the light-emitting module A1 may be employed in the light-emitting module A2 as appropriate. Also, the configuration of the base 1, the wiring pattern 2 and the translucent resin 6 shown in FIG. 30 may be employed in the light-emitting module A2 as appropriate.

FIGS. 44 to 50 show a light-emitting module based on a third embodiment of the present invention. The light-emitting module A3 of the present embodiment is provided with a base 1, a wiring pattern 2, a light-emitting element 4, a wire 5, and a translucent resin 6. FIGS. 51 to 54 show a light-emitting device that uses the light-emitting module A3. The light-emitting device B3 of the present embodiment is provided with the light-emitting module A3 and a mounting board 7.

Figure 44:
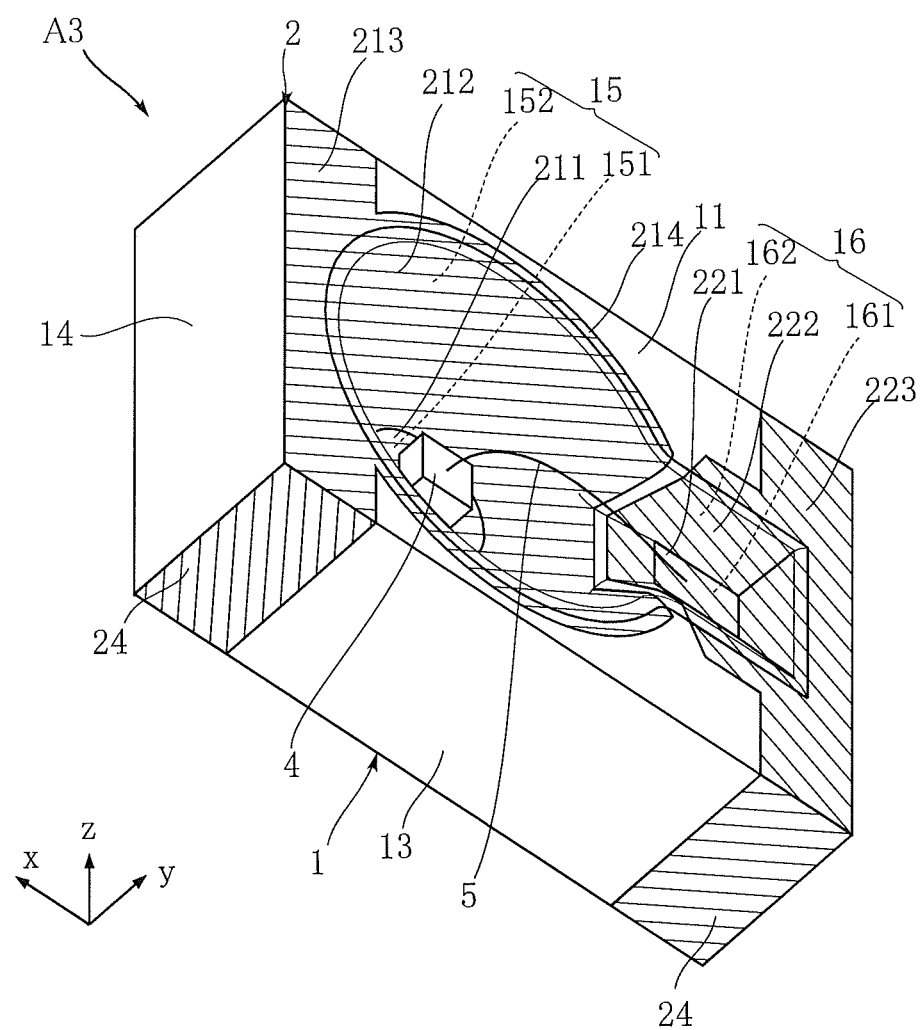
FIG. 44 is a perspective view showing a main section of a light-emitting module based on a third embodiment of the present invention.
Figure 45:
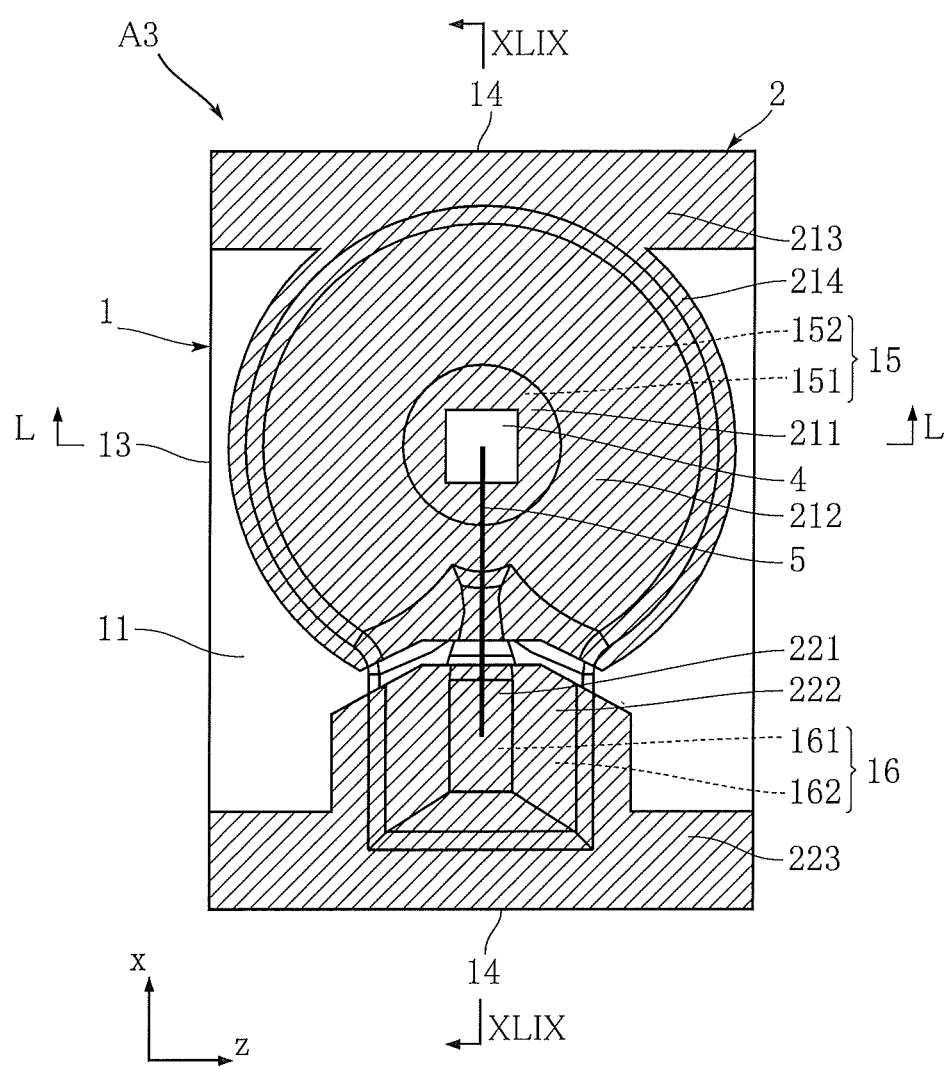
FIG. 45 is a front view showing a main section of the light-emitting module of FIG. 44.
Figure 46:
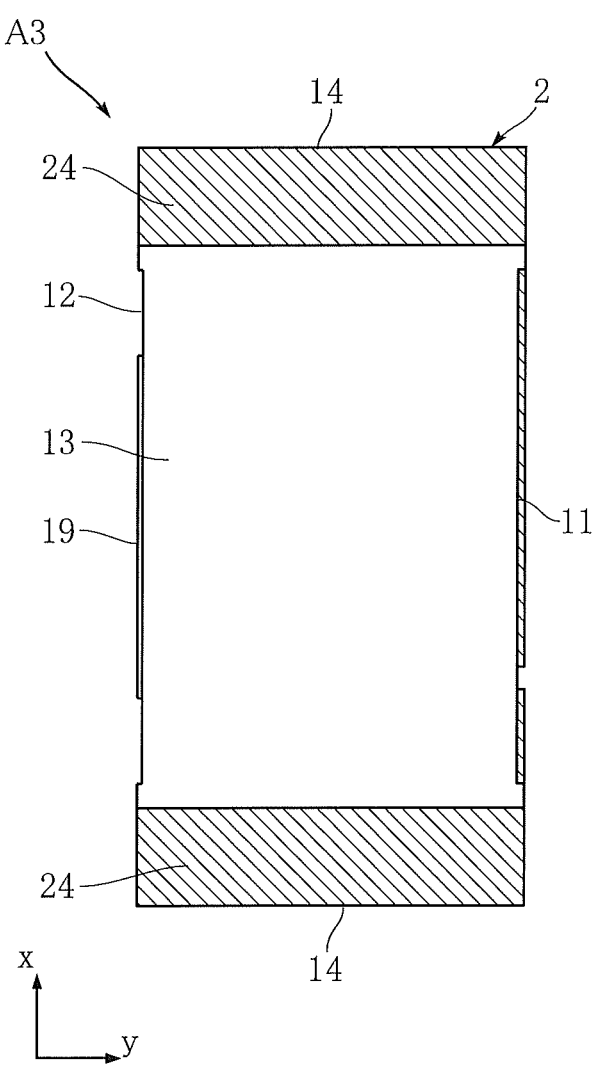
FIG. 46 is a bottom view showing the light-emitting module of FIG. 44.
Figure 47:
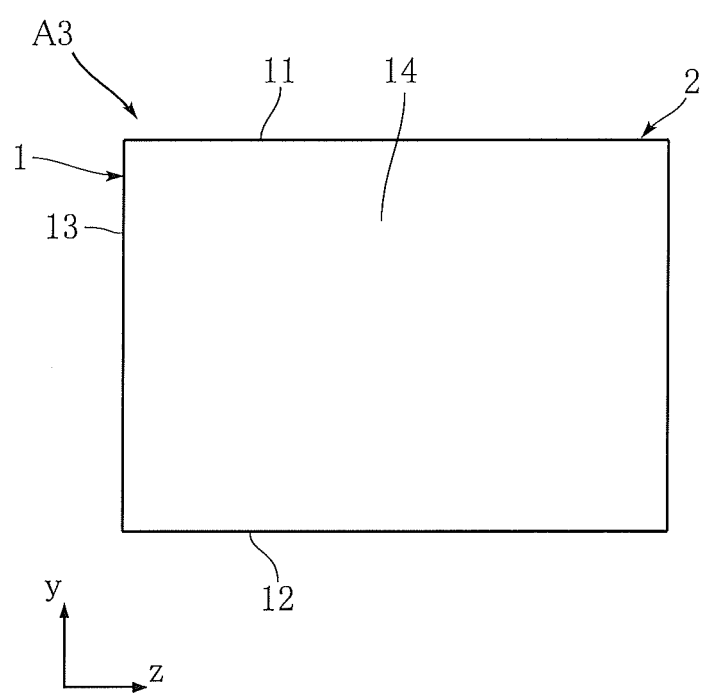
FIG. 47 is a side view showing the light-emitting module of FIG. 44.
Figure 48:
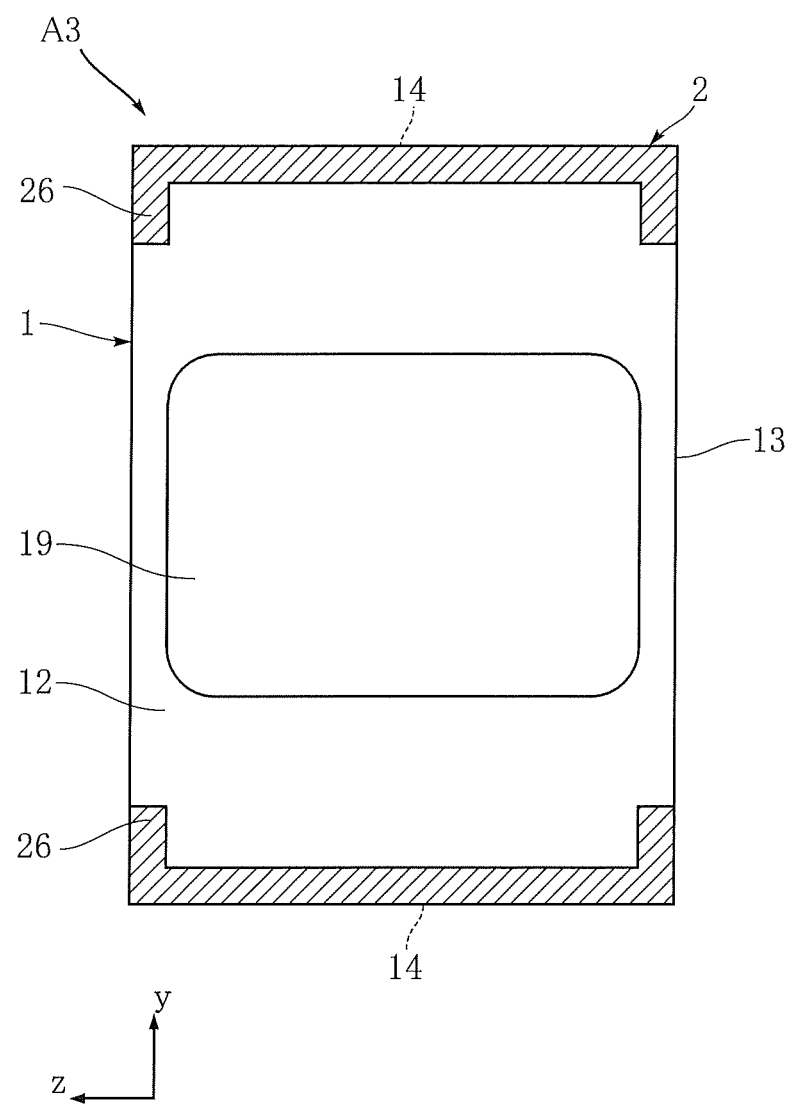
FIG. 48 is a rear view showing the light-emitting module of FIG. 44.
Figure 49:
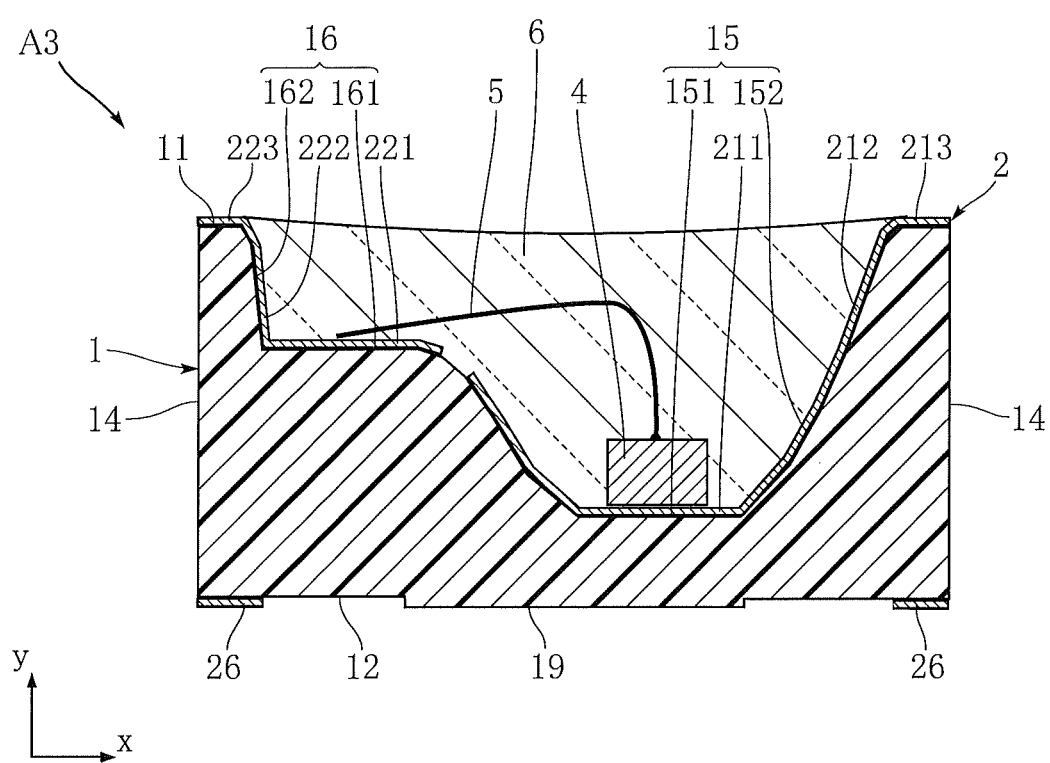
FIG. 49 is a cross-sectional view along a line XLIX-XLIX in FIG. 45.
Figure 50:
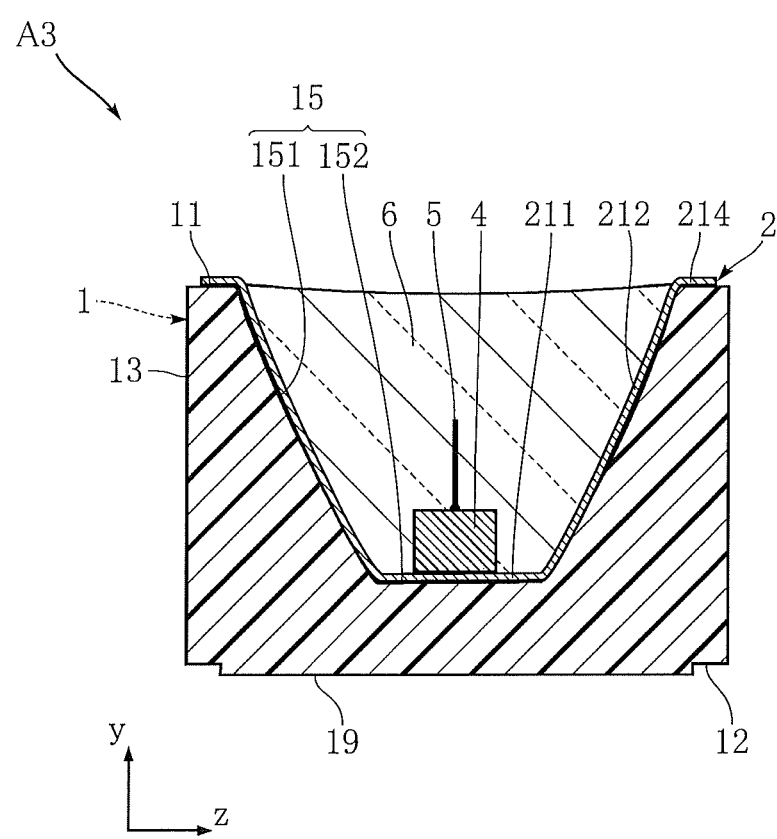
FIG. 50 is a cross-sectional view along a line L-L in FIG. 45.
Figure 51:
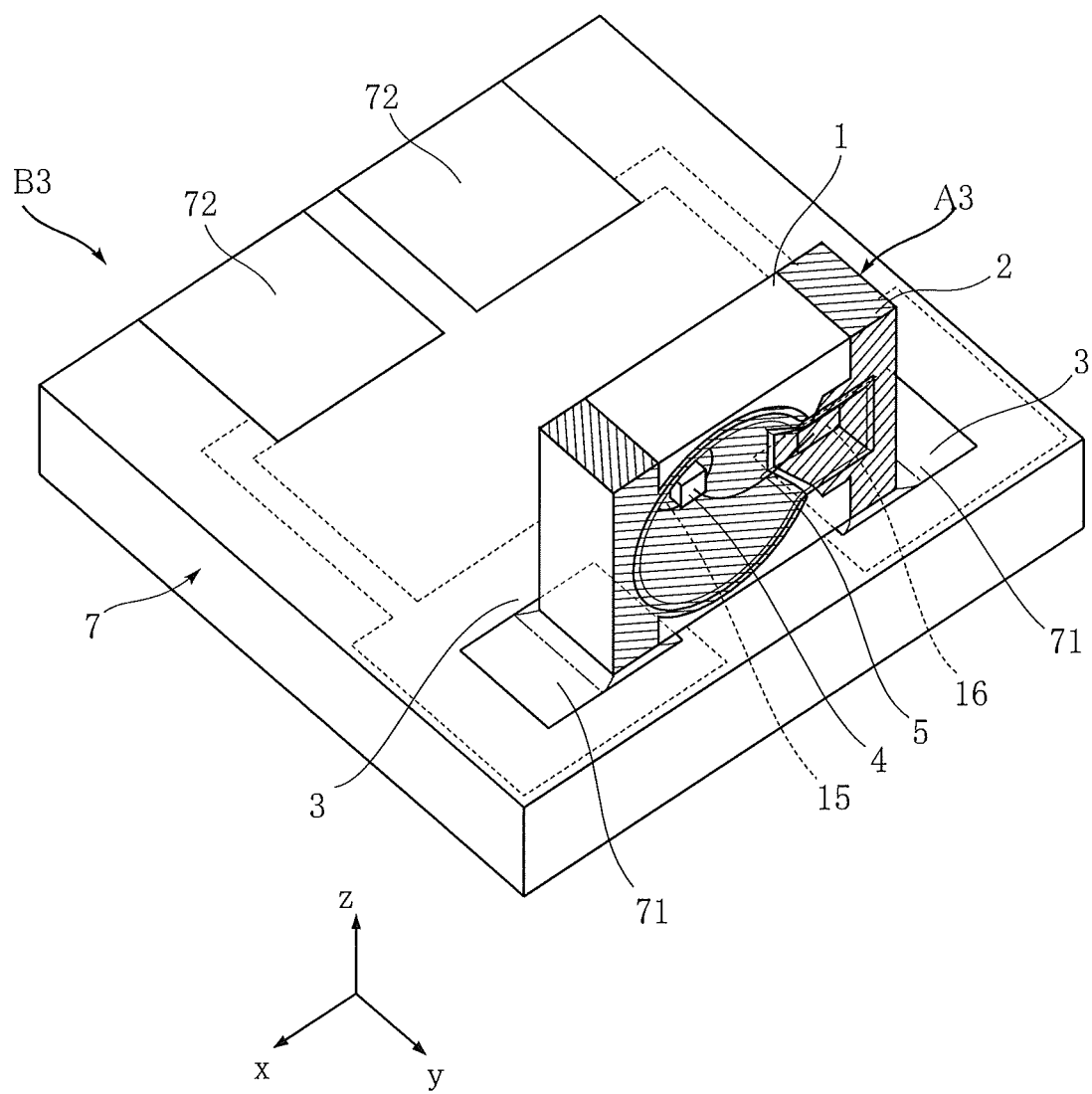
FIG. 51 is a perspective view showing a main section of a light-emitting device based on the third embodiment of the present invention.
Figure 52:
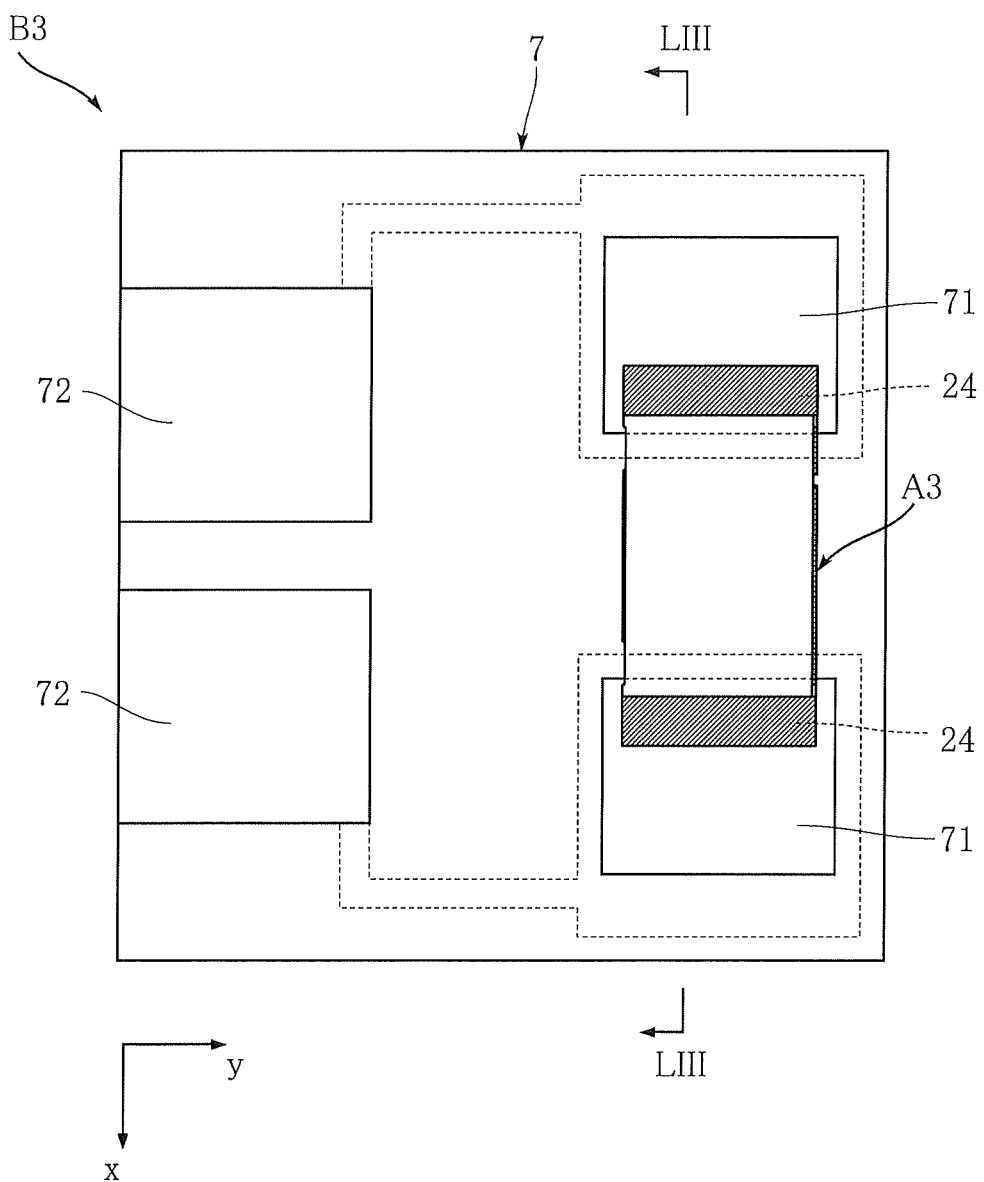
FIG. 52 is a plan view showing the light-emitting device of FIG. 51.
Figure 53:
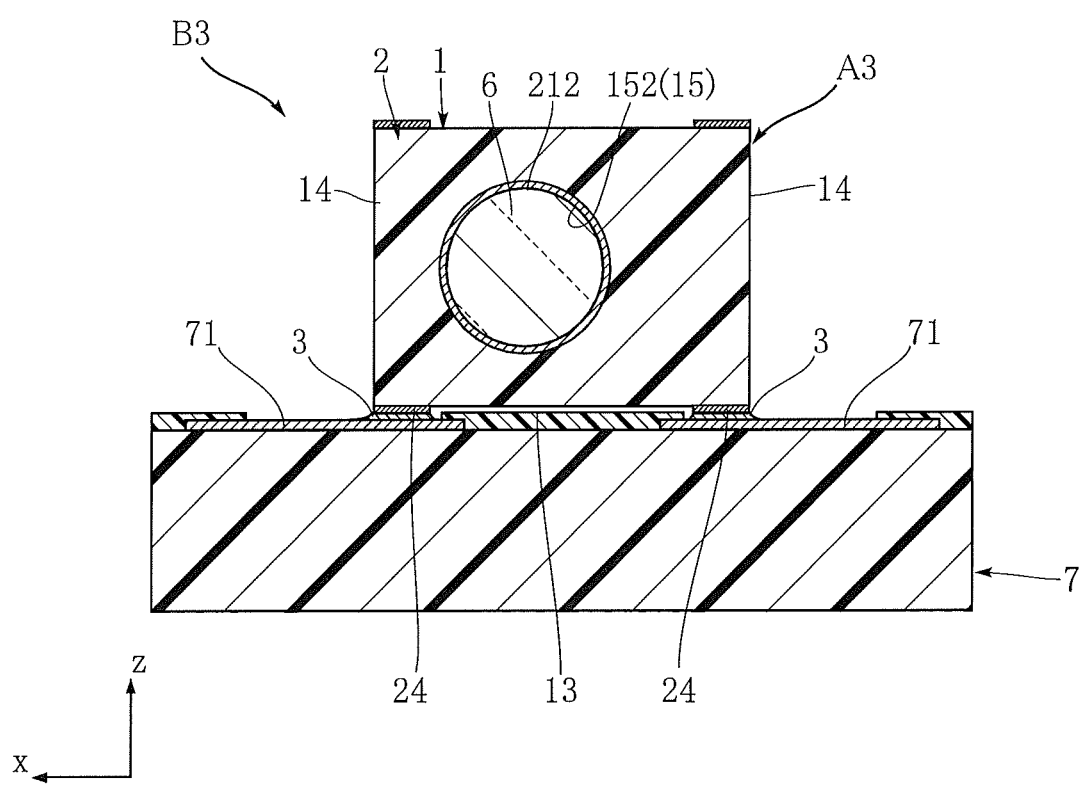
FIG. 53 is a cross-sectional view along a line LIII-LIII in FIG. 52.
Figure 54:
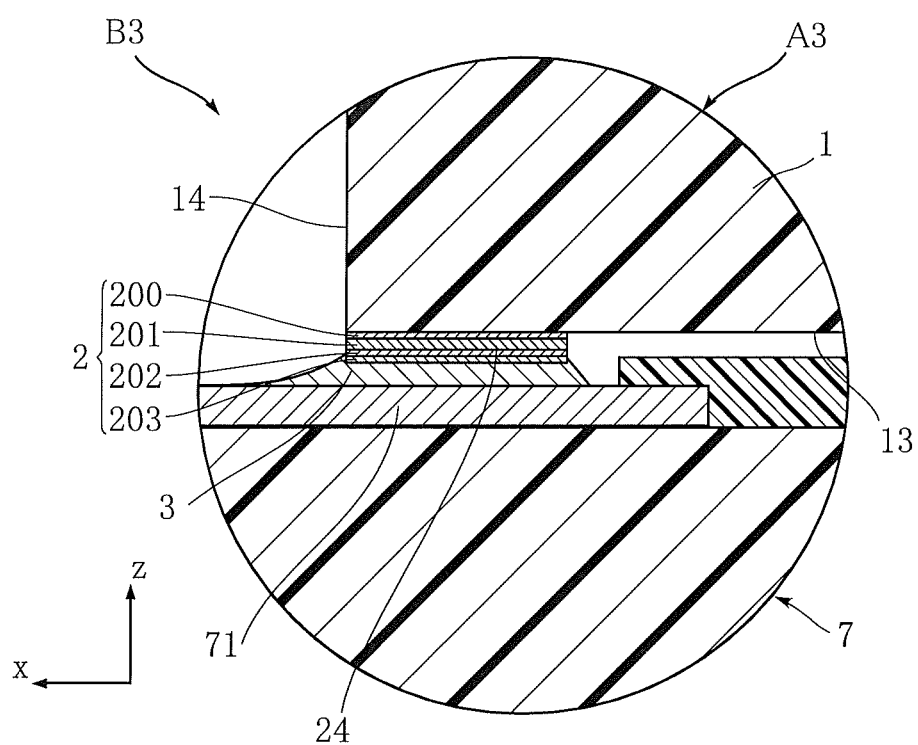
FIG. 54 is an enlarged cross-sectional view of a main section along a line LIV-LIV in FIG. 52.

FIG. 44 is a perspective view showing a main section of the light-emitting module A3. FIG. 45 is a front view showing a main section of the light-emitting device A3. FIG. 46 is a bottom view showing the light-emitting device A3. FIG. 47 is a side view showing the light-emitting device A3. FIG. 48 is a rear view showing the light-emitting device A3. FIG. 49 is a cross-sectional view along a line XLIX-XLIX in FIG. 45. FIG. 50 is a cross-sectional view along a line L-L in FIG. 45. FIG. 51 is a perspective view showing a main section of the light-emitting device B3. FIG. 52 is a plan view showing the light-emitting device B3. FIG. 53 is a cross-sectional view along a line LIII-LIII in FIG. 52. FIG. 54 is an enlarged cross-sectional view of a main section along a line LIV-LIV in FIG. 52. Note that, for convenience of understanding, the translucent resin 6 is omitted in FIGS. 44, 45 and 51.

The light-emitting module A3 is a module that functions as a light source of the light-emitting device B3, and has dimensions of about 3.1 mm in the x direction, about 1.6 mm in the y direction, and about 2.3 mm in the z direction, for example. The light-emitting device B3 is installed in a portable telephone, for example, and is used as a transmitter for transmitting signals by infrared rays.

The base 1 is a rectangular parallelepiped as a whole, and is made of a coating adhesive insulation resin such as LCP (liquid crystal polymer) resin, for example. The base 1 has a top surface 11, a back surface 12, a mounting surface 13, a pair of side surfaces 14, a first accommodating recess 15, and a second accommodating recess 16.

The top surface 11 faces in the y direction. The back surface 12 faces the opposite side to the top surface 11 in the y direction. The mounting surface 13 faces in the z direction, and is connected to the top surface 11, the back surface 12, and the pair of side surfaces 14. The pair of side surfaces 14 face in the x direction, and face the opposite side to each other. As shown in FIG. 53, the light-emitting module A3 is configured so as to be mounted with the mounting surface 13 oriented squarely facing the mounting board 7.

The first accommodating recess 15 is recessed from the top surface 11 in the y direction. The first accommodating recess 15 is shaped like a parabola, and has a first bottom surface 151 and a first side surface 152. The first bottom surface 151 is circular and is the surface on which the light-emitting element 4 is installed.

The second accommodating recess 16 is recessed from the top surface 11 in the y direction. The second accommodating recess 16 is rectangular when viewed in the y direction, and has a second bottom surface 161 and a second side surface 162. The second bottom surface 161 is rectangular when viewed in the y direction, and faces in the y direction. The second side surface 162 is connected to the second bottom surface 161 and the top surface 11.

As shown in FIG. 49, the second bottom surface 161 is located closer to the top surface 11 in the y direction than to the first bottom surface 151. Also, as shown in FIG. 2, the first side surface 152 is mainly connected to the top surface 11 and partly connected to the second bottom surface 161, with the remaining part thereof connected to the second side surface 162.

A back surface protrusion 19 is formed on the back surface 12 side of the base 1. The back surface protrusion 19 projects slightly from the back surface 12, and is substantially rectangular when viewed in the y direction, for example.

The wiring pattern 2 is formed on the base 1, constitutes a conduction path to the light-emitting element 4, and is for realizing mounting of the light-emitting module A3 to the mounting board 7. In the present embodiment, as shown in FIG. 54, the wiring pattern 2 has a structure in which a base layer 200, a first layer 201, a second layer 202 and a third layer 203 are laminated in order from the base 1.

The base layer 200 is made of Cu and formed by electroless plating, for example, and has a thickness of about 0.1 to 1.0 μm, for example. The first layer 201 is made of Cu and formed by electroplating, for example, and has a thickness of about 5 to 30 μm, for example. The second layer 202 is made of Ni and formed by electroplating, for example, and has a thickness of 1 to 5 μm, for example. The third layer 203 is made of Au and formed by electroplating, for example, and has a thickness of about 0.01 to 0.3 μm, for example. The second layer 202 made of Ni has a lower wettability to solder than the third layer 203 made of Au.

The wiring pattern 2 has a pair of mounting-surface electrodes 24, a pair of side-surface electrodes 25, a pair of back-surface electrodes 26, a first bottom-surface portion 211, a first side-surface portion 212, a first connecting portion 213, a first annular portion 214, a second bottom-surface portion 221, a second side-surface portion 222, and a second connecting portion 223.

The pair of mounting-surface electrodes 24 are arranged so as to be spaced from each other in the x direction, and respectively cover a part of the mounting surface 13 of the base 1. In the present embodiment, the mounting-surface electrodes 24 respectively reach to the end edges of the mounting surface 13 in the x direction. Also, each mounting-surface electrode 24 reaches to both edges of the mounting surface 13 in the y direction. Each mounting-surface electrode 24 is rectangular when viewed in the z direction.

The pair of side-surface electrodes 25 respectively cover at least a part of the pair of side surfaces 14 of the base 1, and, in the present embodiment, the side-surface electrodes 25 respectively cover the whole of the side surfaces 14. The side-surface electrodes 25 and the mounting-surface electrodes 24 are respectively connected to each other.

The pair of back-surface electrodes 26 respectively cover a part of the back surface 12 of the base 1. In the present embodiment, the back-surface electrodes 26 are respectively formed in a band along the end edges of the side surfaces 14 and the pair of mounting recesses 17.

The first bottom-surface portion 211 covers at least apart of the first bottom surface 151 of the first accommodating recess 15, and, in the present embodiment, the first bottom-surface portion 211 covers the whole of the first bottom surface 151. The first side-surface portion 212 is connected to the first bottom-surface portion 211, and covers a part of the first side surface 152 of the first accommodating recess 15.

The first connecting portion 213 is formed on the top surface 11, and connects the first side-surface portion 212 to one of the pair of mounting-surface electrodes 24 (left mounting-surface electrode 24 in the x direction in FIG. 44). The first annular portion 214 is formed on the top surface 11, and has an annular shape surrounding the first accommodating recess 15. The first annular portion 214 is connected to the first side-surface portion 212 and the first connecting portion 213.

The second bottom-surface portion 221 covers at least a part of the second bottom surface 161 of the second accommodating recess 16, and, in the present embodiment, covers almost the whole of the second bottom surface 161. As shown in FIG. 45, the second bottom-surface portion 221 is spaced from the first side-surface portion 212.

The second side-surface portion 222 covers at least a part of the second side surface 162 of the second accommodating recess 16, and, in the present embodiment, covers almost the whole of the second side surface 162. The second side-surface portion 222 is spaced from the first side-surface portion 212.

The second connecting portion 223 is formed on the top surface 11, and connects the second side-surface portion 222 to the other of the pair of mounting-surface electrodes 24 (right mounting-surface electrode 24 in the x direction in FIG. 44).

Note that, in the present embodiment, constituent parts similar to the parts given the reference numerals of the mounting surface 13, the pair of mounting-surface electrodes 24 and the pair of back-surface electrodes 26 are respectively provided on the opposite sides of the base 1 and the wiring pattern 2 in the z direction. These parts are formed for convenience of the manufacturing process of the light-emitting module A3, and may be used as the mounting surface 13, the pair of mounting-surface electrodes 24, and the pair of back-surface electrodes 26.

The light-emitting element 4 is an LED element capable of emitting infrared light, for example. Depending on the application, a device capable of emitting visible light or the like, for example, may be used as the light-emitting element 4. Electrodes (not shown) are provided on both sides of the light-emitting element 4 in the y direction, and the light-emitting element 4 is installed on the first bottom surface 151 of the first accommodating recess 15. More specifically, the electrode on one side of the light-emitting element 4 is joined via a conductive joining material (not shown) to the first bottom-surface portion 211 formed on the first bottom surface 151. The electrode on the other side of the light-emitting element 4 is joined to the second side-surface portion 222 by the wire 5.

The translucent resin 6 covers the light-emitting element 4, and fills the first accommodating recess 15 and the second accommodating recess 16. The translucent resin 6 is made of a resin or the like that transmits the infrared rays, for example, from the light-emitting element 4. In the present embodiment, the translucent resin 6 almost completely fills the first accommodating recess 15 and the second accommodating recess 16, but does not project from the first accommodating recess 15 or the second accommodating recess 16. That is, the surface of the translucent resin 6 is slightly sunken.

As shown in FIGS. 51 to 54, the light-emitting device B3 is constituted by mounting the light-emitting module A3 on a mounting board 7. The mounting board 7 has a pair of pad portions 71 and a pair of terminal portions 72. The mounting board 7 is a wiring board on which a wiring pattern is formed on a base made of an epoxy resin, for example.

The pair of pad portions 71 are parts on which the light-emitting module A3 is mounted. The pad portions 71 are respectively connected to the mounting-surface electrodes 24 of the light-emitting module A3 via solder 3. FIG. 52 is a view of the light-emitting device B3 from above in the z direction, and, for convenience of understanding, shows through to the pair of mounting-surface electrodes 24. As shown in FIG. 52, in the present embodiment, the pad portions 71 respectively contain the mounting-surface electrodes 24 when viewed in the z direction. Also, the difference between the dimensions of each pad portion 71 in the x direction and the dimensions of each mounting-surface electrode 24 in the x direction is greater than the difference between the dimensions of each pad portion 71 in the y direction and the dimensions of each mounting-surface electrode 24 in the y direction. In particular, the pad portions 71 are respectively constituted to stick out greatly in the x direction relative to the mounting-surface electrodes 24.

The pair of terminal portions 72 are respectively in electrical contact with a different one of the pair of pad portions 71. The pair of terminal portions 72 are parts to which terminals (not shown) on the portable telephone side, for example, for attaching the light-emitting device B3 are joined.

Next, an example of a method of making the light-emitting module A3 will be described below, with reference to FIGS. 55 to 71.

Figure 55:
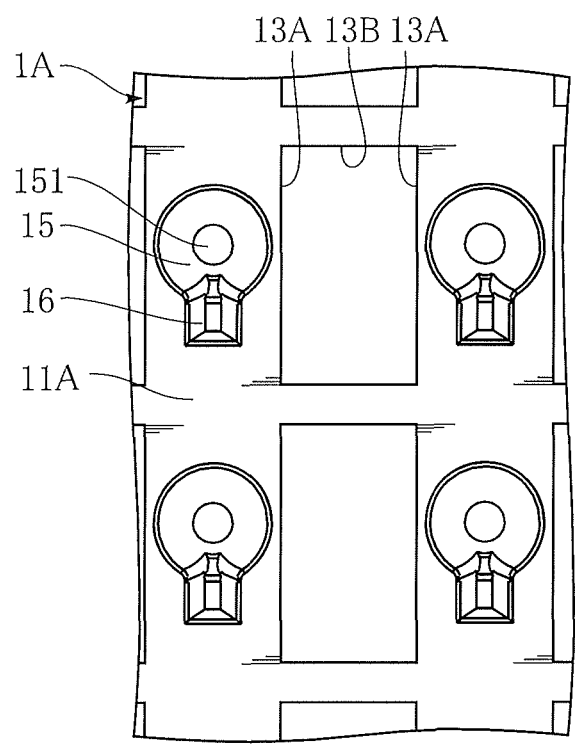
FIG. 55 is a front view showing a main section of a method of making the light-emitting module of FIG. 44.

First, a base material 1A is prepared, as shown in FIG. 55. The base material 1A extends in the z direction and the x direction, and has a top surface 11A and a back surface 12A (see FIG. 57). Also, a plurality of first accommodating recesses 15, a plurality of second accommodating recesses 16 and a plurality of through holes 13B are formed in the base material 1A. The first accommodating recesses 15 and the second accommodating recesses 16 are respectively joined to each other. The plurality of first accommodating recesses 15 and the plurality of second accommodating recesses 16 are arranged in a matrix in the z direction and the x direction. A plurality of first bottom surfaces 151 are thereby arranged in a matrix in the z direction and the x direction. As mentioned above, each first bottom surface 151 is a part (region) on which the light-emitting element 4 is installed.

The plurality of through holes 13B respectively pass through the base material 1A in the y direction, and are arranged in a matrix in the z direction and the x direction. Each through hole 13B is arranged between the adjacent first accommodating recesses 15 and second accommodating recesses 16 (between the adjacent first adjacent bottom surfaces 151). Each through hole 13B is rectangular when viewed in the y direction, and has a pair of inner-facing surfaces 13A. The pair of inner-facing surfaces 13A face each other in the z direction. The base material 1A is formed by shaping a liquid crystal polymer material using a mold, for example.

Figure 56:
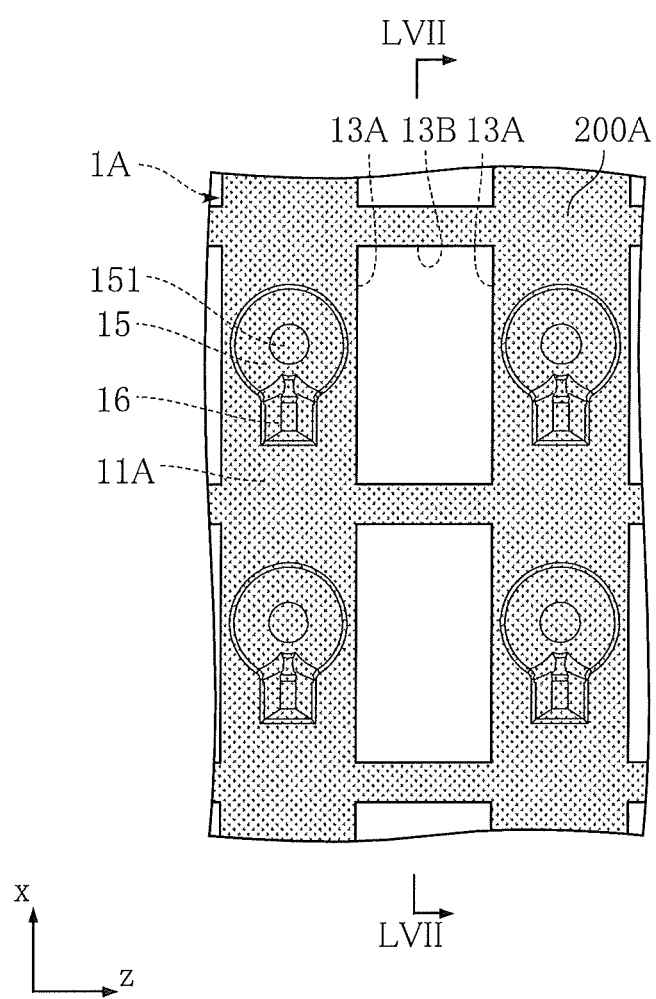
FIG. 56 is a front view showing a main section of the method of making the light-emitting module of FIG. 44.
Figure 57:
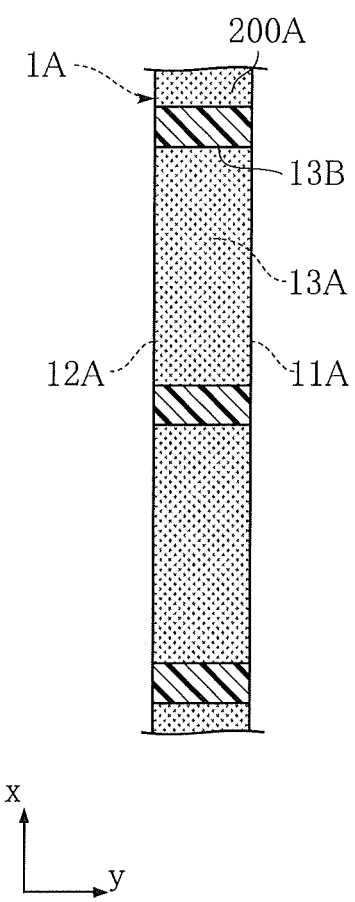
FIG. 57 is a cross-sectional view of a main section along a line LVII-LVII in FIG. 56.
Figure 58:
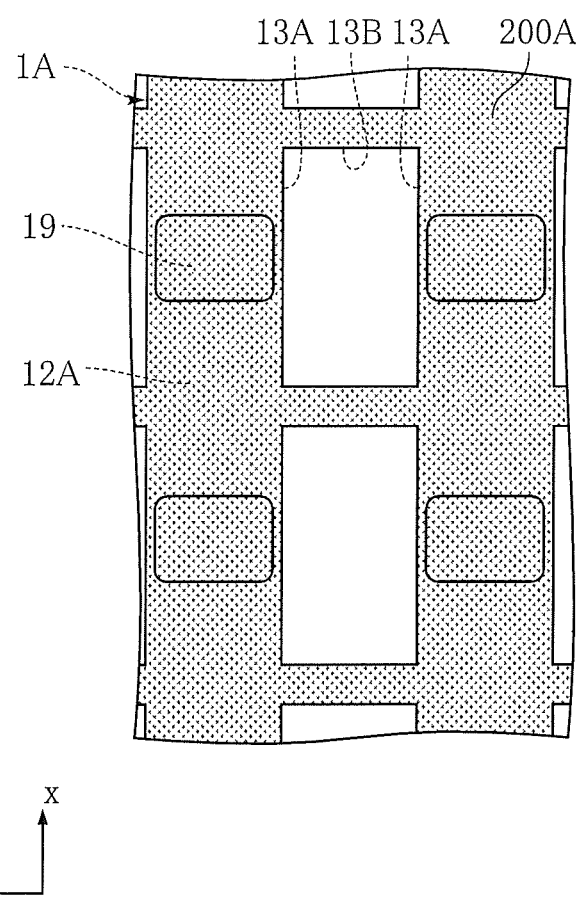
FIG. 58 is a rear view showing a main section of the method of making the light-emitting module of FIG. 44.

Next, a base layer 200A is formed, as shown in FIGS. 56 to 58. Formation of the base layer 200A is performed by electroless plating, for example. The base layer 200A made of Cu, for example, is thereby formed over the entire exposed surface of the base material 1A. The base layer 200A has a thickness of about 0.1 to 1.0 μm, for example.

Figure 59:
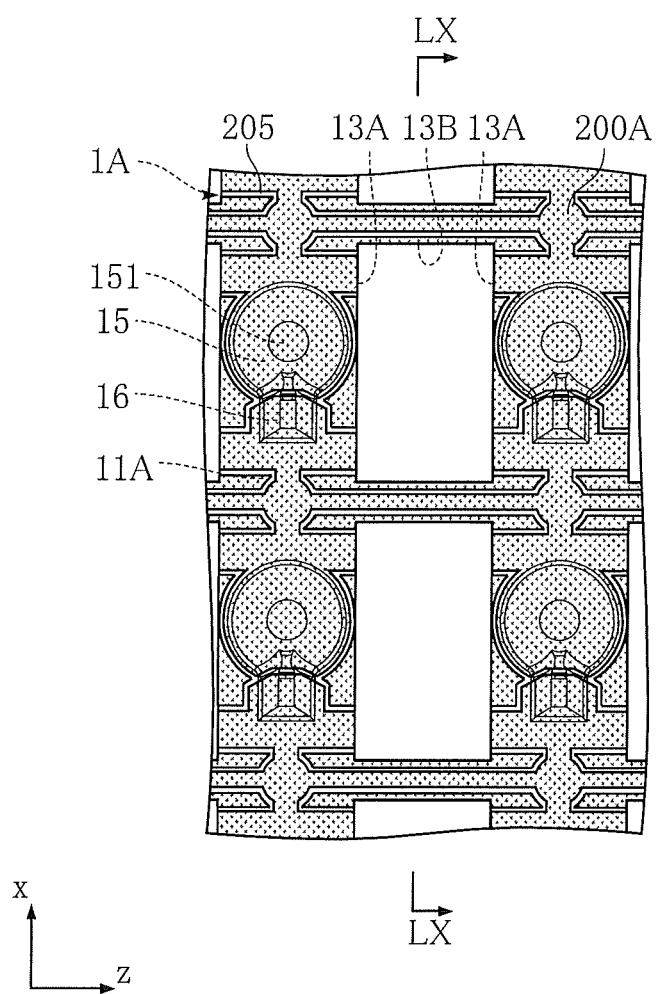
FIG. 59 is a front view showing a main section of the method of making the light-emitting module of FIG. 44.
Figure 60:
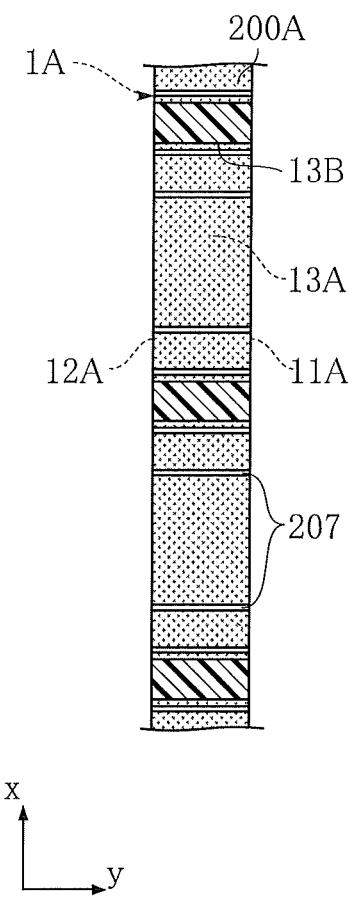
FIG. 60 is a cross-sectional view of a main section along a line LX-LX in FIG. 59.
Figure 61:
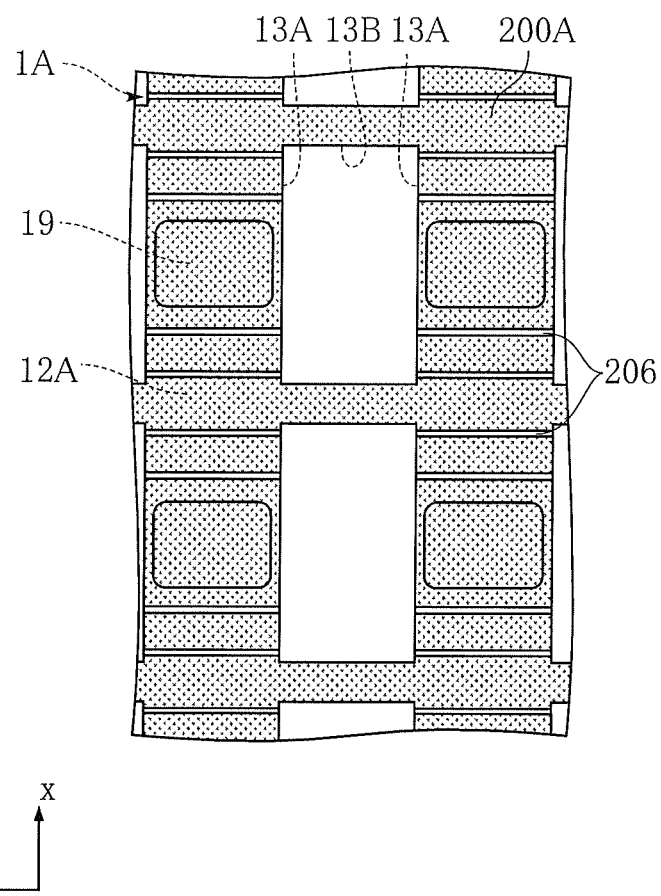
FIG. 61 is a rear view showing a main section of the method of making the light-emitting module of FIG. 44.

Next, slits 205, slits 206, and slits 207 are formed in the base layer 200A, as shown in FIGS. 59 to 61. The slits 205, slits 206 and the slits 207 are formed by linearly removing a part of the base layer 200A using a laser, for example. As a result of the slits 205 being formed, the portion of the base layer 200A that covers the top surface 11A is formed to have an integrated portion in which band-like portions elongated in the z direction between the through holes 13B adjacent in the x direction are integrally connected to portions covering the first accommodating recesses 15 and portions covering the second accommodating recesses 16 located on the opposite side to these first accommodating recesses 15 in the x direction with the band-like portions sandwiched therebetween. As a result of the slits 207 being formed, the portion of the base layer 200A that covers the inner-facing surfaces 13A has rectangular band-like portions that are connected to the integrated portion. As a result of the slits 206 being formed, the portion of the base layer 200A that covers the back surface 12A has band-like portions that are connected to the rectangular band-like portions, and the base layer 200A is divided into portions isolated from the integrated portion and the rectangular band-like portions.

Figure 62:
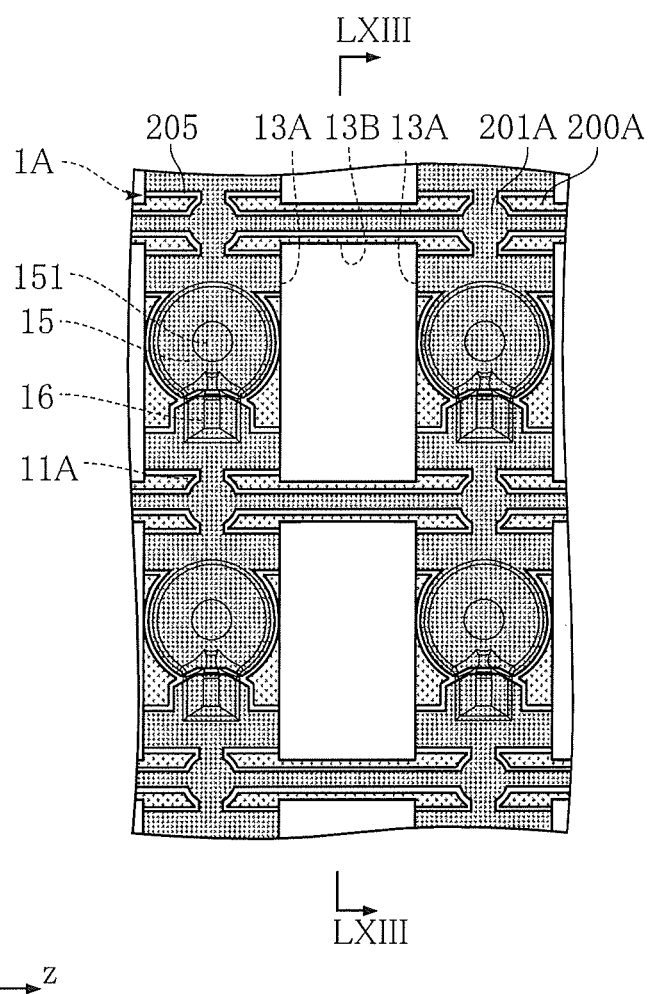
FIG. 62 is a front view showing a main section of the method of making the light-emitting module of FIG. 44.
Figure 63:
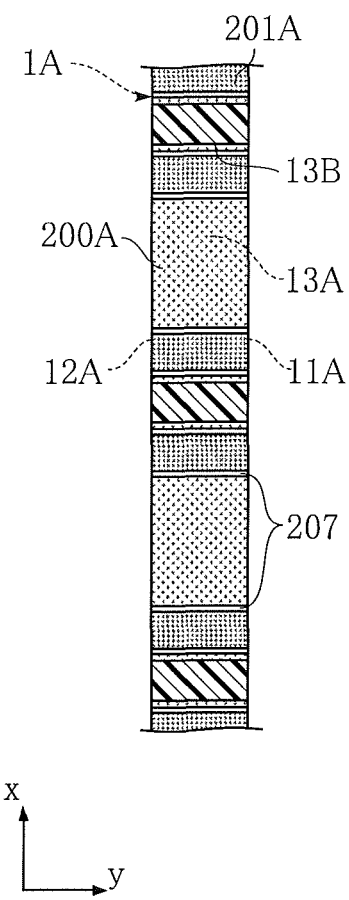
FIG. 63 is a cross-sectional view of a main section along a line LXIII-LXIII in FIG. 62.
Figure 64:
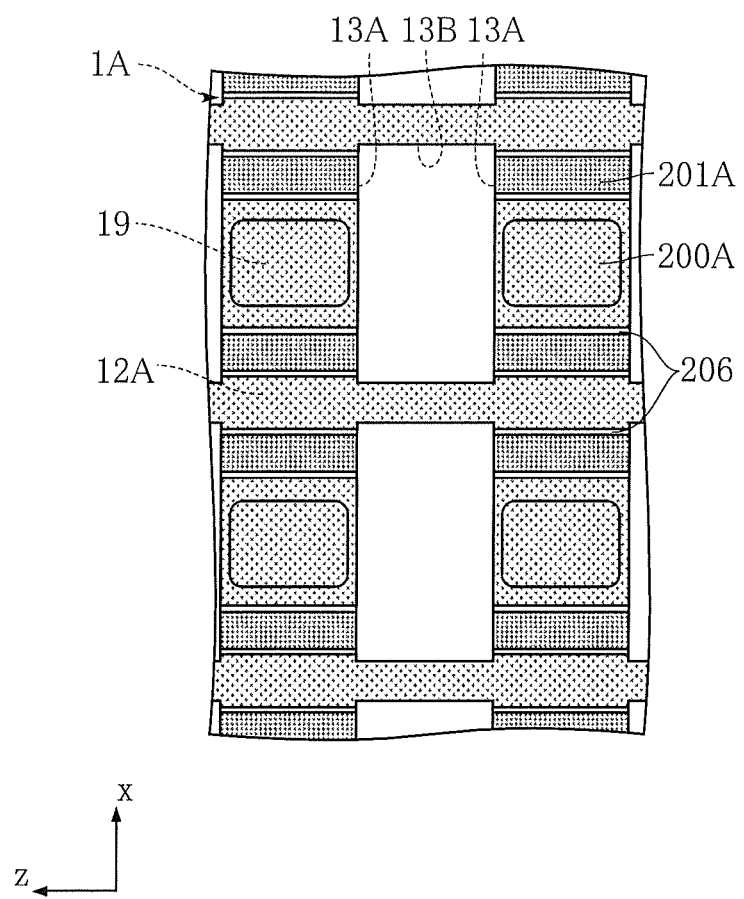
FIG. 64 is a rear view showing a main section of the method of making the light-emitting module of FIG. 44.

Next, a first layer 201A is formed, as shown in FIGS. 62 to 64. Formation of the first layer 201A is performed by electroplating, for example. That is, the first layer 201A is formed by connecting electrodes for use in plating (not shown) near both edges of the integrated portion of the base layer 200A in the x direction. In forming the first layer 201A, a layer made of Cu, for example, is formed at a thickness of about 5 to 30 μm. In FIGS. 62 to 64, the relatively dark colored region is the region where the first layer 201A is formed, and the relatively light colored region is the region where the base layer 200A is exposed.

Figure 65:
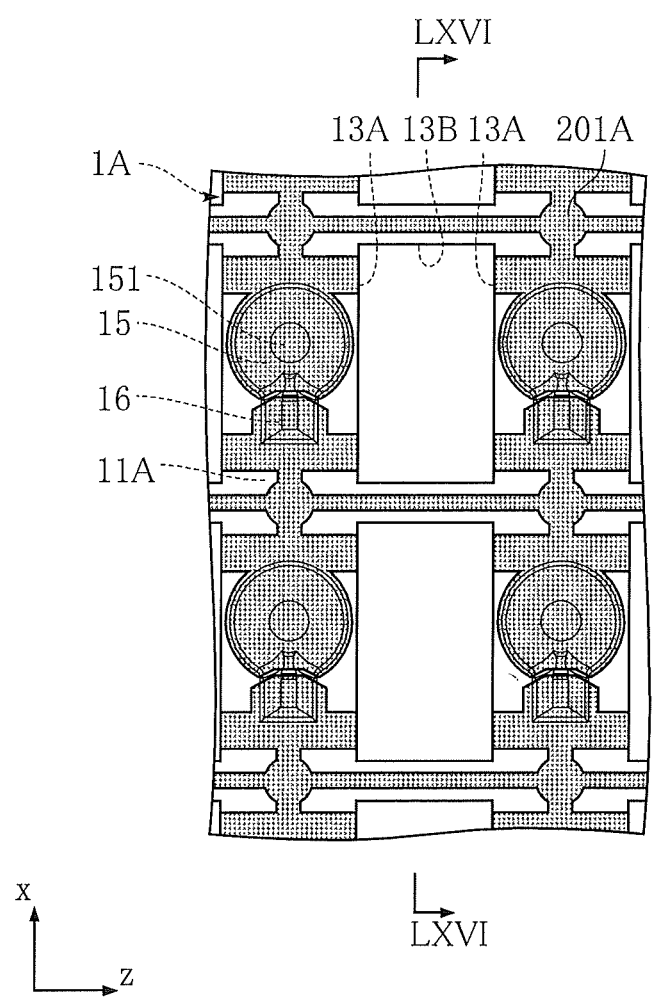
FIG. 65 is a front view showing a main section of the method of making the light-emitting module of FIG. 44.
Figure 66:
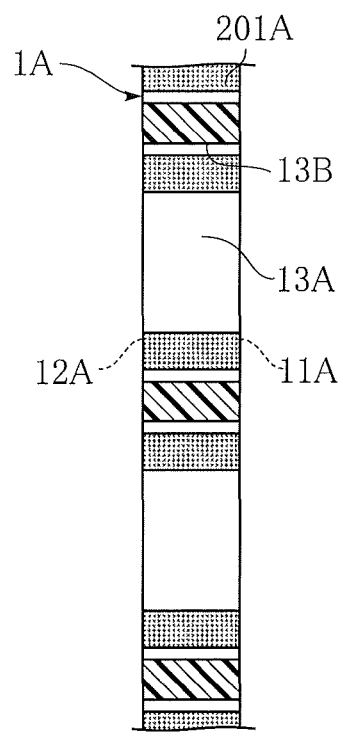
FIG. 66 is a cross-sectional view of a main section along a line LXVI-LXVI in FIG. 65.
Figure 67:
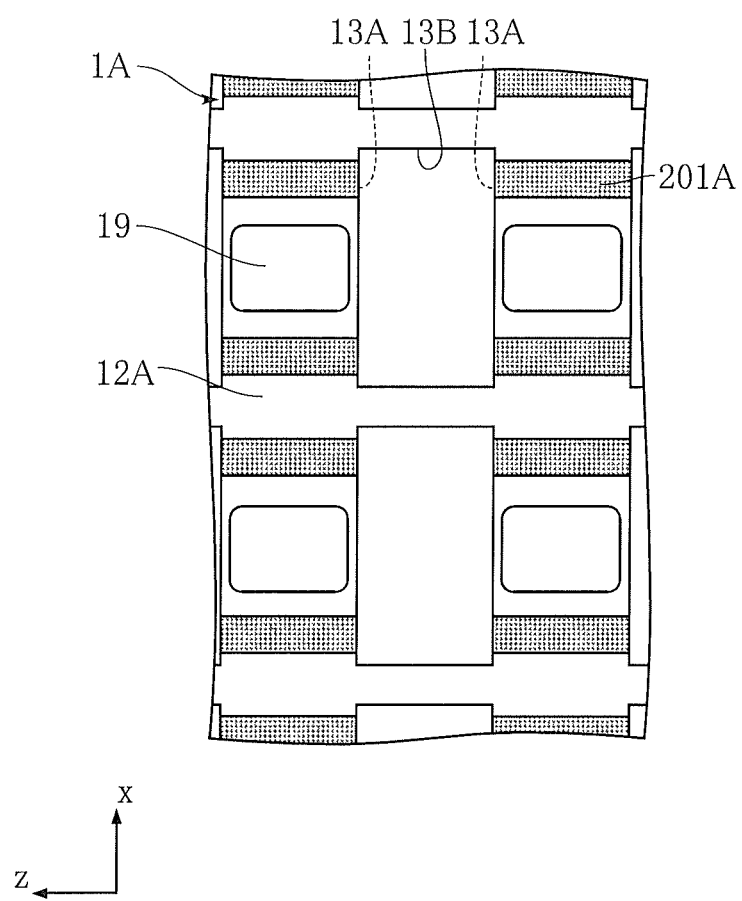
FIG. 67 is a rear view showing a main section of the method of making the light-emitting module of FIG. 44.

Next, the exposed base layer 200A is removed by performing soft etching, for example. The state shown in FIGS. 65 to 67 is thereby obtained. In this state, the exposed base layer 200A has been removed, and only the first layer 201A remains.

Figure 68:
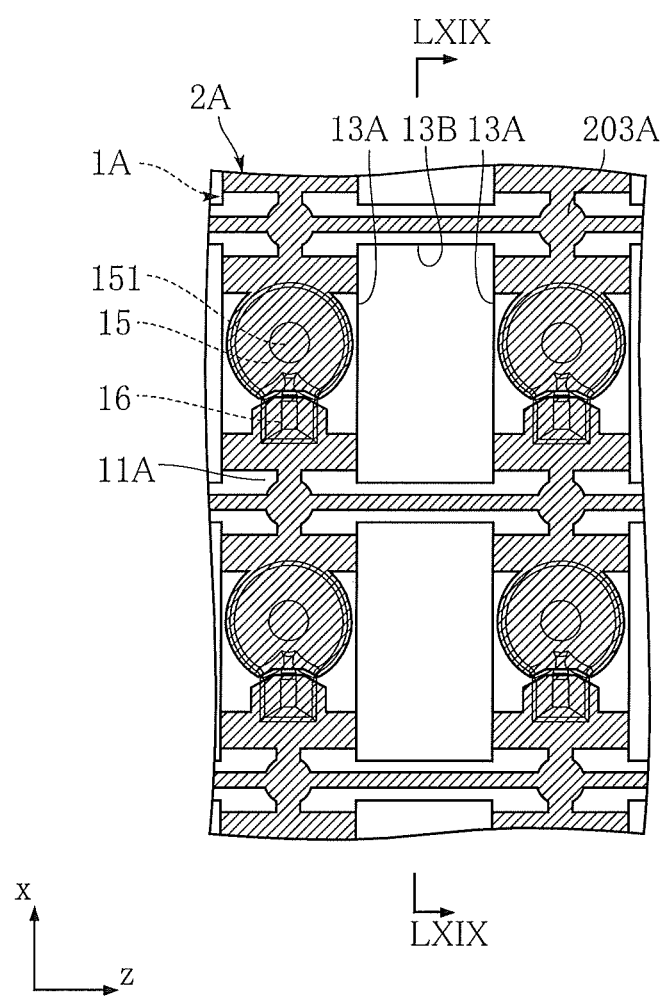
FIG. 68 is a front view showing a main section of the method of making the light-emitting module of FIG. 44.
Figure 69:
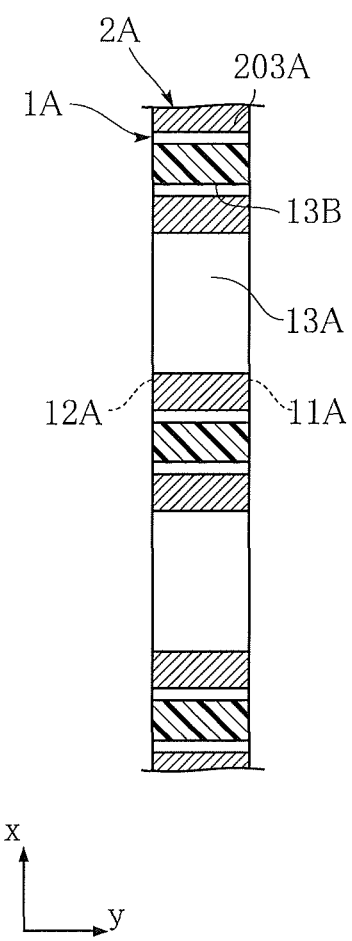
FIG. 69 is a cross-sectional view of a main section along a line LXIX-LXIX in FIG. 68.
Figure 70:
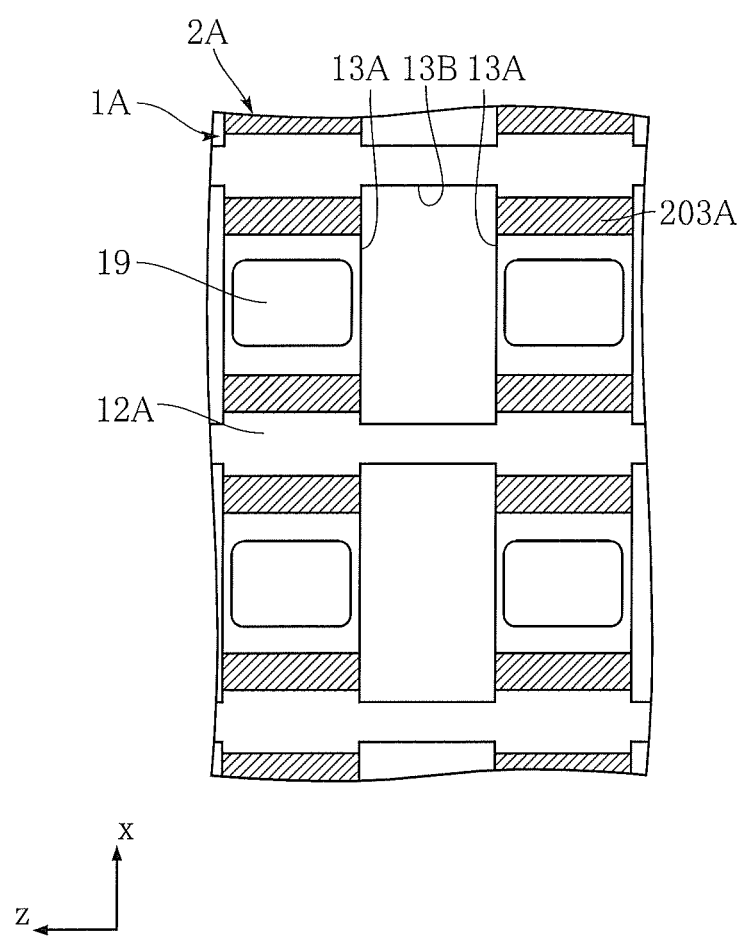
FIG. 70 is a rear view showing a main section of the method of making the light-emitting module of FIG. 44.

Next, a second layer 202A and a third layer 203A are formed. FIGS. 68 to 70 show a state where formation of the third layer 203A is completed. Formation of the second layer 202A and the third layer 203A is performed by electroplating similar to when forming the first layer 201A, for example. In forming the second layer 202A, a layer made of Ni, for example, is formed at a thickness of about 1 to 5 μm. In forming the third layer 203A, a layer made of Au, for example, is formed at a thickness of about 0.01 to 0.3 μm. A conductor layer 2A is thereby obtained.

Figure 71:
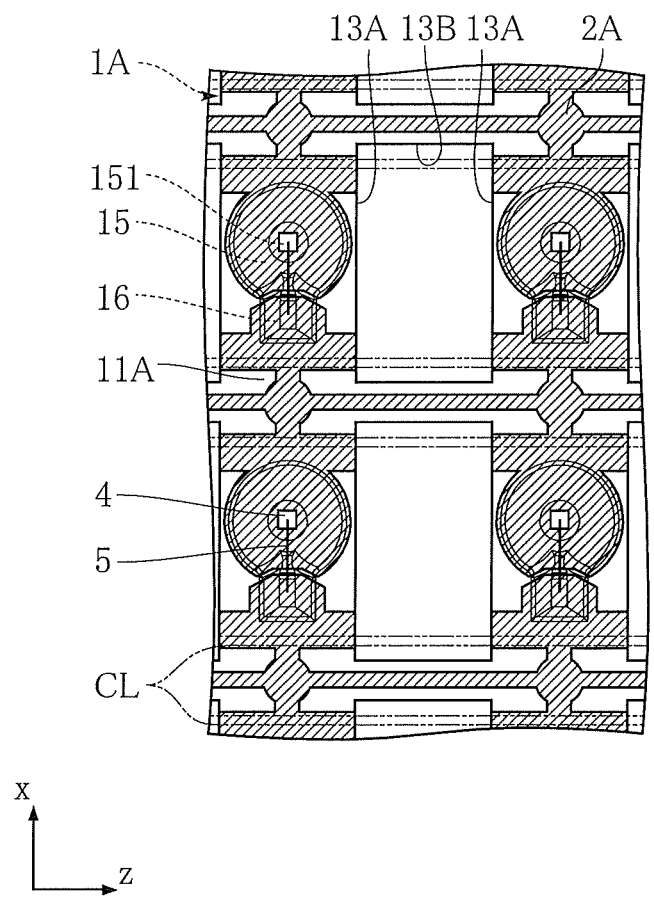
FIG. 71 is a front view showing a main section of the method of making the light-emitting module of FIG. 44.

Next, as shown in FIG. 71, a plurality of light-emitting elements 4 are respectively installed on the plurality of first bottom surfaces 151. A wire 5 is then bonded to each light-emitting element 4 and the conductor layer 2A. Also, although not shown for convenience of understanding, the plurality of first accommodating recesses 15 and the plurality of second accommodating recesses 16 are filled with a liquid resin material, for example, so as to cover the plurality of light-emitting elements 4, and the liquid resin material is cured. A plurality of pieces of translucent resin 6 (not shown) are thereby obtained. Thereafter, the base material 1A is cut by a dicing blade, for example, along a plurality of cutting lines CL shown in FIG. 71. The cutting lines CL are respectively included in a yz plane and pass through portions of the conductor layer 2A that cover the inner-facing surfaces 13A. As a result of this cutting, the inner-facing surfaces 13A form the mounting surfaces 13, and portions of the conductor layer 2A that cover the inner-facing surfaces 13A form the mounting-surface electrodes 24. Also, the conductor layer 2A consisting of the base layer 200A, the first layer 201A, the second layer 202A and the third layer 203A forms a plurality of wiring patterns 2 consisting of a base layer 200, a first layer 201, a second layer 202, and a third layer 203. As a result of completing the above processes, a plurality of light-emitting modules A3 are obtained.

Next, the working of the light-emitting module A3 and the light-emitting device B3 will be described.

According to the present embodiment, the light-emitting module A3 has a pair of mounting-surface electrodes 24. The pair of mounting-surface electrodes 24 are arranged so as to be spaced from each other in the x direction with the mounting surface 13 sandwiched therebetween. Joining these mounting-surface electrodes 24 to the mounting board 7 with the solder 3, for example, enables the light-emitting module A3 to be stably and reliably mounted on the mounting board 7. Accordingly, the light-emitting module A3 can be more suitably mounted. Also, the mounting-surface electrodes 24 are formed on the mounting surface 13, and are constituted to project from the mounting surface 13 by the thickness of the wiring pattern 2. The melted solder 3 can thus be made to reliably contact the mounting-surface electrodes 24, when mounting the light-emitting module A3.

As a result of the back-surface electrodes 26 being provided, the back surface 12 side of the light-emitting module A3 can also be made to contribute to joining the light-emitting module A3 to the mounting board 7.

As a result of the first accommodating recess 15 being provided and the first side-surface portion 212 covering the first side surface 152, the light from the light-emitting element 4 installed on the first bottom surface 151 can be reflected by the first side-surface portion 212. The emission efficiency of the light-emitting module A3 can thereby be enhanced.

As a result of the second accommodating recess 16 being provided, the wire 5 can be prevented from sticking out from the base 1.

As a result of the mounting-surface electrodes 24 of the light-emitting module A3 being contained by the pad portions 71 of the mounting board 7 provided in the light-emitting device B3, the solder 3 can be made to adhere to the front surface of the mounting-surface electrodes 24. The difference between the dimensions of the pad portions 71 in the x direction and the dimensions of the mounting-surface electrodes 24 in the x direction is greater than the difference between the dimensions of the pad portions 71 in the y direction and the dimensions of the mounting-surface electrodes 24 in the y direction. The light-emitting module A3 can thereby be prevented from rotating about an axis extending in the z direction, when mounting the light-emitting module A3 on the mounting board 7.

Figure 72:
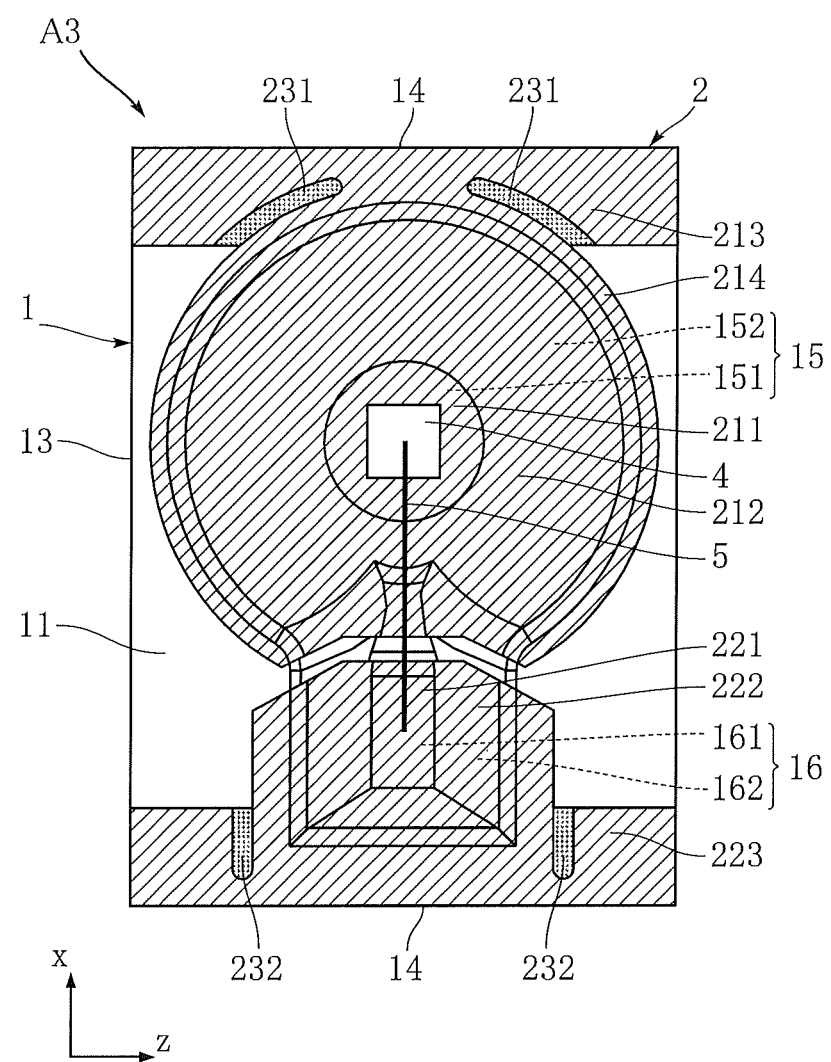
FIG. 72 is a front view showing a main section of a modification of the light-emitting module based on the third embodiment of the present invention.
Figure 73:
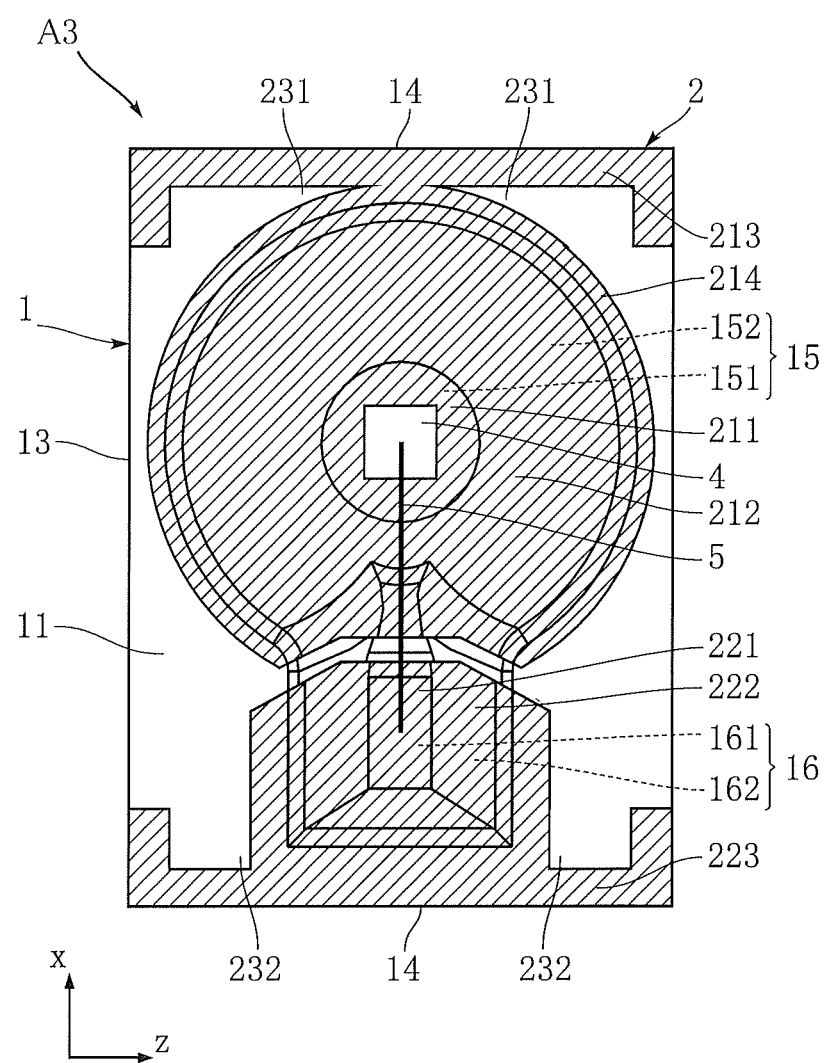
FIG. 73 is a front view showing a main section of a modification of the light-emitting module based on the third embodiment of the present invention.
Figure 74:
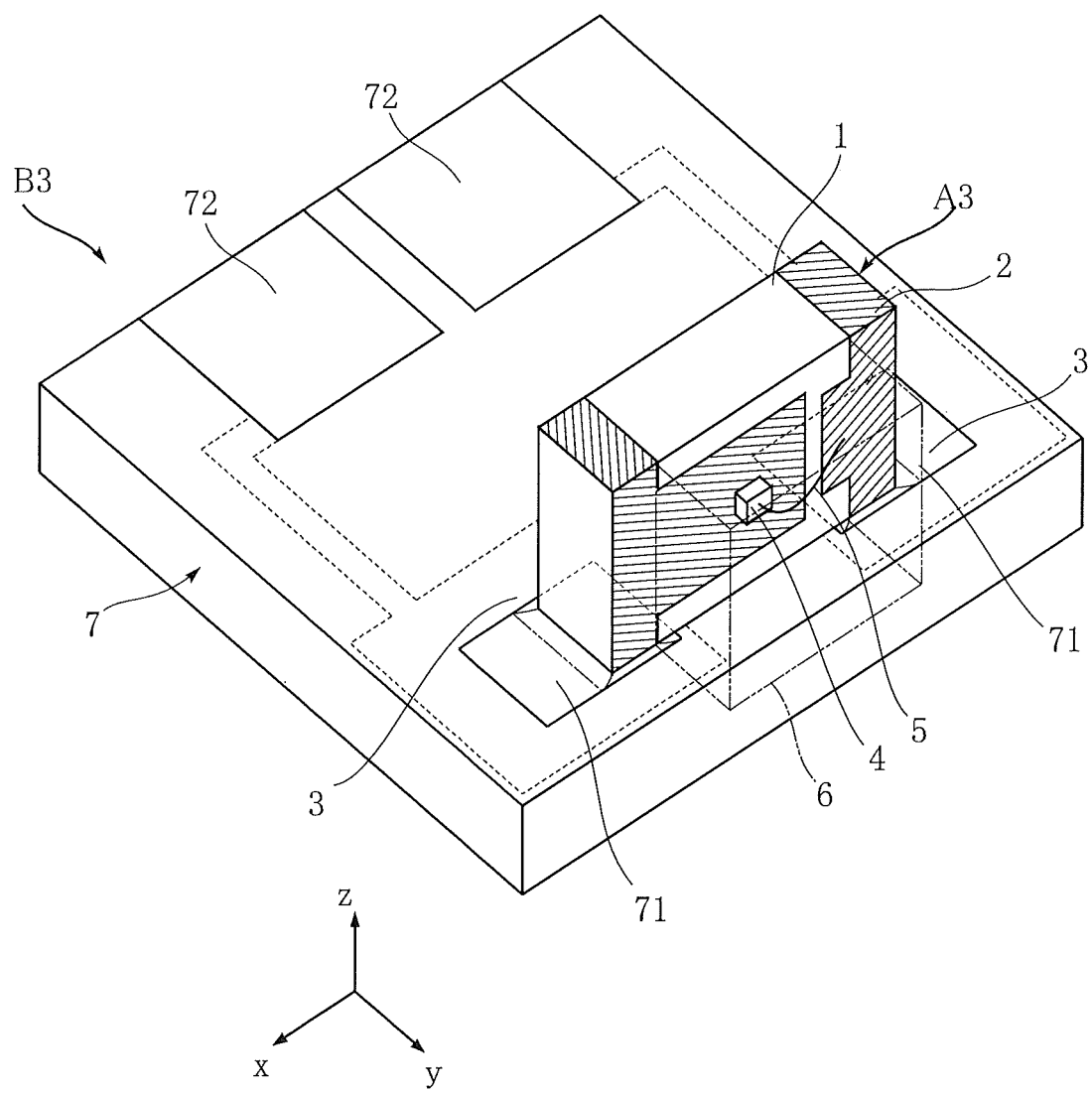
FIG. 74 is a perspective view showing a modification of the light-emitting module and the light-emitting device based on the third embodiment of the present invention.
Figure 75:
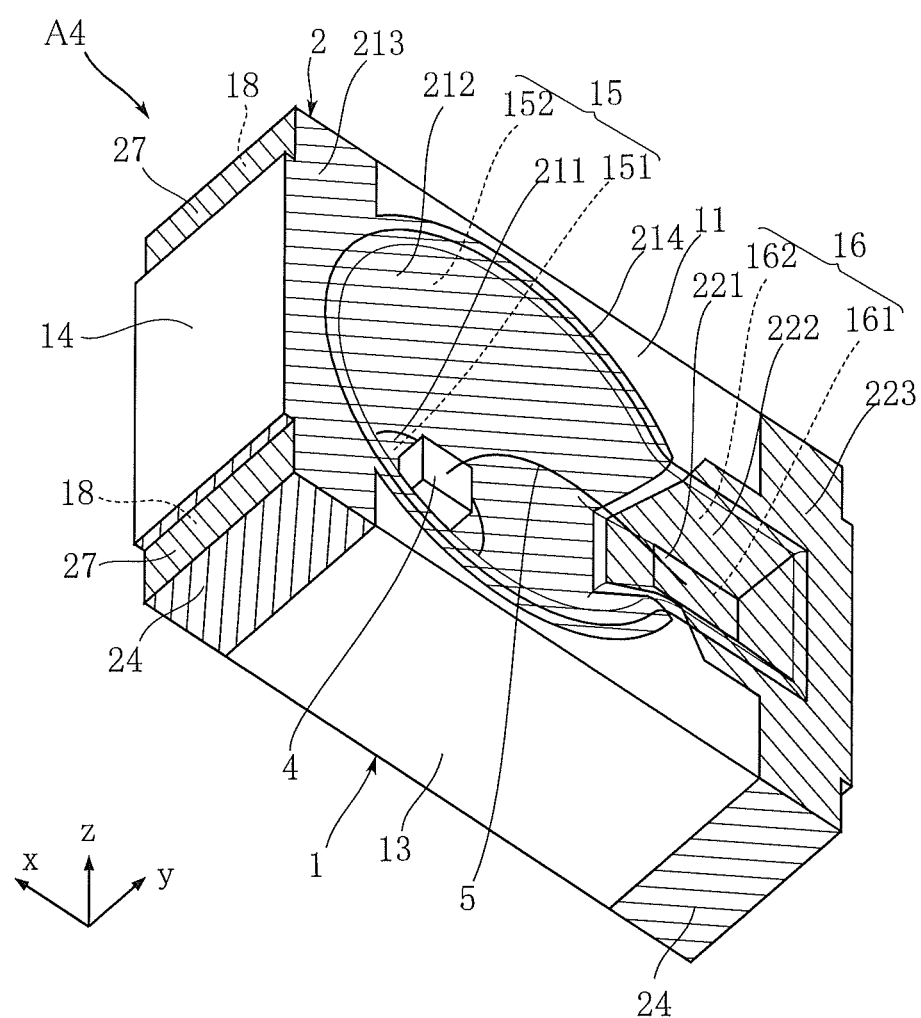
FIG. 75 is a perspective view showing a main section of a light-emitting module based on the fourth embodiment of the present invention.
Figure 76:
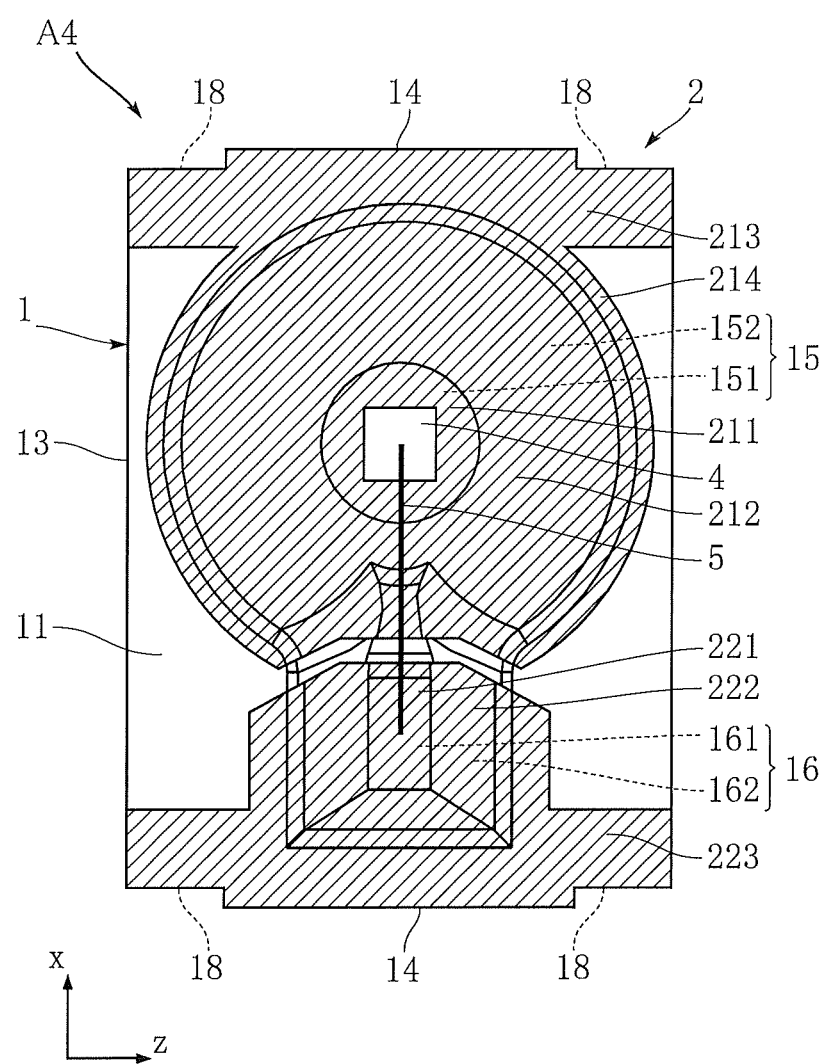
FIG. 76 is a front view showing a main section of the light-emitting module of FIG. 75.
Figure 77:
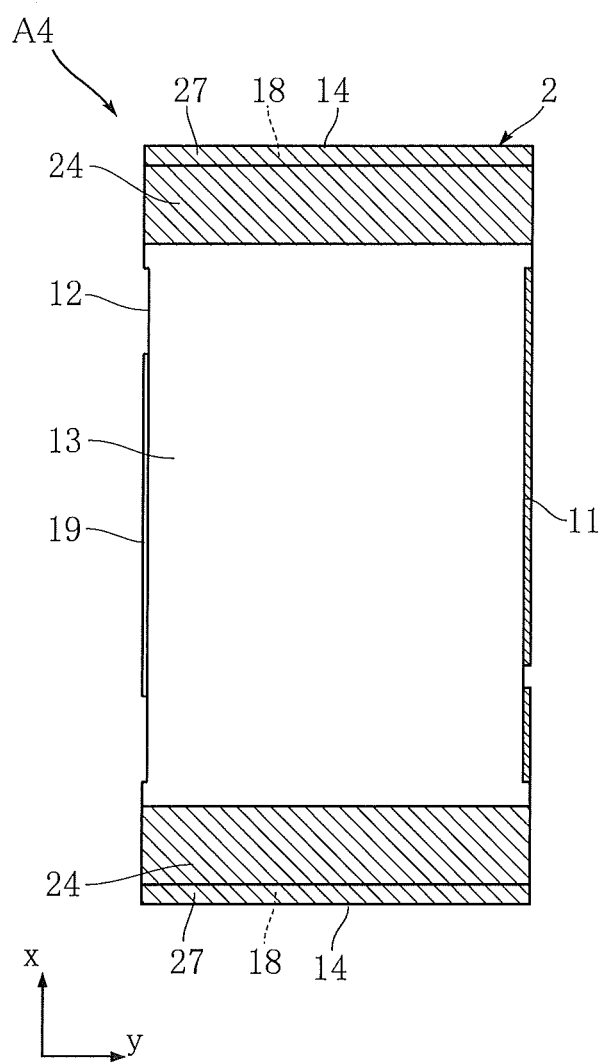
FIG. 77 is a bottom view showing the light-emitting module of FIG. 75.
Figure 78:
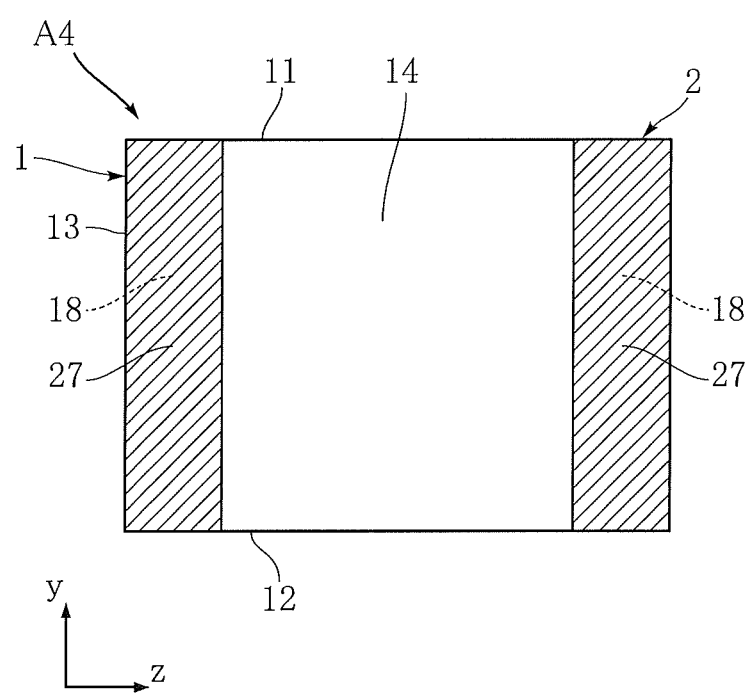
FIG. 78 is a side view showing the light-emitting module of FIG. 75.
Figure 79:
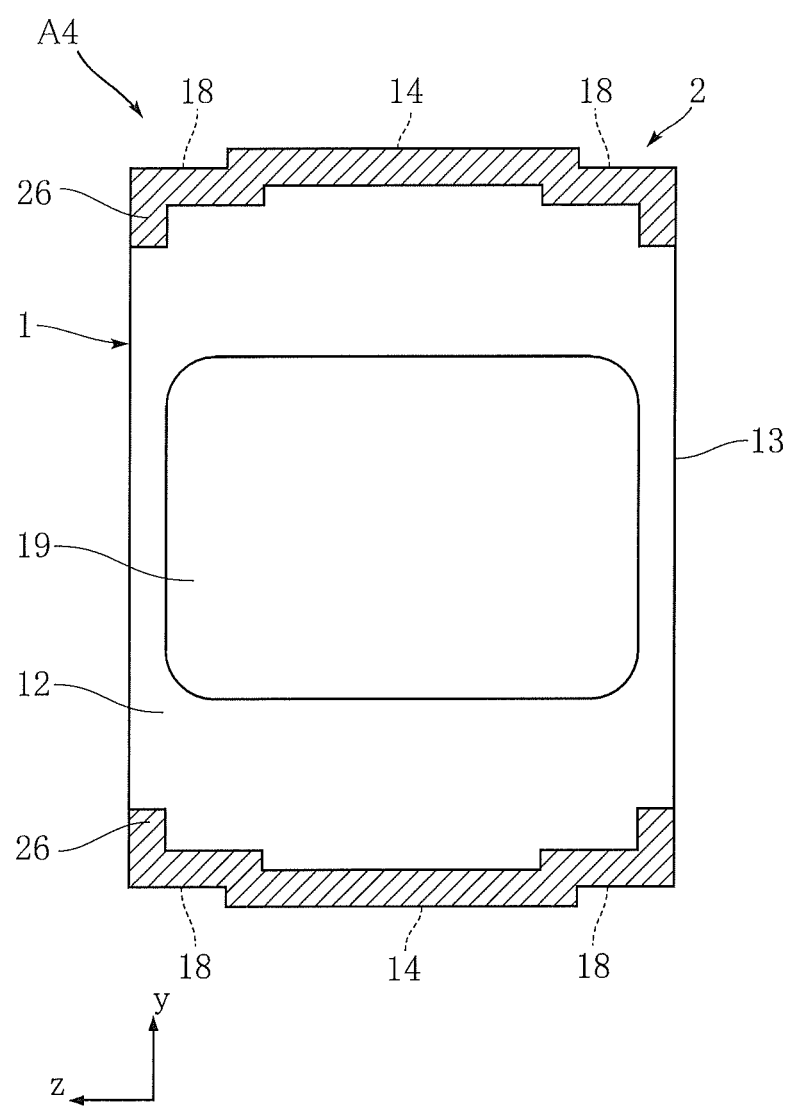
FIG. 79 is a rear view showing the light-emitting module of FIG. 75.

FIGS. 72 to 74 show modifications of the light-emitting module A3.

In the modifications shown in FIGS. 72 and 73, a first solder prevention portion 231 and a second solder prevention portion 232 are formed in the wiring pattern 2.

In the modification shown in FIG. 72, two first solder prevention portions 231 and two second solder prevention portions 232 are provided. The first solder prevention portions 231 are provided in the first connecting portion 213, and are located between the first accommodating recess 15 and the mounting-surface electrodes 24. More specifically, the first solder prevention portions 231 are configured in an arched band along the outer circle of the first accommodating recess 15. Also, the first solder prevention portions 231 are formed by exposing a part of the second layer 202 from the third layer 203 in the first connecting portion 213. An exemplary technique for exposing the second layer 202 involves forming the third layer 203 (third layer 203A), and then using a laser to selectively remove only the third layer 203 (third layer 203A). The first solder prevention portions 231 thus formed have a lower wettability to solder than portions of the first connecting portion 213 other than the first solder prevention portions 231.

The second solder prevention portions 232 are provided in the second connecting portion 223, and are located between the second accommodating recess 16 and the mounting-surface electrodes 24. More specifically, the second solder prevention portions 232 are configured as straight bands along the outer sides of the second accommodating recess 16. Also, the second solder prevention portions 232 are formed by exposing a part of the second layer 202 from the third layer 203 in the second connecting portion 223. An exemplary technique for exposing the second layer 202 involves forming the third layer 203 (third layer 203A), and then using a laser to selectively removing only the third layer 203 (third layer 203A). The second solder prevention portions 232 thus formed have a lower wettability to solder than portions of the second connecting portion 223 other than the second solder prevention portions 232.

In the modification shown in FIG. 73, the first solder prevention portions 231 are formed by exposing the top surface 11 of the base 1 from the first connecting portion 213. Although the first solder prevention portions 231 are surrounded by the first connecting portion 213 in such a configuration, the first solder prevention portions 231 are taken in the present invention as being formed in the first connecting portion 213, given that the first solder prevention portions 231 are defined by the existence of the first connecting portion 213. In such a configuration, the first solder prevention portions 231 similarly have a lower wettability to solder than portions of the first connecting portion 213 other than the first solder prevention portions 231.

The second solder prevention portions 232 are formed by exposing the top surface 11 of the base 1 from the second connecting portion 223. Although the second solder prevention portions 232 are surrounded by the second connecting portion 223 in such a configuration, the second solder prevention portions 232 are taken in the present invention as being formed in the second connecting portion 223, given that the second solder prevention portions 232 are defined by the existence of the second connecting portion 223. In such a configuration, the second solder prevention portions 232 similarly have a lower wettability to solder than portions of the second connecting portion 223 other than the second solder prevention portions 232.

According to these modifications, as a result of the first solder prevention portions 231 and the second solder prevention portions 232 being provided, the melted solder 3 can be prevented from running into the first accommodating recess 15 or the second accommodating recess 16 by the first solder prevention portions 231 and the second solder prevention portions 232, when mounting the light-emitting module A3 on the mounting board 7.

FIG. 74 shows a light-emitting module A3 as a modification regarding the base 1, the wiring pattern 2 and the translucent resin 6 and a light-emitting device B3 in which this light-emitting module A3 is installed. In this modification, a first accommodating recess 15 and a second accommodating recess 16 are not formed on the base 1. The light-emitting element 4 is installed on the top surface 11. The wiring pattern 2 is formed so as to cover appropriate parts of the top surface 11. The translucent resin 6 covers the light-emitting element 4 on the top surface 11, and projects from the top surface 11.

Figure 80:
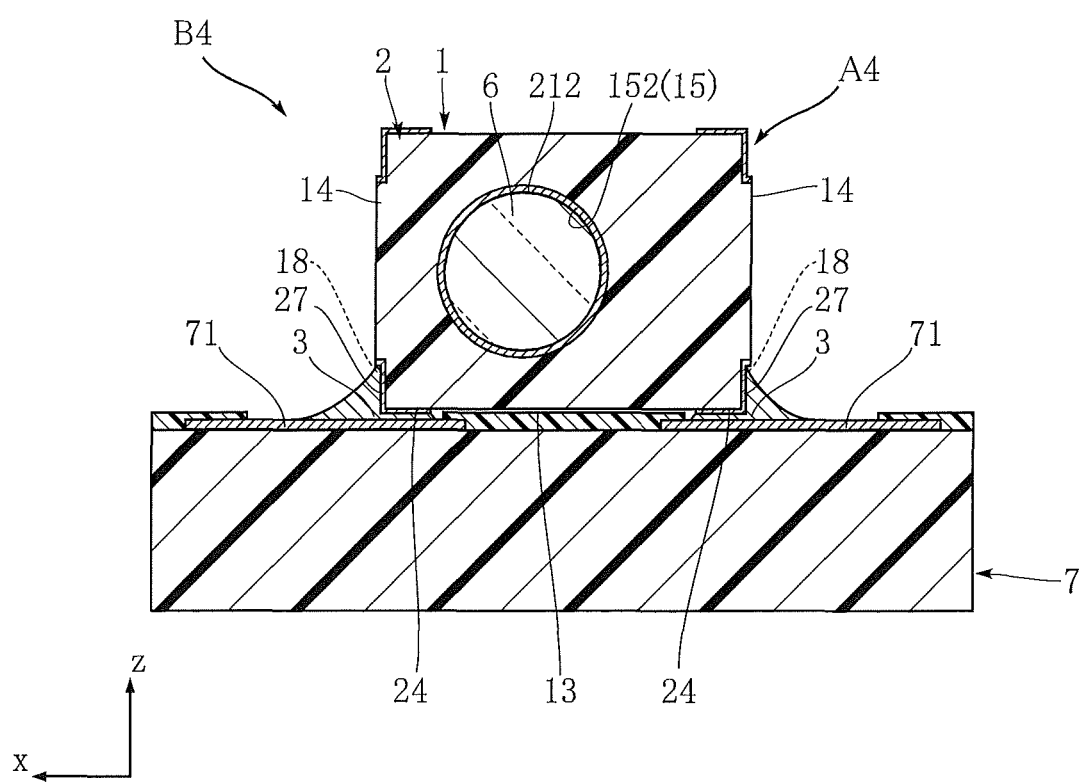
FIG. 80 is a cross-sectional view showing a light-emitting device based on a fourth embodiment of the present invention.
Figure 81:
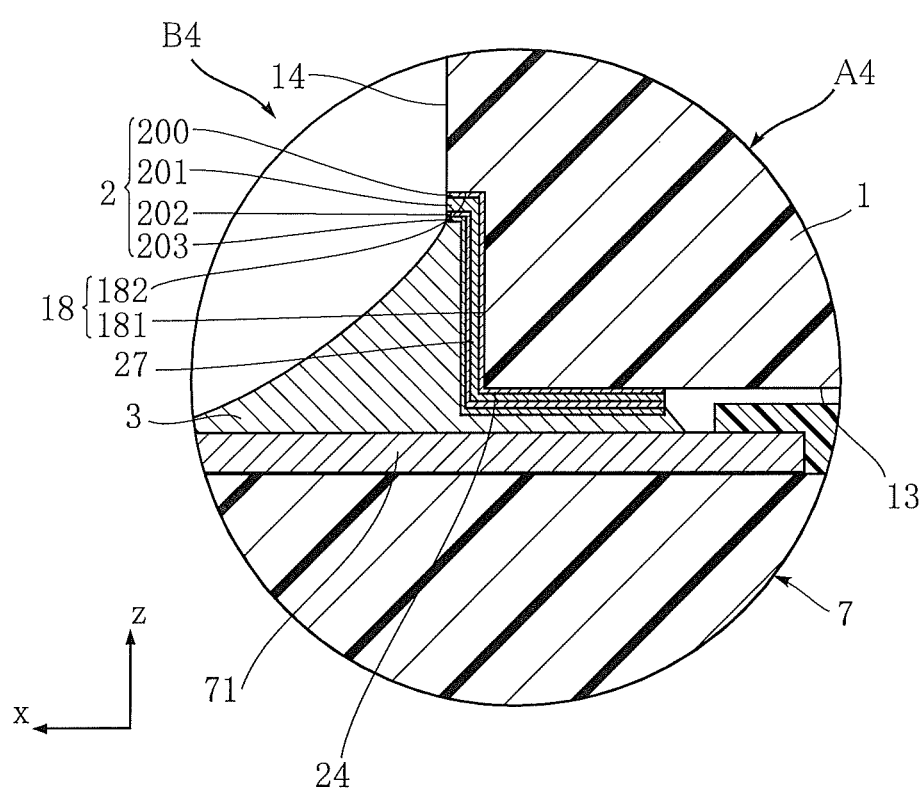
FIG. 81 is an enlarged cross-sectional view showing a main section of the light-emitting device based on the fourth embodiment of the present invention.

FIGS. 75 to 79 show a light-emitting module based on a fourth embodiment of the present invention. FIGS. 80 and 81 show a light-emitting device based on the fourth embodiment of the present invention. The light-emitting module A4 of the present embodiment mainly differs from the abovementioned light-emitting module A3 in that a pair of lateral recesses 18 are formed in the base 1.

In the present embodiment, a pair of lateral recesses 18 are formed in the base 1. The pair of lateral recesses 18 are formed at both ends of the base 1 in the x direction. Each lateral recess 18 is recessed from the side surface 14 and is open in the z direction on the side on which the mounting surface 13 is located. Also, each lateral recess 18 is open on both sides in the y direction, and reaches from the top surface 11 to the back surface 12.

The wiring pattern 2 has a pair of lateral recess electrodes 27. The lateral recess electrodes 27 respectively covers at least a part of the lateral recesses 18, and, in the present embodiment, the lateral recess electrodes 27 respectively cover the whole of the lateral recesses 18. Also, the lateral recess electrodes 27 are connected to the mounting-surface electrodes 24 and the pair of back-surface electrodes 26.

As shown in FIG. 81, the lateral recesses 18 have a lateral recess side surface 181 and a lateral recess upper surface 182. The lateral recess side surface 181 faces outward in the x direction, and is connected to the mounting surface 13. The lateral recess upper surface 182 faces outward (downward in FIG. 81) in the z direction, and is connected to the side surface 14 and the lateral recess side surface 181.

Next, a method of making the light-emitting module A4 will be described below, with reference to FIGS. 82 and 83.

Figure 82:
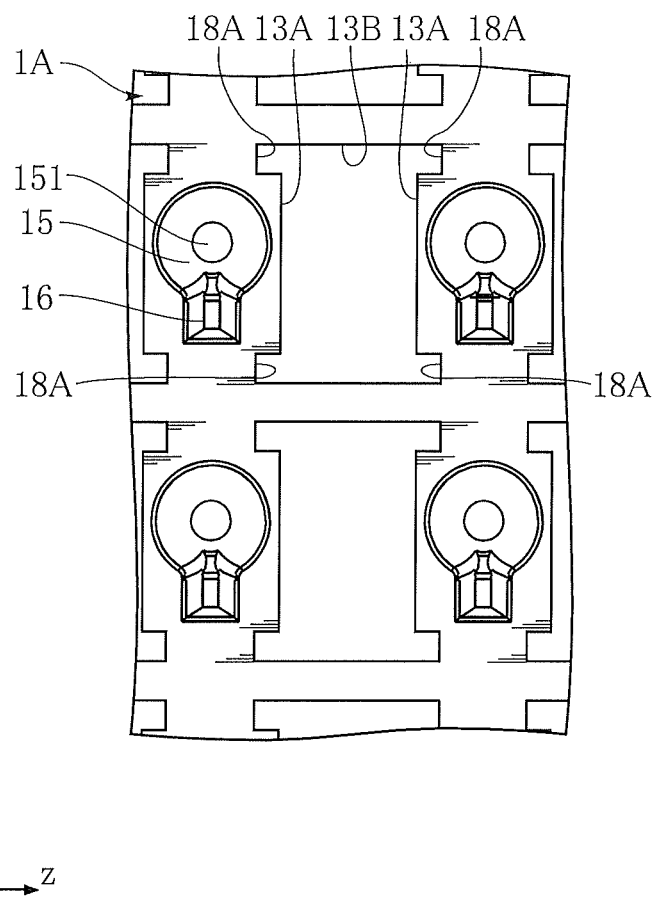
FIG. 82 is a front view showing a main section of a method of making the light-emitting module of FIG. 75.
Figure 83:
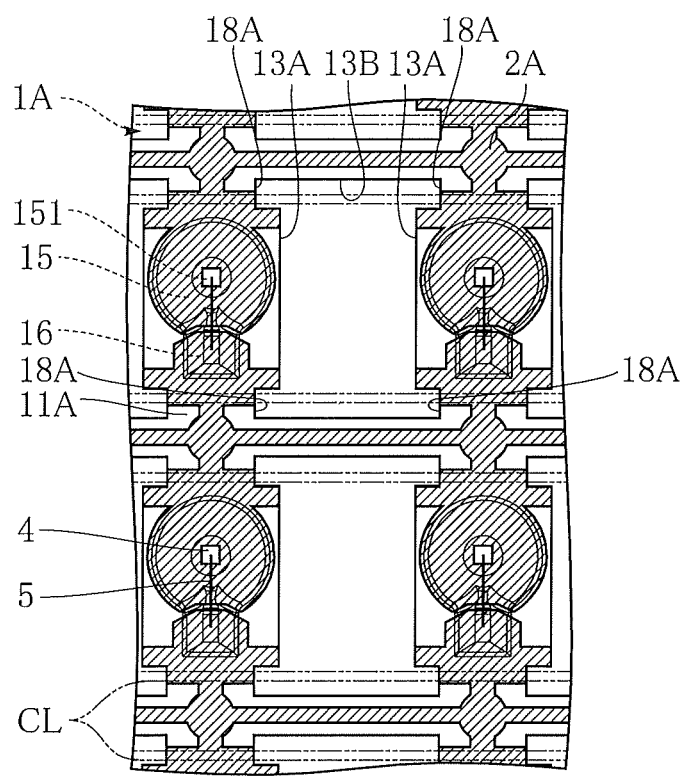
FIG. 83 is a front view showing a main section of the method of making the light-emitting module of FIG. 75.

First, a base material 1A shown in FIG. 82 is prepared. Unlike the plurality of through holes 13B in the method of making the light-emitting module A3, through holes 13B of the present embodiment have four preliminary recesses 18A. The four preliminary recesses 18A are provided at both ends of the through holes 13B in the x direction. That is, two preliminary recesses 18A are arranged at each end of the through holes 13B in the x direction. Each preliminary recess 18A is recessed from the inner-facing surface 13A in the z direction.

The processes described with reference to FIGS. 56 to 70 are sequentially performed on this base material 1A. The state shown in FIG. 83 is then obtained by completing the installation of a plurality of light-emitting elements 4, the bonding of a plurality of wires 5, and the formation of translucent resin 6 (not shown). Thereafter, the base material 1A is cut by a dicing blade, for example, along a plurality of cutting lines CL shown in FIG. 83. The cutting lines CL are respectively included in a yz plane and pass through the preliminary recesses 18A. As a result of this cutting, portions of each preliminary recess 18A that are on one side in the x direction form the lateral recesses 18 shows in FIGS. 75 to 81. Also, the conductor layer 2A consisting of the base layer 200A, the first layer 201A, the second layer 202A and the third layer 203A forms a plurality of wiring patterns 2 consisting of a base layer 200, a first layer 201, a second layer 202 and a third layer 203. As a result of completing the above processes, a plurality of light-emitting modules A4 are obtained.

Next, the working of the light-emitting module A4 and the light-emitting device B4 will be described.

According to the present embodiment, the light-emitting module A4 can be similarly mounted more suitably. Also, as a result of the light-emitting module A4 having the lateral recess electrodes 27, the solder 3 can be expected to also adhere to the lateral recess electrodes 27. The mounting strength of the light-emitting module A4 can thereby be further enhanced.

As a result of the mounting-surface electrodes 24 being connected to the lateral recess electrodes 27, the solder 3 can be expected to form so as to surround the corner portions of the light-emitting module A4.

FIGS. 84 to 87 show modifications of the light-emitting module A4 and the light-emitting device B4.

Figure 84:
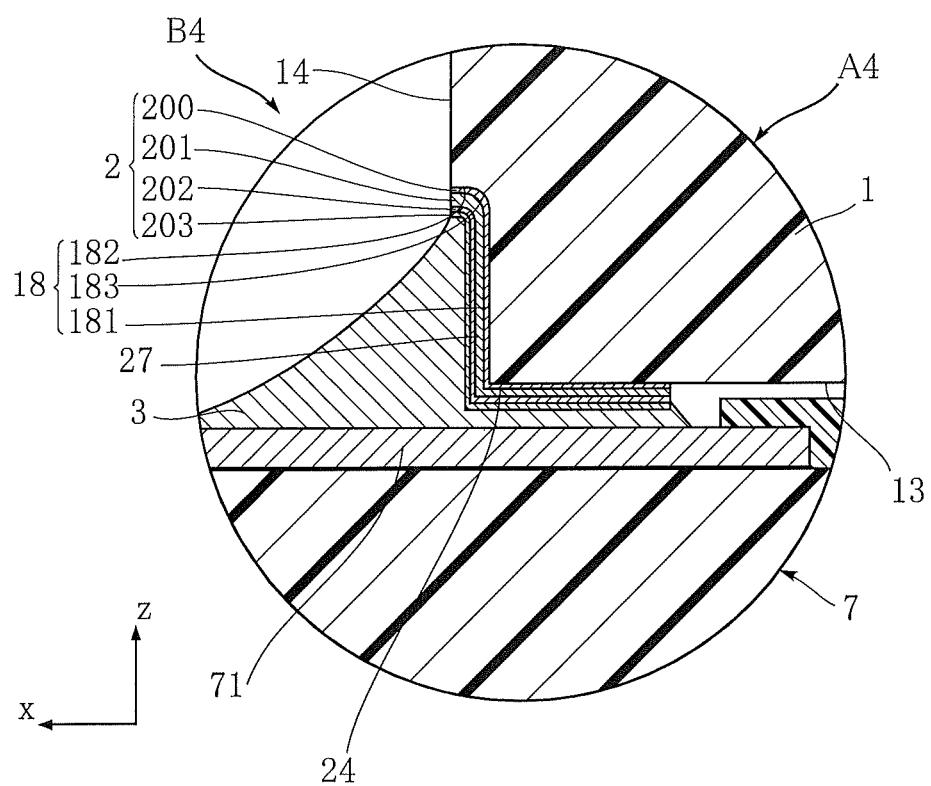
FIG. 84 is an enlarged cross-sectional view showing a main section of a modification of the light-emitting module based on the fourth embodiment of the present invention.

In the modification shown in FIG. 84, the lateral recesses 18 have a lateral recess side surface 181, a lateral recess upper surface 182, and a lateral recess sloping surface 183. The lateral recess side surface 181 faces outward in the x direction, and is connected to the mounting surface 13. The lateral recess upper surface 182 faces downward in the z direction, and is connected to the side surface 14. The lateral recess sloping surface 183 is interposed between the lateral recess side surface 181 and the lateral recess upper surface 182, and is connected to these surfaces. Also, the lateral recess sloping surface 183 slopes relative to the x direction, or in other words, relative to the lateral recess side surface 181 and the lateral recess upper surface 182. Furthermore, the lateral recess sloping surface 183 is configured as a curved surface. The lateral recess electrodes 27 cover these three surfaces, namely, the lateral recess side surface 181, the lateral recess upper surface 182, and the lateral recess sloping surface 183.

Figure 85:
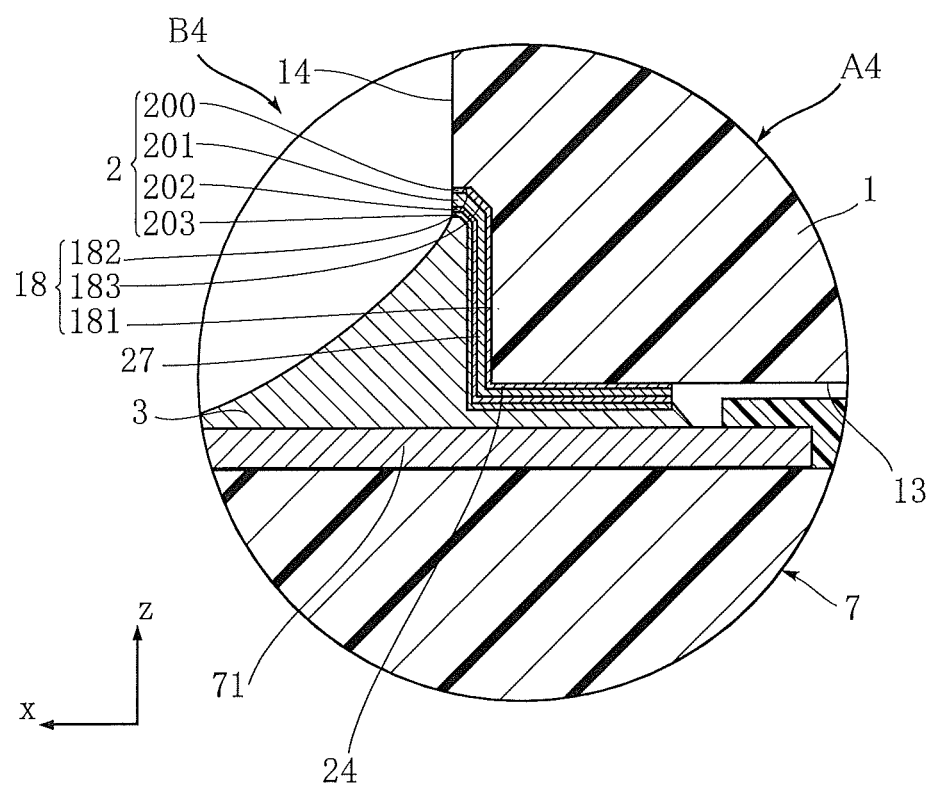
FIG. 85 is an enlarged cross-sectional view showing a main section of a modification of the light-emitting module based on the fourth embodiment of the present invention.

In the modification shown in FIG. 85, the lateral recesses 18 have a lateral recess side surface 181, a lateral recess upper surface 182, and a lateral recess sloping surface 183. The lateral recess sloping surface 183 is configured as a plane.

Figure 86:
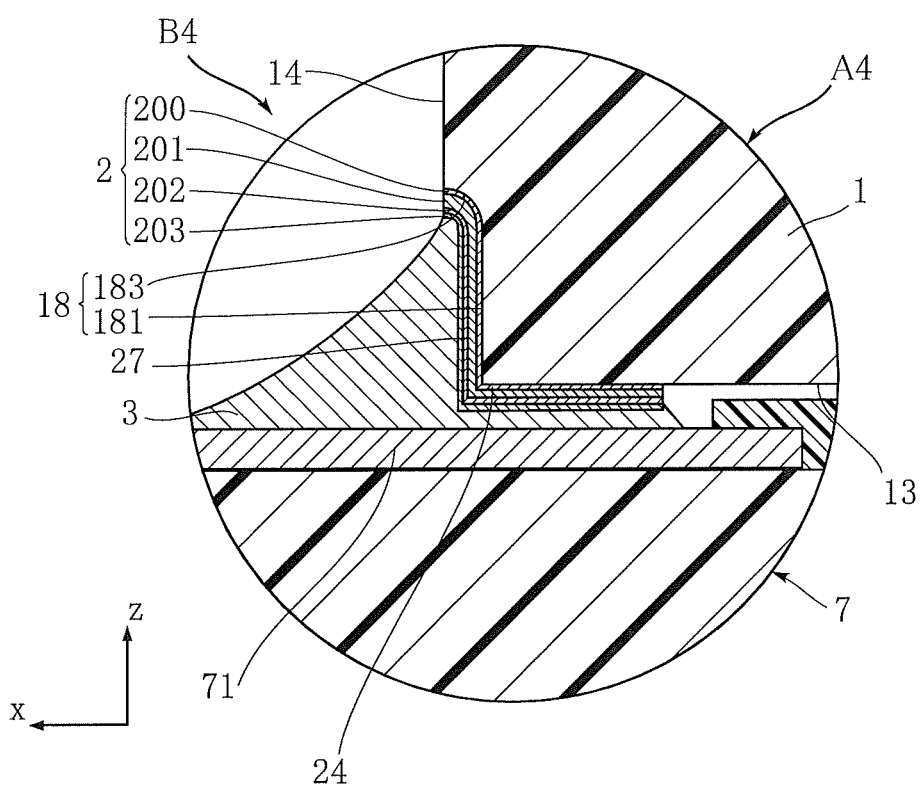
FIG. 86 is an enlarged cross-sectional view showing a main section of a modification of the light-emitting module based on the fourth embodiment of the present invention.

In the modification shown in FIG. 86, the lateral recesses 18 have a lateral recess side surface 181 and a lateral recess sloping surface 183. The lateral recess sloping surface 183 is interposed between the lateral recess side surface 181 and the side surface 14, and is connected to these surfaces. The lateral recess sloping surface 183 slopes relative to the x direction, or in other words, relative to the lateral recess side surface 181 and the side surface 14. Furthermore, in this modification, the lateral recess sloping surface 183 is configured as a curved surface.

In the modification shown in FIG. 87, the lateral recesses 18 only have a lateral recess sloping side surface 184. The lateral recess sloping side surface 184 is connected to the side surface 14 and the mounting surface 13. The lateral recess sloping side surface 184 slopes so as to be spaced further inward from the side surface 14 in the x direction as the distance from the side surface 14 increases in the z direction.

The present invention is not limited to the abovementioned embodiments. The specific configurations of the various parts of the present invention can undergo various design modifications.

The invention claimed is:

1. A light-emitting module comprising:
   a light-emitting element;

a base that has an installation surface facing in a first direction on which the light-emitting element is installed and a mounting surface facing in a second direction which is at right angles to the first direction; and a wiring pattern that is formed on the base and is in electrical contact with the light-emitting element, wherein the base includes a pair of mounting recesses recessed from the mounting surface and spaced from each other in a third direction which is at right angles to both the first direction and the second direction, the wiring pattern includes a pair of mounting-surface electrodes respectively covering at least a part of the pair of mounting recesses, the base includes a top surface facing in the first direction and a first accommodating recess recessed from the top surface, the first accommodating recess accommodating the light-emitting element, the first accommodating recess includes a first side surface including an edge, the edge of the first side surface being connected to the top surface, the wiring pattern includes a first side surface portion extending from the edge of the first side surface on the first side surface, one of the mounting recesses includes an edge that is connected to the top surface, the base includes an additional surface facing in an opposite direction of the mounting surface, and the base includes an additional recess recessed from the additional surface, the first accommodating recess overlaps with one of the mounting recesses and with the additional recess as viewed in the second direction, the additional recess includes an edge that is connected to the top surface, and the wiring pattern continuously extends on the top surface from the edge of the one of the mounting recesses both to the edge of the first side surface of the first accommodating recess and to the edge of the additional recess.

2. The light-emitting module according to claim 1, wherein each mounting recess is open outward on both sides in the first direction.

3. The light-emitting module according to claim 2, wherein the mounting-surface electrodes respectively cover the whole of the mounting recesses.

4. The light-emitting module according to claim 3, wherein the mounting surface is entirely exposed from the wiring pattern.

5. The light-emitting module according to claim 4, wherein each mounting recess is closed outward in the third direction.

6. The light-emitting module according to claim 5, wherein the base includes a pair of side surfaces facing opposite to each other in the third direction, each of the side surfaces being connected to the top surface, the wiring pattern includes a pair of side-surface electrodes respectively covering at least a part of the pair of side surfaces, and the side-surface electrodes respectively cover the side surfaces.

7. The light-emitting module according to claim 6, wherein the base includes a pair of side surfaces facing the opposite side to each other in the third direction, and the wiring pattern includes a pair of side-surface electrodes respectively covering at least a part of the pair of side surfaces.

8. The light-emitting module according to claim 7, wherein the base includes a back surface facing the opposite side to the installation surface in the first direction, and the wiring pattern includes a pair of back-surface electrodes respectively covering a part of the back surface and spaced from each other in the third direction.

9. The light-emitting module according to claim 8, wherein the back-surface electrodes and the mounting-surface electrodes are respectively connected to each other.

10. The light-emitting module according to claim 9, wherein the back-surface electrodes and the side-surface electrodes are respectively connected to each other.

11. The light-emitting module according to claim 8, wherein the base includes a back surface protrusion projecting from the back surface and exposed from the wiring pattern.

12. The light-emitting module according to claim 5, wherein each mounting recess includes a mounting recess upper surface facing in the second direction, and a pair of mounting recess side surfaces facing outward in the third direction and connected to the mounting surface and the mounting recess upper surface.

13. The light-emitting module according to claim 5, wherein each mounting recess includes a mounting recess upper surface facing in the second direction, a pair of mounting recess side surfaces facing each other in the third direction, and a pair of mounting recess sloping surfaces respectively interposed between the mounting recess upper surface and the pair of mounting recess side surfaces and sloping relative to the third direction.

14. The light-emitting module according to claim 13, wherein the mounting recess sloping surface is a curved surface.

15. The light-emitting module according to claim 5, wherein each mounting recess includes a mounting recess upper surface facing in the second direction, and a pair of mounting recess side surfaces sloping relative to the third direction and connected to the mounting surface and the mounting recess upper surface.

16. The light-emitting module according to claim 15, wherein the mounting recess side surface is a curved surface.

17. The light-emitting module according to claim 5, wherein each mounting recess includes a pair of mounting recess sloping upper surfaces connected to the mounting surface and spaced further inward from the mounting surface in the second direction as the distance from the mounting surface increases in the third direction.

18. A light-emitting device comprising:
the light-emitting module according to claim 1; and
a mounting board whose thickness direction is in the second direction and that includes a pair of pad portions facing in the second direction, spaced from each other in the third direction and having the pair of mounting-surface electrodes joined thereto.

19. The light-emitting device according to claim 18, wherein the pad portions respectively contain the mounting-surface electrodes when viewed in the second direction.

20. The light-emitting device according to claim 19, wherein the difference between dimensions of each pad in the third direction and dimensions of each mounting-surface electrode in the third direction is greater than the difference between dimensions of each pad in the first direction and dimensions of each mounting-surface electrode in the first direction.

21. The light-emitting module according to claim 6, wherein the base includes a second accommodating recess recessed from the top surface and having a second bottom surface and a second side surface connecting the second bottom surface and the top surface, the second bottom surface is located closer to the top surface in the first direction than to the first bottom surface, the second bottom surface and the first side surface are connected to each other via a part of the first side surface that does not reach to the top surface, and the wiring pattern covers the first side surface of the first accommodating recess, the second side surface of the second accommodating recess, the top surface of the base, and the pair of side surfaces of the base.

22. The light-emitting module according to claim 21, wherein each of the pair of mounting recesses overlaps with one of the first and second accommodating recesses as viewed in the second direction.

23. The light-emitting module according to claim 1, wherein the wiring pattern includes an end edge disposed on the first side surface of the first accommodating recess.

24. A light-emitting module comprising:
a light-emitting element;
a base that has an installation surface facing in a first direction on which the light-emitting element is installed and a mounting surface facing in a second direction which is at right angles to the first direction; and
a wiring pattern that is formed on the base and is in electrical contact with the light-emitting element,
wherein the base includes a pair of mounting recesses recessed from the mounting surface and spaced from each other in a third direction which is at right angles to both the first direction and the second direction,
the wiring pattern includes a pair of mounting-surface electrodes respectively covering at least a part of the pair of mounting recesses,
the base includes a top surface facing in the first direction and a first accommodating recess recessed from the top surface, the first accommodating recess accommodating the light-emitting element,
the first accommodating recess includes a first side surface including an edge, the edge of the first side surface being connected to the top surface,
the wiring pattern includes a first side surface portion extending from the edge of the first side surface on the first side surface,
each mounting recess is closed outward in the third direction,
the mounting surface includes a flat portion disposed between the mounting recesses as viewed in the second direction,
the wiring pattern includes a portion that is disposed on the top surface between the mounting recesses as viewed in the first direction and that includes a surface flush with the flat portion of the mounting surface,
one of the mounting recesses includes an edge that is connected to the top surface,
the base includes an additional surface facing in an opposite direction of the mounting surface, and the base includes an additional recess recessed from the additional surface,
the first accommodating recess overlaps with one of the mounting recesses and with the additional mounting recesses as viewed in the second direction,
the additional recess includes an edge that is connected to the top surface, and
the wiring pattern continuously extends on the top surface from the edge of the one of the mounting recesses both to the edge of the first side surface of the first accommodating recess and to the edge of the additional recess.

25. A light-emitting module comprising:
a light-emitting element;
a base that has an installation surface facing in a first direction on which the light-emitting element is installed, a mounting surface facing in a second direction which is at right angles to the first direction, and an additional surface facing in an opposite direction of the mounting surface; and
a wiring pattern that is formed on the base and is in electrical contact with the light-emitting element,
wherein the base includes a pair of mounting recesses recessed from the mounting surface and spaced from each other in a third direction which is at right angles to both the first direction and the second direction,
the wiring pattern includes a pair of mounting-surface electrodes respectively covering at least a part of the pair of mounting recesses,
the base includes a top surface facing in the first direction and a first accommodating recess recessed from the top surface, the first accommodating recess accommodating the light-emitting element,
the first accommodating recess includes a first side surface including an edge, the edge of the first side surface being connected to the top surface,
the wiring pattern includes a first side surface portion extending from the edge of the first side surface on the first side surface,
the base includes a pair of additional mounting recesses recessed from the additional surface and spaced from each other in the third direction,
the base includes a second accommodating recess recessed from the top surface, the second accommodating recess being connected to the first accommodating recess,
the first accommodating recess overlaps with one of the mounting recesses and with one of the additional mounting recesses as viewed in the second direction,
the second accommodating recess overlaps with the other of the mounting recesses and with the other of the additional mounting recesses as viewed in the second direction,
the one of the mounting recesses includes an edge that is connected to the top surface,
the one of the additional mounting recesses includes an edge that is connected to the top surface, and
the wiring pattern continuously extends on the top surface from the edge of the one of the mounting recesses both to the edge of the first side surface of the first accommodating recess and to the edge of the one of the additional mounting recesses.

* * * * *